United States Patent
Tanaka et al.

(10) Patent No.: US 9,799,396 B2
(45) Date of Patent: *Oct. 24, 2017

(54) SEMICONDUCTOR DEVICE

(71) Applicant: Renesas Electronics Corporation, Koutou-ku, Tokyo (JP)

(72) Inventors: Shinji Tanaka, Kanagawa (JP); Makoto Yabuuchi, Kanagawa (JP); Yuta Yoshida, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/367,829

(22) Filed: Dec. 2, 2016

(65) Prior Publication Data

US 2017/0084327 A1    Mar. 23, 2017

Related U.S. Application Data

(63) Continuation of application No. 14/981,195, filed on Dec. 28, 2015, now Pat. No. 9,542,999, which is a (Continued)

(30) Foreign Application Priority Data

Mar. 4, 2011   (JP) ................ 2011-048053

(51) Int. Cl.
   *G11C 5/06* (2006.01)
   *G11C 11/419* (2006.01)
   (Continued)

(52) U.S. Cl.
   CPC ........... *G11C 11/419* (2013.01); *G11C 5/06* (2013.01); *G11C 5/063* (2013.01); *G11C 7/08* (2013.01);
   (Continued)

(58) Field of Classification Search
   CPC ..................... G11C 5/06; G11C 7/08
   (Continued)

(56) References Cited

U.S. PATENT DOCUMENTS 4,070,590 A * 1/1978 Ieda .................. H03K 3/35606
                                                327/213
4,158,241 A * 6/1979 Takemae .............. G11C 11/404
                                                257/E27.084

(Continued)

FOREIGN PATENT DOCUMENTS

JP     2001-521262 A    11/2001
JP     2004-095058 A     3/2004

(Continued)

*Primary Examiner* — Michael Tran
(74) *Attorney, Agent, or Firm* — Foley & Lardner LLP

(57) ABSTRACT

A semiconductor device with a memory unit of which the variations in the operation timing are reduced is provided. For example, the semiconductor device is provided with dummy bit lines which are arranged collaterally with a proper bit line, and column direction load circuits which are sequentially coupled to the dummy bit lines. Each column direction load circuit is provided with plural NMOS transistors fixed to an off state, predetermined ones of which have the source and the drain suitably coupled to any of the dummy bit lines. Load capacitance accompanying diffusion layer capacitance of the predetermined NMOS transistors is added to the dummy bit lines, and corresponding to the load capacitance, the delay time from a decode activation signal to a dummy bit line signal is set up. The dummy bit line signal is employed when setting the start-up timing of a sense amplifier.

14 Claims, 35 Drawing Sheets

Related U.S. Application Data continuation of application No. 14/321,169, filed on Jul. 1, 2014, now Pat. No. 9,281,017, which is a continuation of application No. 14/026,575, filed on Sep. 13, 2013, now Pat. No. 8,797,781, which is a continuation of application No. 13/398,418, filed on Feb. 16, 2012, now Pat. No. 8,547,723.

(51) Int. Cl.
| | | |
|---|---|---|
| *G11C 8/08* | (2006.01) | |
| *G11C 8/10* | (2006.01) | |
| *G11C 11/415* | (2006.01) | |
| *G11C 7/08* | (2006.01) | |
| *G11C 7/22* | (2006.01) | |
| *G11C 11/418* | (2006.01) | |

(52) U.S. Cl.
CPC .............. *G11C 7/227* (2013.01); *G11C 8/08* (2013.01); *G11C 8/10* (2013.01); *G11C 11/415* (2013.01); *G11C 11/418* (2013.01)

(58) Field of Classification Search
USPC .................................................. 365/72, 205
See application file for complete search history.

(56) References Cited

U.S. PATENT DOCUMENTS

| | | | |
|---|---|---|---|
| 4,371,956 A | 2/1983 | Maeda et al. | |
| 4,578,776 A * | 3/1986 | Takemae | G11C 11/4074 365/149 |
| 4,597,059 A * | 6/1986 | Takemae | G11C 11/4085 365/149 |
| 4,622,655 A * | 11/1986 | Suzuki | G11C 11/4099 365/149 |
| 4,951,256 A * | 8/1990 | Tobita | G11C 11/4096 365/189.11 |
| 5,255,234 A * | 10/1993 | Seok | G11C 29/808 365/200 |
| 5,304,835 A * | 4/1994 | Imai | H01L 27/112 257/386 |
| 5,396,100 A | 3/1995 | Yamasaki et al. | |
| 5,760,452 A * | 6/1998 | Terada | H01L 27/10808 257/208 |
| 5,850,366 A * | 12/1998 | Coleman, Jr. | G11C 7/14 365/203 |
| 6,028,791 A * | 2/2000 | Tanaka | G11C 7/062 365/185.2 |
| 6,094,379 A | 7/2000 | Sago | |
| 6,157,584 A * | 12/2000 | Holst | G11C 7/065 365/200 |
| 6,294,929 B1 | 9/2001 | Coulman et al. | |
| 6,804,153 B2 | 10/2004 | Yoshizawa et al. | |
| 6,987,698 B2 * | 1/2006 | Bando | G11C 7/02 365/189.07 |
| 7,149,102 B2 | 12/2006 | Ozawa | |
| 7,248,523 B2 | 7/2007 | Ohtsuki et al. | |
| 7,453,729 B2 | 11/2008 | Lee | |
| 7,885,128 B2 * | 2/2011 | Fujiwara | G11C 8/12 365/200 |
| 7,898,887 B2 * | 3/2011 | Dudeck | G11C 7/02 365/154 |
| 7,944,766 B2 | 5/2011 | Senou | |
| 2003/0189255 A1 | 10/2003 | Sugiura et al. | |
| 2004/0114411 A1 * | 6/2004 | Noda | G11C 15/043 365/49.17 |
| 2005/0141262 A1 * | 6/2005 | Yamada | H01L 21/84 365/149 |
| 2006/0208319 A1 | 9/2006 | Chakihara et al. | |
| 2007/0173006 A1 | 7/2007 | Moniwa et al. | |
| 2008/0151653 A1 * | 6/2008 | Ishikura | G11C 7/065 365/189.15 |
| 2009/0323399 A1 * | 12/2009 | Kajigaya | G11C 7/02 365/149 |
| 2010/0054064 A1 * | 3/2010 | Miyakawa | G11C 7/12 365/203 |
| 2010/0103715 A1 * | 4/2010 | Takizawa | G11C 7/08 365/145 |
| 2010/0177580 A1 | 7/2010 | Komatsu et al. | |
| 2010/0182858 A1 | 7/2010 | Kaku et al. | |
| 2011/0026292 A1 * | 2/2011 | Narui | G11O 5/025 365/63 |
| 2011/0034017 A1 | 2/2011 | Moniwa et al. | |
| 2011/0128807 A1 | 6/2011 | Sharma et al. | |
| 2011/0235440 A1 * | 9/2011 | Watanabe | G11C 29/026 365/189.07 |
| 2011/0275207 A1 | 11/2011 | Moniwa et al. | |
| 2012/0195103 A1 * | 8/2012 | Kajigaya | G11C 11/4091 365/149 |
| 2012/0224405 A1 * | 9/2012 | Tanaka | G11C 8/08 365/72 |
| 2013/0077387 A1 * | 3/2013 | Yabuuchi | G11C 11/419 365/154 |
| 2014/0353740 A1 | 12/2014 | Nishida et al. | |
| 2016/0049192 A1 * | 2/2016 | Lee | G11C 16/3427 365/185.03 |

FOREIGN PATENT DOCUMENTS

| | | |
|---|---|---|
| JP | 2006-031752 A | 2/2006 |
| JP | 2010-165415 A | 7/2010 |
| TW | 41709 | 1/2001 |
| WO | WO-99/22376 A1 | 5/1999 |

\* cited by examiner

|  | Sc | Sd |
|---|---|---|
| STANDARD | 1 | 0 |
| DELAYED | 0 | 0 |
| ADVANCED 1 | 0 | 1 |
| ADVANCED 2 | 1 | 1 |

WE=0→READ
WE=1→WRITE

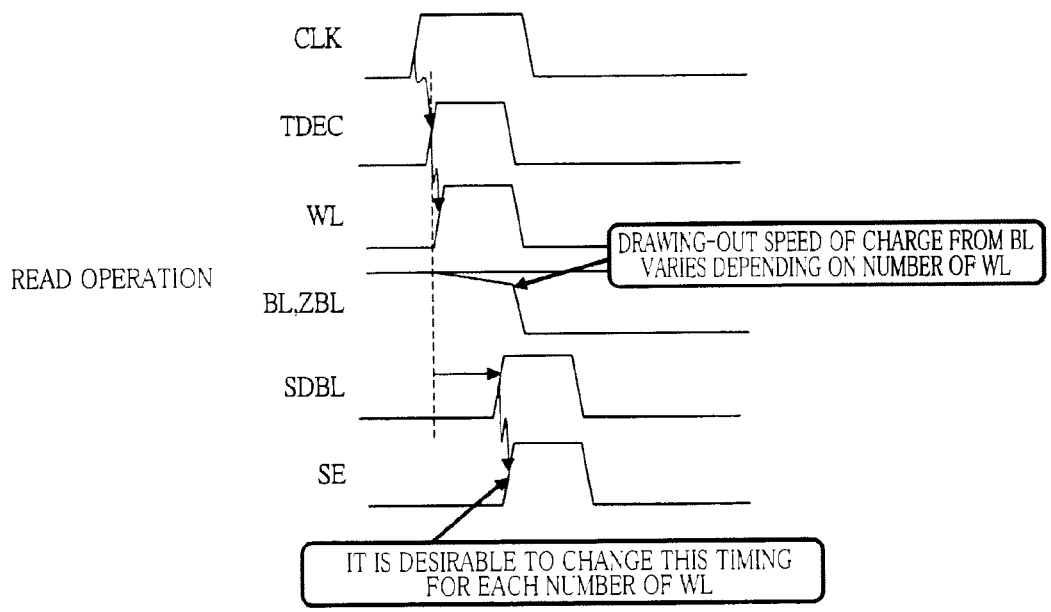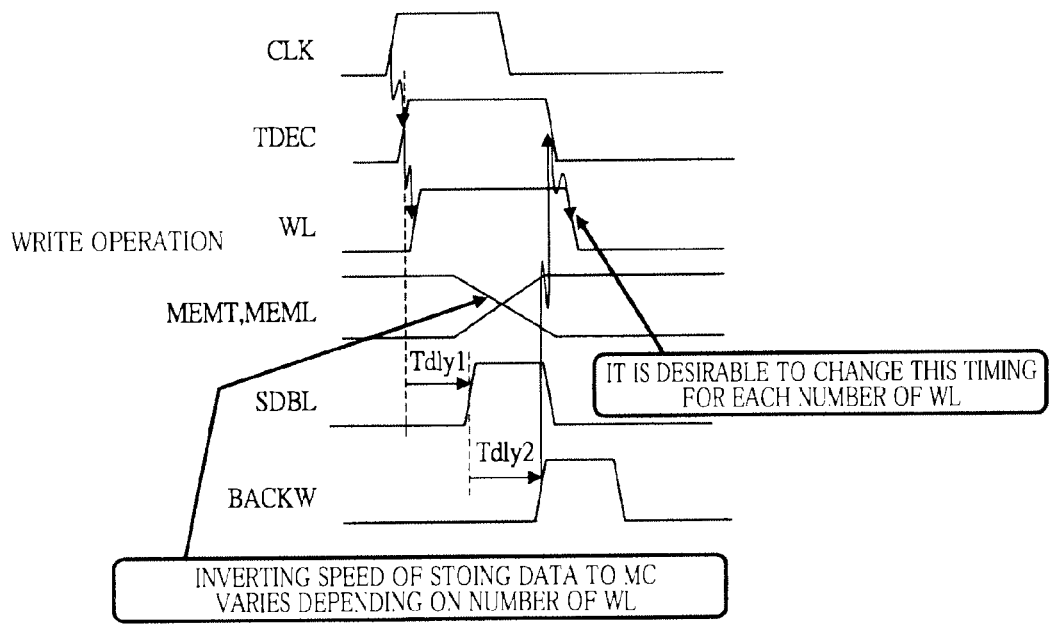

SEMICONDUCTOR DEVICE

CROSS-REFERENCE TO RELATED PATENT APPLICATIONS

This application is a Continuation of U.S. application Ser. No. 14/981,195, filed Dec. 28, 2015, now patented as U.S. Pat. No. 9,542,999, which is a Continuation of U.S. application Ser. No. 14/321,169, filed Jul. 1, 2014, now patented as U.S. Pat. No. 9,281,017, which is a Continuation of U.S. application Ser. No. 14/026,575, filed Sep. 13, 2013, now patented as U.S. Pat. No. 8,797,781, which is a Continuation of application Ser. No. 13/398,418, filed Feb. 16, 2012, and now patented as U.S. Pat. No. 8,547,723, which claims the benefit of Japanese Patent Application No. 2011-048053, filed Mar. 4, 2011, all of which are incorporated herein by reference in their entirety.

BACKGROUND

The present invention relates to a semiconductor device, especially to technology which is effective when applied to a semiconductor device provided with memory units, such as an SRAM.

Patent Literature 1, for example, discloses a semiconductor storage device which generates a sense amplifier enable signal using a dummy circuit provided with plural dummy cells. Patent Literature 2 discloses that, in a semiconductor storage device of a single bit line system in which a read operation timing is decided by operation of a replica bit line, the semiconductor storage device is configured such that a gate length of a replica memory cell transistor coupled to the replica bit line is set to be longer than a gate length of a proper memory cell transistor. Patent Literature 3 discloses a semiconductor integrated circuit device which is provided with a first replica bit line and a second replica bit line respectively coupled to a replica memory cell and with an inverter circuit for inputting an output of the first replica bit line to the second replica bit line, and which generates a sense amplifier enable signal by use of the divided replica bit lines.

PATENT LITERATURE (Patent Literature 1) Japanese Patent Laid-open No. 2004-95058
(Patent Literature 2) Japanese Patent Laid-open No. 2006-31752
(Patent Literature 3) Japanese Patent Laid-open No. 2010-165415

SUMMARY

In recent years, variations between MOS transistors have appeared as a significant issue, accompanying with the increasingly finer geometries of a semiconductor device. Accordingly, in a memory unit (typically an SRAM (Static Random Access Memory) module) included in a semiconductor device, for example, it becomes important to perform timing design in consideration of the variations in an SRAM memory cell. One of such timing design methods is a method which sets start-up timing of a sense amplifier at the time of read using a dummy memory cell (replica memory cell) and a dummy bit line (replica bit line), for example, as disclosed by Patent Literature 1-Patent Literature 3.

However, in the method to use such a dummy memory cell, etc., it is likely that optimization of the start-up timing of the sense amplifier cannot be attained, due to the process fluctuation, etc. of the dummy memory cell itself. That is, reflecting the proper memory cell formed by a very small processing size, the dummy memory cell is formed by the same processing size in many cases; therefore, process fluctuation, etc. tends to occur. For example, when process fluctuation occurs among plural dummy memory cells coupled to a dummy bit line, the timing in driving the dummy bit line is different for each dummy memory cell. Consequently, there may arise the situation in which the start-up timing of the sense amplifier is too early or too late.

The present invention has been made in view of the above circumstances and one of the purposes is to reduce the variations in operation timing in a semiconductor device provided with a memory unit. The above and other purposes and new features will become clear from description of the specification and the accompanying drawings of the present invention.

The following explains briefly an outline of typical embodiments among the inventions to be disclosed by the present application.

A semiconductor device according to the present invention comprises: plural word lines extending in a first direction; plural bit lines extending in the second direction intersecting the first direction; and plural memory cells arranged at intersections of the plural word lines and the plural bit lines, and configured with a circuit including a first MIS transistor.

The semiconductor device according to the present invention further comprises: a sense amplifier circuit which is able to amplify a signal read from one of the plural memory cells through one of the plural bit lines, in response to an enable signal; a control circuit which is able to generate a first signal in response to an access instruction to the plural memory cells; and a timing adjusting circuit which is able to receive the first signal inputted and to generate a second signal serving as an origin of the enable signal, by delaying the first signal.

The timing adjusting circuit comprises a first wiring which is arranged collaterally with the plural bit lines and forming at least one both-way wiring, and which is able to receive the first signal transmitted at one end and to output the second signal from the other end; and a load circuit including plural second MIS transistors coupled to the first wiring.

The first wiring includes a first dummy bit line used as an outward wiring and a second dummy bit line used as a homeward wiring, and the plural second MIS transistors are provided separately to the first dummy bit line and the second dummy bit line.

The following explains briefly an effect obtained by the typical embodiment of the inventions to be disclosed in the present application. That is, in the semiconductor device provided with a memory unit, it is possible to reduce the variations in the operation timing.

BRIEF DESCRIPTION OF THE DRAWINGS

FIGS. 14(a), 14(b), and 14(c) are supplementary drawings illustrating load capacitance in the column direction load circuit illustrated in FIG. 12, in which FIGS. 14(a) and 14(b) are schematic diagrams illustrating the position of the load capacitance, and FIG. 14(c) is a diagram roughly illustrating an example of voltage waveforms corresponding to the load capacitance of FIGS. 14(a) and 14(b);

FIGS. 15(a), 15(b), and 15(c) are supplementary drawings illustrating load capacitance in the column direction load circuit illustrated in FIG. 13, in which FIGS. 15(a) and 15(b) are schematic diagrams illustrating the position of the load capacitance, and FIG. 15(c) is a diagram roughly illustrating an example of voltage waveforms corresponding to the load capacitance of FIGS. 15(a) and 15(b);

FIG. 20(a) is a waveform chart illustrating an example of operation at the time of read in FIG. 19, and FIG. 20(b) is a waveform chart illustrating an example of operation at the time of write in FIG. 19;

DETAILED DESCRIPTION

Figure 1:
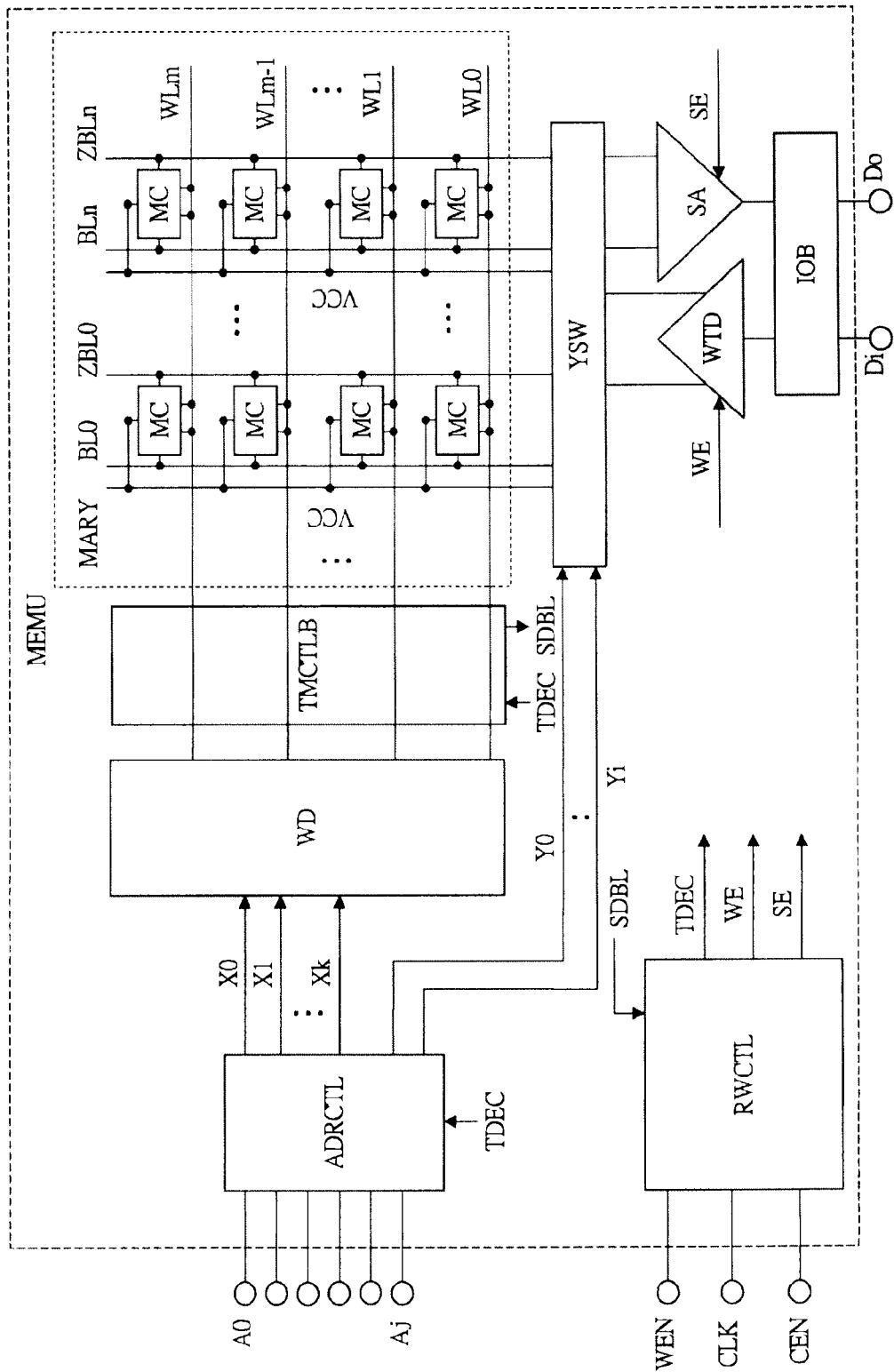
FIG. 1 is a block diagram illustrating roughly a configuration example of a memory unit included in the semiconductor device according to Embodiment 1 of the present invention.

When necessary for the sake of convenience in the following embodiment, the explanation will be made in divided plural sections or embodiments. However, unless otherwise specified, they are not irrelevant with each other but they have a relationship that one is a modified example, details, and, supplementary explanation of a part or all of the other. In the following embodiments, when referring to the number of elements, etc. (including the number, a numeric value, quantity, a range, etc.), they shall be not restricted to the specific number but they may be more than or less than the specific number, except for the case where they are explicitly specified or clearly restricted to a specific number in principle.

Furthermore, in the following embodiments, it is needless to say that the components (including an element step, etc.) are not necessarily essential, except for the case where they are explicitly specified or they are considered to be essential in principle. Similarly, in the following embodiments, when referring to the shape, positional relationship, etc. of the components, etc., they shall include what is substantially close to or similar to the shape, etc., except for the case where they are explicitly specified or they are considered to be clearly different in principle. This shall be equally applied to the numeric value and the range described above.

Although not restricted in particular, circuit elements with which each functional block of embodiments is configured are formed over a semiconductor substrate like a single crystal silicon by technology of integrated circuits, such as a well-known CMOS (complementary MOS) transistor. In the embodiments, as an example of an MISFET (Metal Insulator Semiconductor Field Effect Transistor) (abbreviated as an MIS transistor), an MOSFET (Metal Oxide Semiconductor Field Effect Transistor) (abbreviated as an MOS transistor) is employed. However, a non-oxide film is not excluded from the use as a gate insulating film. In the following drawings, a p-channel MOS transistor (PMOS transistor) is distinguished from an n-channel MOS transistor (NMOS transistor) by adding a symbol of a circle to a gate. Connection of substrate potential of an MOS transistor is not specified in the drawings in particular. However, the method of the connection will not be restricted in particular, as long as the MOS transistor can operate normally.

Hereinafter, embodiments of the present invention will be explained in detail with reference to the accompanying drawings. In the entire diagrams for explaining the embodiments of the present invention, the same symbol is attached to the same component as a general rule, and the repeated explanation thereof is omitted.

Embodiment 1

<<Outline Structure of the Entire Memory Unit>>

FIG. 1 is a block diagram illustrating roughly a configuration example of a memory unit included in the semiconductor device according to Embodiment 1 of the present invention. The memory unit MEMU illustrated in FIG. 1 comprises an address control circuit ADRCTL, a word line driving circuit WD, a timing adjusting circuit (in the column direction) TMCTLB, a memory array MARY, a column selection circuit YSW, a read/write control circuit RWCTL, a write driver circuit WTD, a sense amplifier circuit SA, and an input/output buffer circuit IOB. The memory array MARY comprises m word lines WL0-WLm extending in a first direction, n bit-line pairs (BL0, ZBL0)-(BLn, ZBLn) extending in a second direction intersecting the first direction, and plural memory cells MC arranged at the intersections of m word lines and n bit-line pairs. Each bit-line pair is configured with two bit lines (for example, BL0 and ZBL0) which transmit complementary signals.

The address control circuit ADRCTL decodes (or predecodes) address signals A0-Aj inputted from an external address terminal of the memory unit MEMU, in response to a decode activation signal TDEC as a trigger, and outputs row selection signals X0-Xk and column selection signals Y0-Yi. The word line driving circuit WD selects (activates) one of m word lines corresponding to the row selection signals X0-Xk. The column selection circuit YSW selects one of n bit-line pairs corresponding to the column selection signals Y0-Yi. The timing adjusting circuit TMCTLB is one of the main features of the present embodiment, and the detail will be described later. The timing adjusting circuit TMCTLB outputs a dummy bit line signal SDBL upon receiving the decode activation signal TDEC inputted. The read/write control circuit RWCTL generates the decode activation signal TDEC, an internal write enable signal WE, and a sense amplifier enable signal SE, in response to the various control signals (WEN, CLK, CEN) from the external control terminal of the memory unit MEMU and the dummy bit line signal SDBL described above. The control signal WEN is a write enable signal which discriminates a read instruction and a write instruction. The control signal CLK is a clock signal used as a reference of a read/write operation. The control signal CEN is a clock enable signal which controls whether the clock signal is valid or invalid.

The input/output buffer circuit IOB inputs a data input signal Di from the external data terminal of the memory unit MEMU, and transmits it to the write driver circuit WTD. The input/output buffer circuit IOB also inputs an output signal from the sense amplifier circuit SA and outputs it to an external data terminal as a data output signal Do. The write driver circuit WTD amplifies differentially the data from the input/output buffer circuit IOB, in response to the write enable signal WE, and transmits it to a predetermined bit-line pair via the column selection circuit YSW described above. The sense amplifier circuit SA amplifies differentially a signal pair transmitted from a predetermined bit-line pair via the column selection circuit YSW in response to the sense amplifier enable signal SE as a trigger, and outputs it to the input/output buffer circuit IOB.

Figure 2:
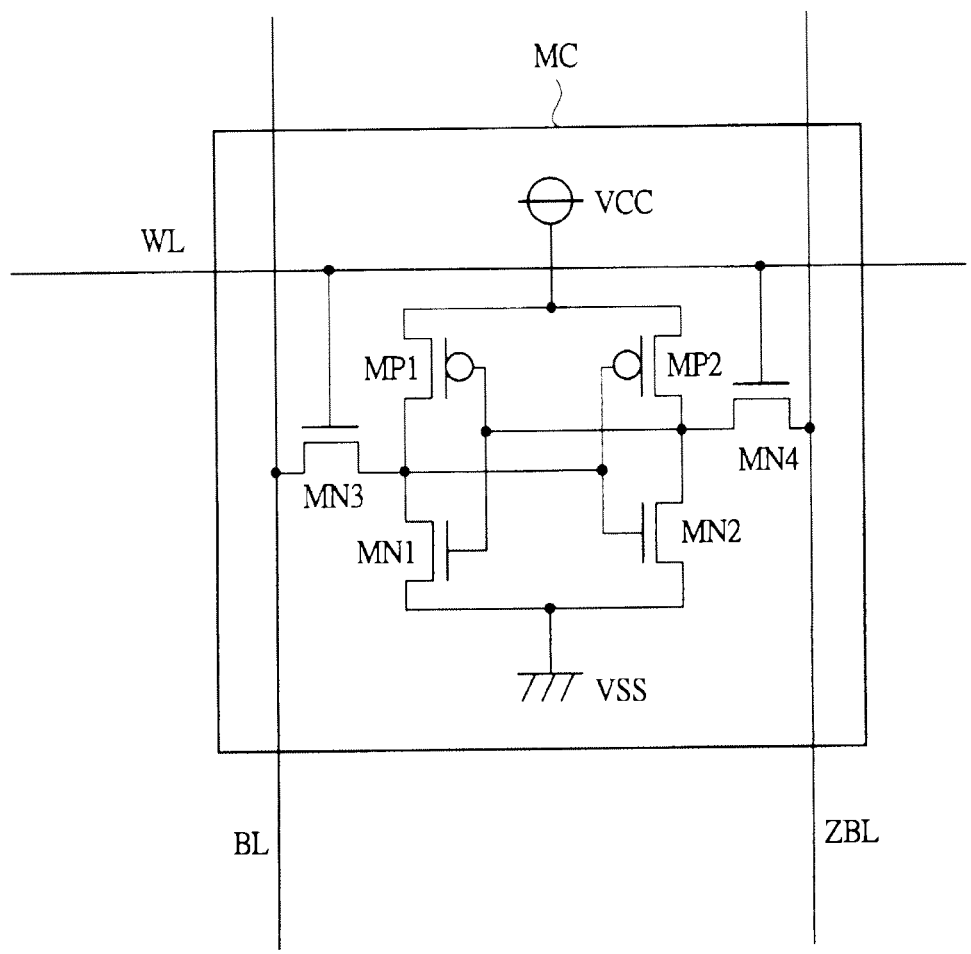
FIG. 2 is a circuit diagram illustrating a configuration example of each memory cell in the memory unit illustrated in FIG. 1.

FIG. 2 is a circuit diagram illustrating a configuration example of each memory cell MC in the memory unit illustrated in FIG. 1. The memory cell MC illustrated in FIG. 2 is an SRAM memory cell which is provided with four NMOS transistors MN1-MN4 and two PMOS transistors MP1 and MP2. As for the NMOS transistor MN3, the gate is coupled to a word line WL and one of the source/drain is coupled to a bit line BL on the positive electrode side. As for the NMOS transistor MN4, the gate is coupled to the word line WL and one of the source/drain is coupled to a bit line ZBL on the negative electrode side. The transistors MN1 and MP1 and the transistors MN2 and MP2 configure respectively a CMOS inverter circuit between a power supply voltage VCC and a ground power supply voltage VSS. The two CMOS inverter circuits configure a latch circuit by coupling the output of one side to the input of the other side. The other one of the source/drain of the NMOS transistor MN4 is coupled to the input of the CMOS inverter circuit (MN1, MP1) (the output of the CMOS inverter circuit (MN2, MP2)). The other one of the source/drain of the NMOS transistor MN3 is coupled to the input of the CMOS inverter circuit (MN2, MP2) (the output of the CMOS inverter circuit (MN1, MP1)).

<<Outline Operation of the Entire Memory Unit>>

Figure 3:
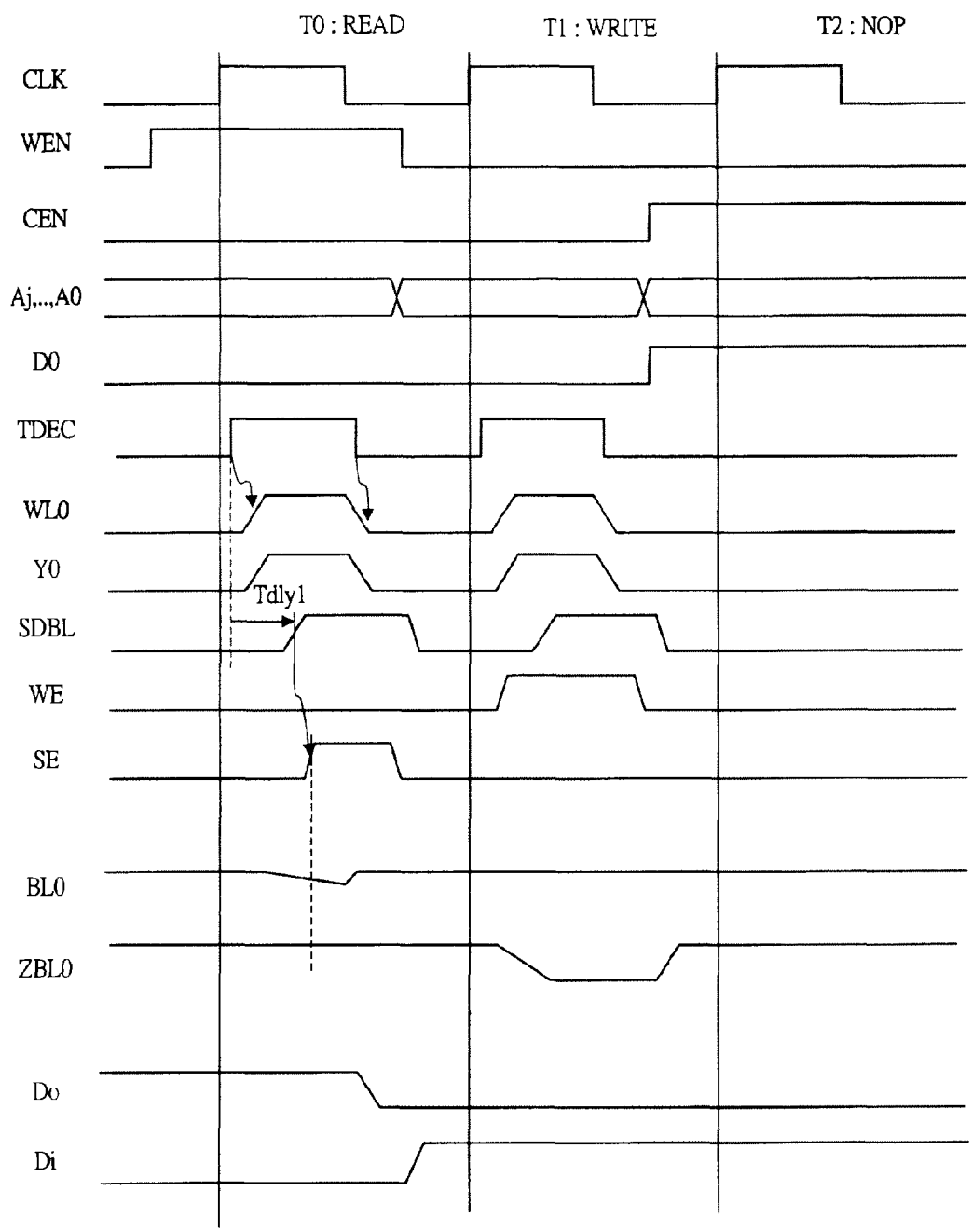
FIG. 3 is a waveform chart illustrating roughly an example of operation of the memory unit illustrated in FIG. 1.

FIG. 3 is a waveform chart illustrating roughly an example of operation of the memory unit illustrated in FIG. 1. In the example of FIG. 3, at the time when a clock signal CLK has risen, when a clock enable signal CEN is at an 'L' level and a write enable signal WEN is at an 'H' level, a read cycle (T0) is executed, and when the clock enable signal CEN is at an 'L' level and the write enable signal WEN is at an 'L' level, a write cycle (T1) is executed. At the time when the clock signal CLK has risen, when the clock enable signal CEN is at an 'H' level, the memory unit enters into "no operation cycle (T2)", and neither read operation nor write operation is executed.

In the read cycle (T0), first, the read/write control circuit RWCTL shifts a decode activation signal TDEC from an 'L' level to an 'H' level, in response to the rising of the clock signal CLK. The read/write control circuit RWCTL outputs an internal write enable signal WE of an 'L' level. In response to the shift to an 'H' level of the decode activation signal TDEC, the address control circuit ADRCTL generates row selection signals X0-Xk and column selection signals Y0-Yi (Y0 is displayed in FIG. 3) corresponding to address signals A0-Aj. In the example of FIG. 3, it is assumed that a word line WL0 is selected by the row selection signals X0-Xk, and a bit-line pair (BL0, ZBL0) is selected by the column selection signals Y0-Yi. The word line driving circuit WD activates a word line WL0 to an 'H' level, corresponding to the row selection signals X0-Xk. Accordingly, stored data of each memory cell MC coupled to the word line WL0 is read out to the corresponding bit-line pair. Here, a read signal in a bit-line pair (BL0, ZBL0) out of the read out signals is transmitted to the sense amplifier circuit SA via the column selection circuit YSW.

On the other hand, in parallel to this, in response to the shift to an 'H' level of the decode activation signal TDEC, the timing adjusting circuit TMCTLB shifts a dummy bit line signal SDBL to an 'H' level, after appending a predetermined delay time (Tdly1). In response to the shift to an 'H' level of the dummy bit line signal SDBL, the read/write control circuit RWCTL shifts a sense amplifier enable signal SE to an effective state ('H' level). In response to the shift to an 'H' level of the sense amplifier enable signal SE as a trigger, the sense amplifier circuit SA amplifies the read signal of the bit-line pair (BL0, ZBL0) transmitted via the column selection circuit YSW described above. The amplified signal is outputted to an external terminal as a data output signal Do via the input/output buffer circuit IOB. The word line WL0 activated is deactivated, in response to the shift from an 'H' level to an 'L' level of the decode activation signal TDEC, in the present case.

Next, in the write cycle (T1), first, the read/write control circuit RWCTL shifts a decode activation signal TDEC from an 'L' level to an 'H' level, in response to the rising of the clock signal CLK. The read/write control circuit RWCTL outputs an internal write enable signal WE of an 'H' level. In response to the shift to an 'H' level of the decode activation signal TDEC, the address control circuit ADRCTL generates row selection signals X0-Xk and column selection signals Y0-Yi, and the word line driving circuit WD activates a word line (WL0 in the present case) corresponding to the row selection signals X0-Xk. On the other hand, in parallel to this, a data input signal Di from the external terminal is inputted into the write driver circuit WTD via the input/output buffer circuit IOB. The write drive circuit WTD amplifies the input signal from the input/output buffer circuit IOB, in response to the shift to an 'H' level of the internal write enable signal WE described above. The column selection circuit YSW couples the output of the write drive circuit WTD to a bit-line pair (BL0 and ZBL0 in the present case) corresponding to the column selection signals Y0-Yi. Accordingly, the information of the data input signal Di is written in the selected memory cell MC. After that, the word line WL0 activated is deactivated, in response to the shift from 'H' level to an 'L' level of the decode activation signal TDEC, in the present case. Accordingly, the selected memory cell MC holds the information of the data input signal Di.

<<Outline Structure of the Entire Semiconductor Device>>

Figure 4:
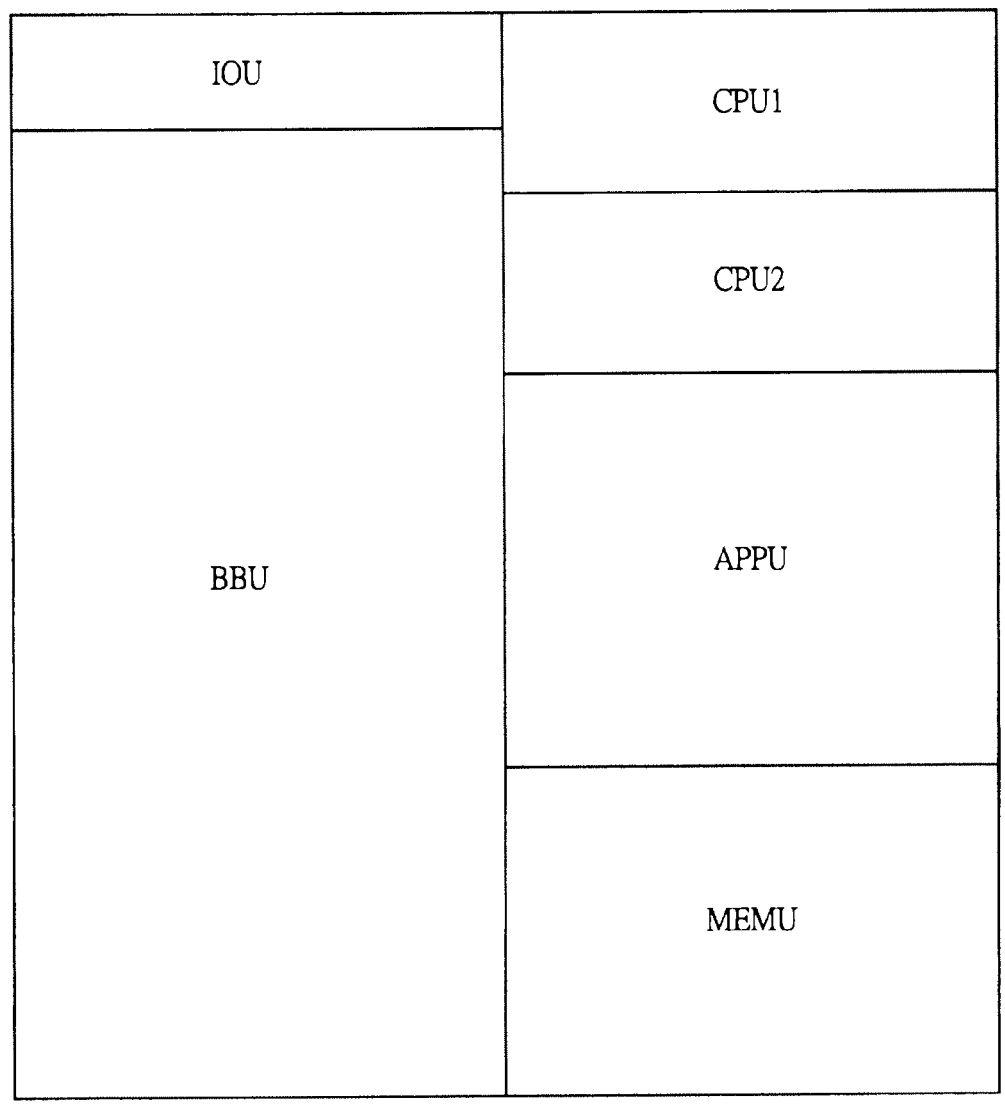
FIG. 4 is a block diagram illustrating an example of outline structure of the entire semiconductor device according to Embodiment 1 of the present invention.

FIG. 4 is a block diagram illustrating an example of outline structure of the entire semiconductor device according to Embodiment 1 of the present invention. FIG. 4 illustrates a semiconductor device (LSI) called an SOC (System On a Chip), etc. in which various logic circuits and a memory circuit are formed in one semiconductor chip. The semiconductor device illustrated in FIG. 4 is an LSI for a mobile-phone, for example, and it comprises two processor units CPU1 and CPU2, an application unit APPU, a memory unit MEMU, a baseband unit BBU, and an input/output unit IOU. The configuration example illustrated in FIG. 1 is applied to the memory unit MEMU among these units.

The processor units CPU1 and CPU2 perform predetermined arithmetic processing based on a program. The application unit APPU performs predetermined application processing required by the mobile-phone. The baseband unit BBU performs predetermined baseband processing accompanying wireless communication. The input/output unit IOU functions as an input/output interface with the exterior. The memory unit MEMU is suitably accessed in such kind of the processing of each circuit block. In semiconductor devices, such as the SOC, the memory unit MEMU is implemented in many cases by the automated design tool called a memory compiler, etc., using the design data called memory IP (Intellectual Property), etc., for example. Usually, since the optimal operation timing also differs when the memory IP differs, it is necessary to develop the timing adjusting circuit TMCTLB described above newly for every memory IP. However, it is desirable to realize a timing adjusting circuit which is usable in common by each memory IP, in the viewpoint of the increase in design efficiency.

<<A Detailed Circuit (1) of a Timing Adjusting Circuit (in the Column Direction)>>

Figure 5:
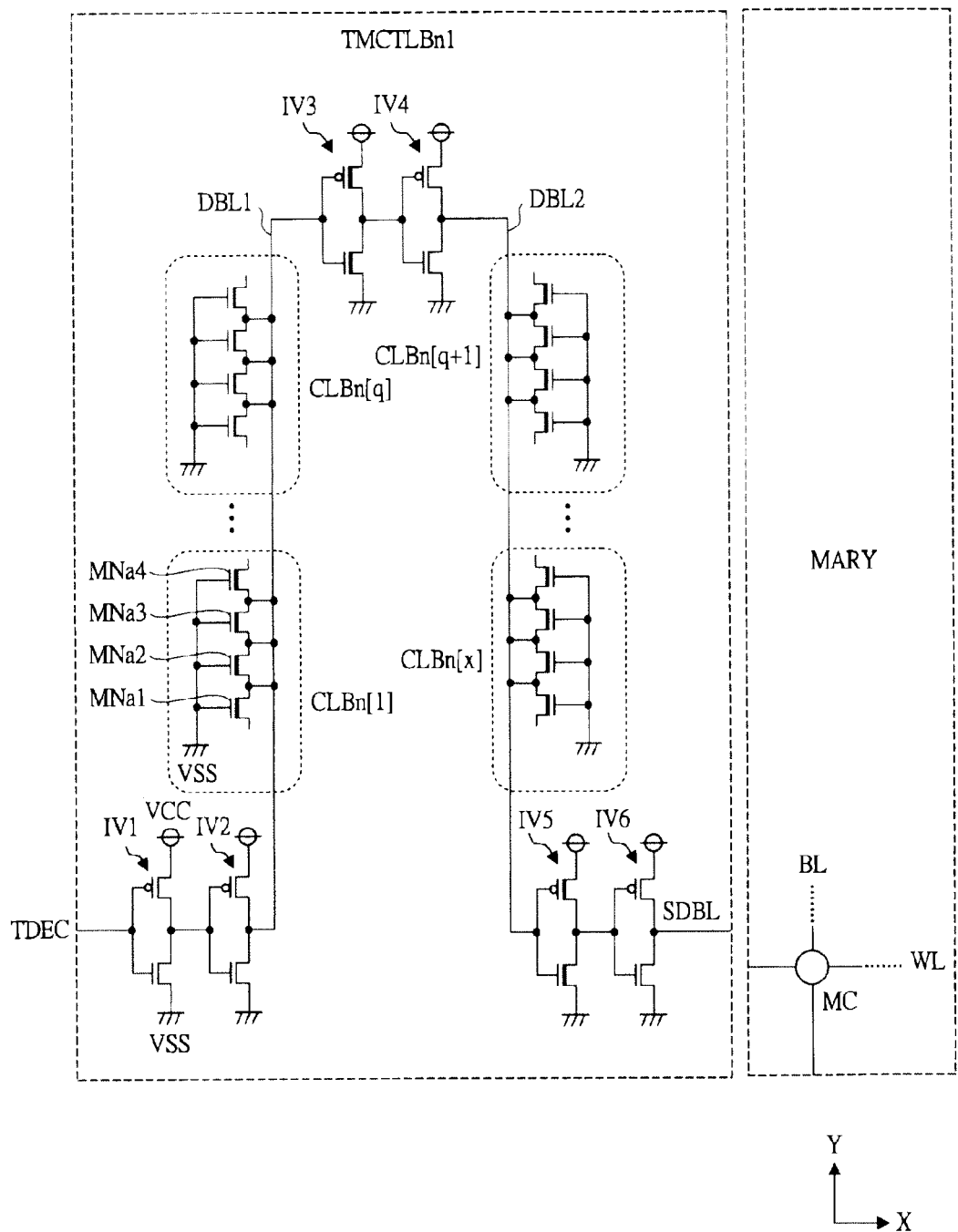
FIG. 5 is a circuit diagram illustrating a configuration example of a timing adjusting circuit (in the column direction) of the memory unit illustrated in FIG. 1.

FIG. 5 is a circuit diagram illustrating a configuration example of a timing adjusting circuit (in the column direction) of the memory unit MEMU illustrated in FIG. 1. The timing adjusting circuit TMCTLBn1 illustrated in FIG. 5 comprises plural (here, six pieces of) inverter circuits IV1-IV6, two dummy bit lines DBL1 and DBL2, and x-piece column direction load circuits CLBn[1]-CLBn[x]. Here, the dummy bit lines DBL1 and DBL2 have length substantially equal to the length of each bit line BL in the memory array MARY, respectively, and are arranged collaterally, extending in the same direction as the extension direction (Y direction) of the bit line BL in the memory array MARY. The inverter circuits IV1-IV6 are CMOS inverter circuits, each configured with a PMOS transistor and an NMOS transistor, coupled between the power supply voltage VCC and the ground power supply voltage VSS.

The inverter circuits IV1 and IV2 are arranged at the input terminal of the dummy bit line DBL1, respectively. The inverter circuit IV1 inputs the decode activation signal TDEC described above, and the inverter circuit IV2 inputs an output of the inverter circuit IV1 and outputs the inverted signal to the input terminal of the dummy bit line DBL1. The inverter circuits IV3 and IV4 are arranged at the output terminal of the dummy bit line DBL1 and the input terminal of the dummy bit line DBL2, respectively. The inverter circuit IV3 inputs a signal from the output terminal of the dummy bit line DBL1, and the inverter circuit IV4 inputs an output of the inverter circuit IV3 and outputs the inverted signal to the input terminal of the dummy bit line DBL2. The inverter circuits IV5 and IV6 are arranged at the output terminal of the dummy bit line DBL2, respectively. The inverter circuit IV5 inputs a signal from the output terminal of the dummy bit line DBL2, and the inverter circuit IV6 inputs an output of the inverter circuit IV5 and outputs the dummy bit line signal SDBL described above. In this way, the dummy bit lines DBL1 and DBL2 form a both-way wiring in the region of the timing adjusting circuit TMCTLBn1 arranged close to the memory array MARY. As for the both-way wiring here, an outward wiring is the dummy bit line DBL1, and a homeward wiring is the dummy bit line DBL2.

Each of the column direction load circuits CLBn[1]-CLBn[x] comprises plural (here, four pieces of) NMOS transistors MNa1-MNa4 of which sources and drains are coupled in series sequentially and gates are coupled in common to the ground power supply voltage VSS. In each of the column direction load circuits CLBn[1]-CLBn[q] as a part (for example, a half) of the x-piece column direction load circuits, the sources and the drains of the NMOS transistors MNa2 and MNa3 are coupled to the dummy bit line DBL1, and one end of the source/drain of the NMOS transistors MNa1 and MNa4 (the side which is not shared by the NMOS transistors MNa2 and MNa3) is open. In each of the column direction load circuits CLBn[q+1]-CLBn[x] as the other part (for example, the other half) of the x-piece column direction load circuits, the sources and the drains of the NMOS transistors MNa2 and MNa3 are coupled to the dummy bit line DBL2, and one end of the source/drain of the NMOS transistors MNa1 and MNa4 (the side which is not shared by the NMOS transistors MNa2 and MNa3) is open.

Figure 6:
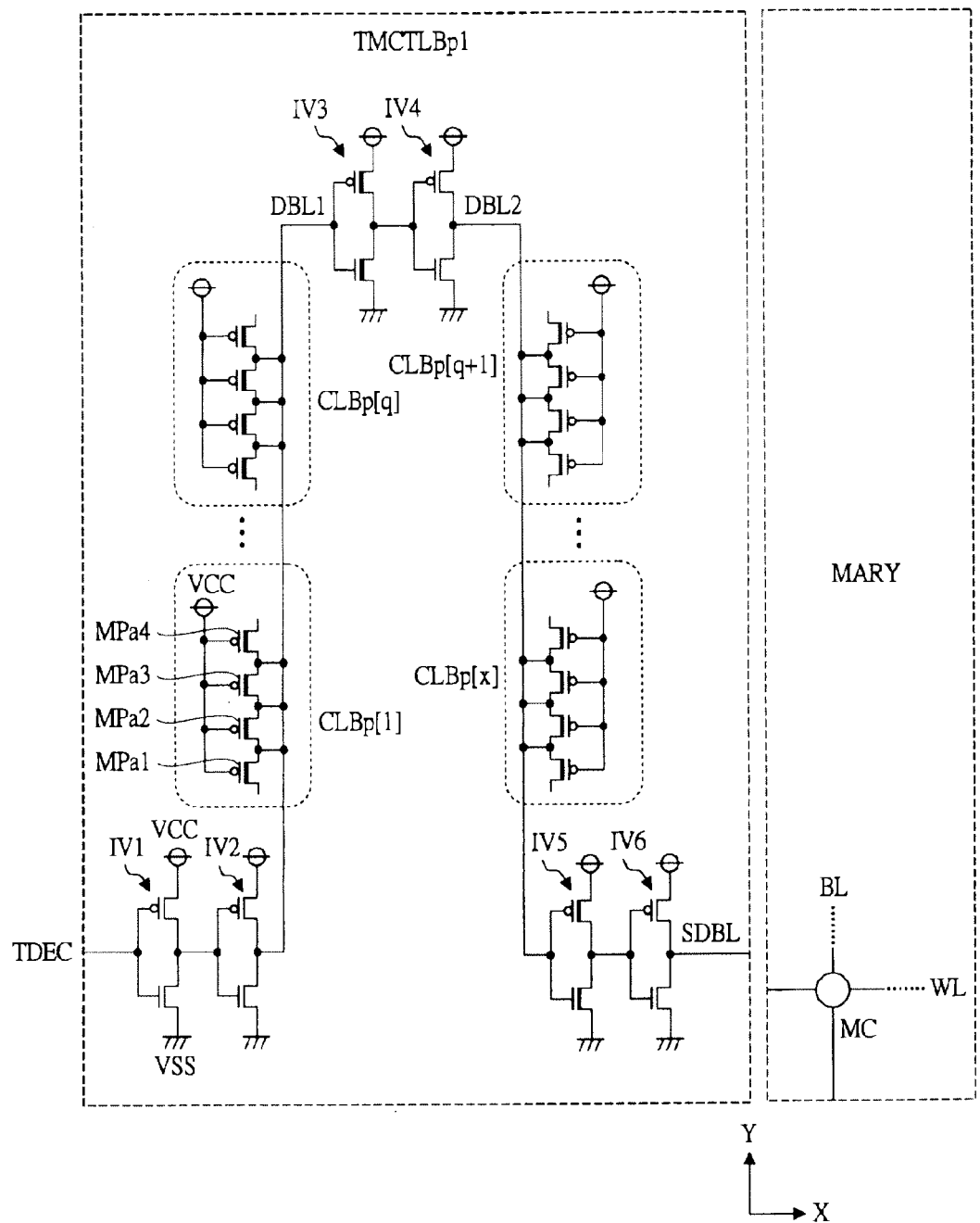
FIG. 6 is a circuit diagram illustrating a configuration example of a timing adjusting circuit (in the column direction), obtained by modifying the timing adjusting circuit illustrated in FIG. 5.

FIG. 6 is a circuit diagram illustrating a configuration example of a timing adjusting circuit (in the column direction), obtained by modifying the timing adjusting circuit illustrated in FIG. 5. The timing adjusting circuit TMCTLBp1 illustrated in FIG. 6 is configured such that the x-piece column direction load circuits CLBn[1]-CLBn[x] illustrated in FIG. 5 are replaced with x-piece column direction load circuits CLBp[1]-CLBp[x] illustrated in FIG. 6. Each of the column direction load circuits CLBp[1]-CLBp[x] is configured such that the plural (here, four pieces of) NMOS transistors MNa1-MNa4 included in each of the column direction load circuits CLBn[1]-CLBn[x] are replaced with the plural (here, four pieces of) PMOS transistors MPa1-MPa4. Unlike the NMOS transistors MNa1-MNa4 described above, the PMOS transistors MPa1-MPa4 have gates coupled in common to the power supply voltage VCC.

The column direction load circuits CLBn[1]-CLBn[x], and CLBp[1]-CLBp[x] illustrated in FIGS. 5 and 6 function as load capacitance to the dummy bit lines DBL1 and DBL2. Specifically, since the NMOS transistors MNa1-MNa4 (or the PMOS transistors MPa1-MPa4) in each column direction load circuits are driven to an off state, the capacitance of the diffusion layer which forms the source and the drain of the NMOS transistors MNa2 and MNa3 (or the PMOS transistors MPa2 and MPa3) turns into the load capacitance to the dummy bit lines DBL1 and DBL2. Accordingly, the output signal from the inverter circuit IV2 is transmitted to the inverter circuit IV3, after being delayed corresponding to the load capacitance generated by the column direction load circuits CLBn[1]-CLBn[q] (or CLBp[1]-CLBp[q]) and the parasitic resistance and parasitic capacitance of the dummy bit line DBL1. Similarly, the output signal from the inverter circuit IV4 is transmitted to the inverter circuit IV5, after being delayed corresponding to the load capacitance generated by the column direction load circuits CLBn[q+1]-CLBn[x] (or CLBp[q+1]-CLBp[x]) and the parasitic resistance and parasitic capacitance of the dummy bit line DBL2. Consequently, the dummy bit line signal SDBL is obtained by delaying the decode activation signal TDEC. More strictly, this delay time is set including the effect of a logic threshold value, driving ability, etc. of the inverter circuits IV1-IV6.

<<A Detailed Layout Configuration (1) of a Timing Adjusting Circuit (in the Column Direction)>>

Figure 7:
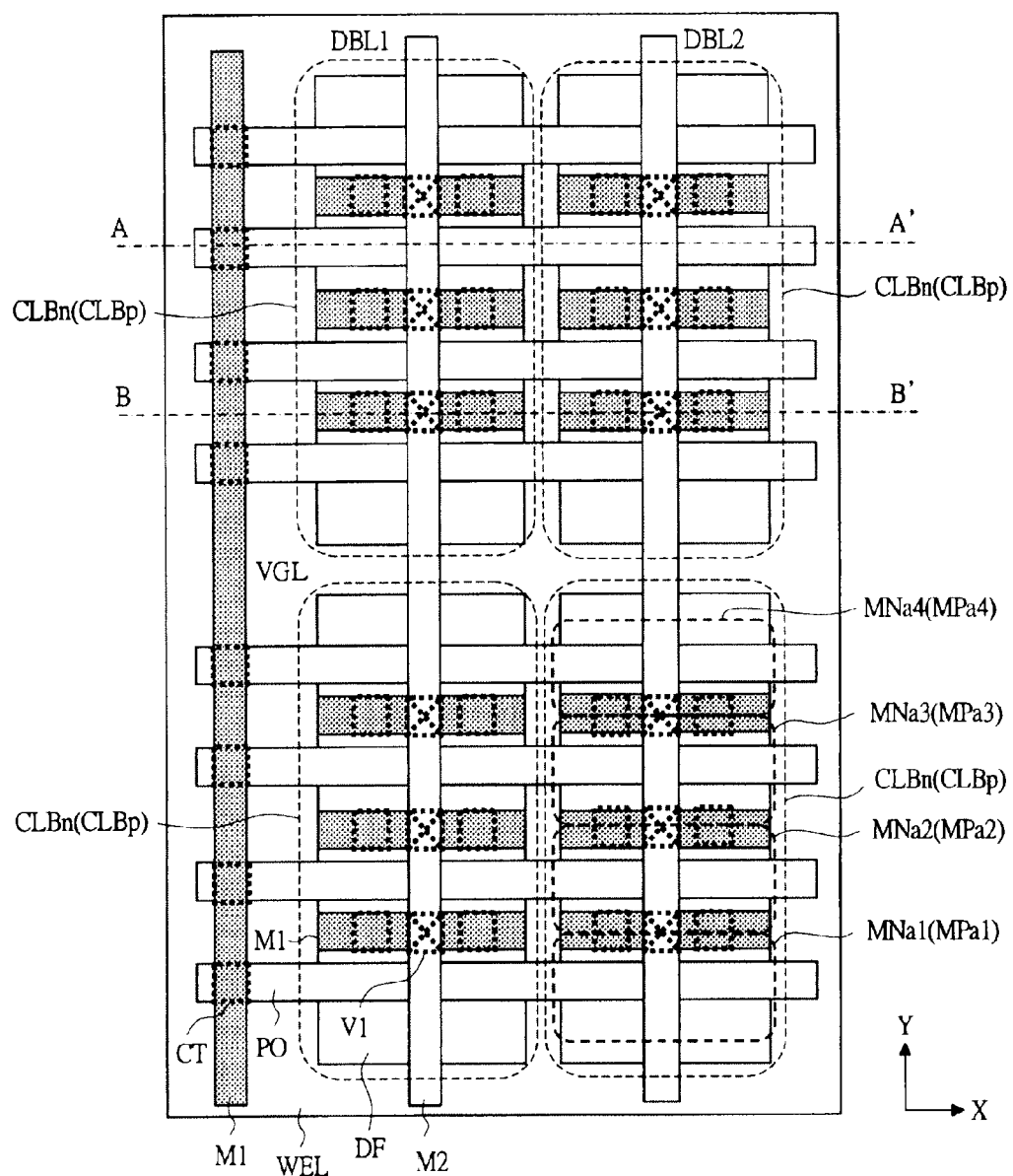
FIG. 7 is a plan view illustrating a detailed layout configuration example of a column direction load circuit of the timing adjusting circuit illustrated in FIGS. 5 and 6.
Figure 8A:
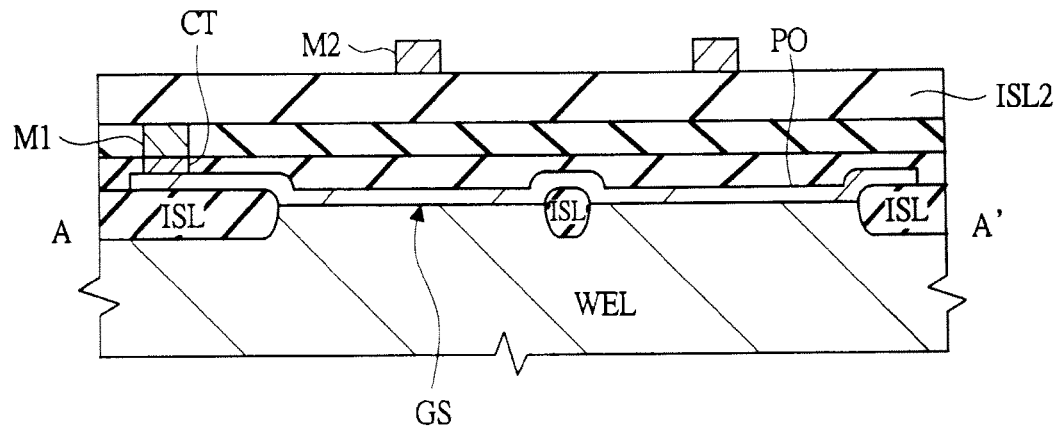
FIG. 8(a) is a sectional view illustrating an constructional example along a line A-A' illustrated in FIG. 7.
Figure 8B:
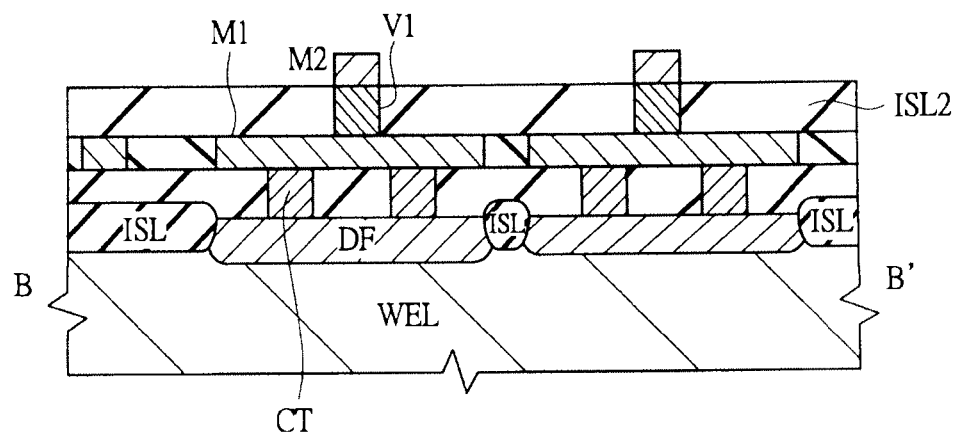
FIG. 8(b) is a sectional view illustrating an constructional example along a line B-B' illustrated in FIG. 7.

FIG. 7 is a plan view illustrating a detailed layout configuration example of a column direction load circuit of the timing adjusting circuit illustrated in FIGS. 5 and 6. FIG. 8(a) is a sectional view illustrating a constructional example along a line A-A' illustrated in FIG. 7, and FIG. 8(b) is a sectional view illustrating a constructional example along a line B-B' illustrated in FIG. 7. As illustrated in FIGS. 7 and 8, the timing adjusting circuit TMCTLBn (TMCTLBp) comprises a well WEL, a diffusion layer DF formed in the well WEL, a polysilicon layer PO formed over the well WEL with an intervening gate insulating film GS, a first metal wiring layer M1 and a second metal wiring layer M2 formed sequentially in the upper layer, a contact layer CT in a contact provided in an interlayer insulation layer ISL2, and a via layer V1 in a via hole provided in a interlayer insulation layer ISL2. The contact layer CT establishes coupling between the first metal wiring layer M1 and the polysilicon layer PO and coupling between the first metal wiring layer M1 and the diffusion layer DF. The via layer V1 establishes coupling between the first metal wiring layer M1 and the second metal wiring layer M2.

In FIG. 7, two dummy bit lines DBL1 and DBL2 formed by the second metal wiring layer M2 extend collaterally toward the Y direction (the extension direction of the bit line). Eight gate wirings formed by the polysilicon layer PO extend collaterally toward the X direction (the extension direction of the word line). The column direction load circuit CLBn (or CLBp) is formed in an intersection portion of four gate wirings from the edge out of the eight gate wirings and the dummy bit line DBL1. The column direction load circuit CLBn (or CLBp) is formed also in an intersection portion of the four gate wirings concerned and the dummy bit line DBL2. The column direction load circuit CLBn (or CLBp) is formed also in an intersection portion of the remaining four gate wirings and the dummy bit line DBL1, and in an intersection portion of the four gate wirings concerned and the dummy bit line DBL2, respectively. In each column direction load circuit, a diffusion layer DF which becomes a source or a drain is arranged on both sides of each of the four gate wirings described above. With the use of the diffusion layer DF, the NMOS transistors MNa1-MNa4 (or the PMOS transistors MPa1-MPa4) described above are formed in order in the Y direction.

A space between a diffusion layer DF included in a certain column direction load circuit and a diffusion layer DF included in another column direction load circuit is separated by an insulating layer ISL as illustrated in FIG. 8(b). Accordingly, in the example of FIGS. 5 and 7, the source or the drain of both ends in each column direction load circuit (the source or the drain of the transistor MNa1 (or MPa1) and the transistor MNa4 (or MPa4)) are left open, thereby preventing capacitance of the insulating layer ISL from being reflected in the load capacitance of the dummy bit line. The region composed of plural diffusion layers DF separated by the insulating layer ISL is called an element active region, etc. In the configuration example illustrated in FIG. 7, four element active regions are provided respectively corresponding to four column direction load circuits.

Here, plural diffusion layers DF used as the source and the drain of the NMOS transistors MNa2 and MNa3 (or the PMOS transistors MPa2 and MPa3) are once coupled to a wiring in the first metal wiring layer M1 arranged respectively in the upper layer of each diffusion layer DF, via the contact layer CT, and further coupled from there to the corresponding dummy bit line (DBL1 or DBL2) via the via layer V1. The eight gate wirings formed by the polysilicon layer PO are coupled in common to a gate bias wiring VGL which is formed by the first metal wiring layer M1 and extends toward the Y direction, via the contact layer CT. When the timing adjusting circuit concerned is the timing adjusting circuit TMCTLBn provided with the column direction load circuit CLBn composed of an NMOS transistor as shown in FIG. 5, the well WEL is a p type, the diffusion layer DF is an n type, and the gate bias wiring VGL is supplied with the ground power supply voltage VSS. On the other hand, when the timing adjusting circuit concerned is the timing adjusting circuit TMCTLBp provided with the column direction load circuit CLBp composed of a PMOS transistor as shown in FIG. 6, the well WEL is an n type, the diffusion layer DF is a p type, and the gate bias wiring VGL is supplied with the power supply voltage VCC.

Figure 9:
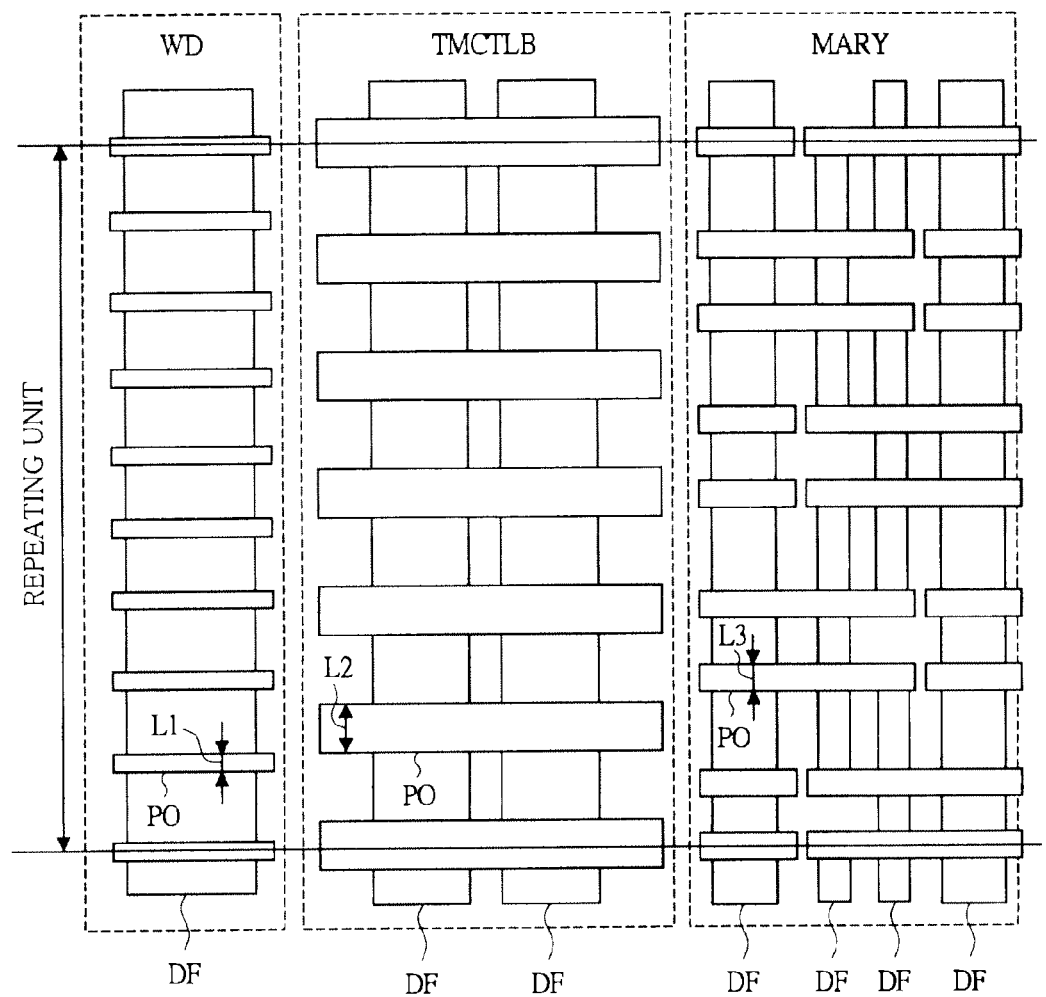
FIG. 9 is a plan view illustrating schematic comparison of a layout configuration example of a part of the word line driving circuit, the timing adjusting circuit (in the column direction), and the memory array, illustrated in FIG. 1.

FIG. 9 is a plan view illustrating schematic comparison of a layout configuration example of a part of the word line driving circuit, the timing adjusting circuit (in the column direction), and the memory array illustrated in FIG. 1. The word line driving circuit WD, the timing adjusting circuit TMCTLB, and the memory array MARY are laid out by disposing, for example, a repeating unit with an equal pitch as illustrated in FIG. 9, in a sequentially repeated fashion toward the Y direction. Here, in the column direction load circuit of the timing adjusting circuit TMCTLB, a gate length L2 of the gate wiring (the polysilicon layer PO) which forms each MOS transistor described above is longer than a gate length L3 of each MOS transistor which forms each memory cell in the memory array MARY. Although not shown, a gate length of the MOS transistor which forms each inverter circuit (IV1-IV6) in the timing adjusting circuit TMCTLB, for example, is also longer than the gate length L3 of each memory cell.

Furthermore, although not restricted in particular, the gate length L2 concerned is longer than the gate length L1 of each MOS transistor which forms the word line driving circuit WD. Usually, each MOS transistor which composes the word line driving circuit WD needs to have large driving ability in order to drive a word line; therefore, the gate length is designed short in many cases. For example, each MOS transistor in the memory array MARY is designed based on the layout rule for memory cells ordinarily applied to a memory cell. Each MOS transistor which composes the word line driving circuit WD is designed based on the layout rule for logics employed for logic circuits, such as the baseband unit BBU and the application unit APPU illustrated in FIG. 4. In this case, each MOS transistor which composes the timing adjusting circuit TMCTLB is also designed based on the layout rule for logics.

Figure 10A:
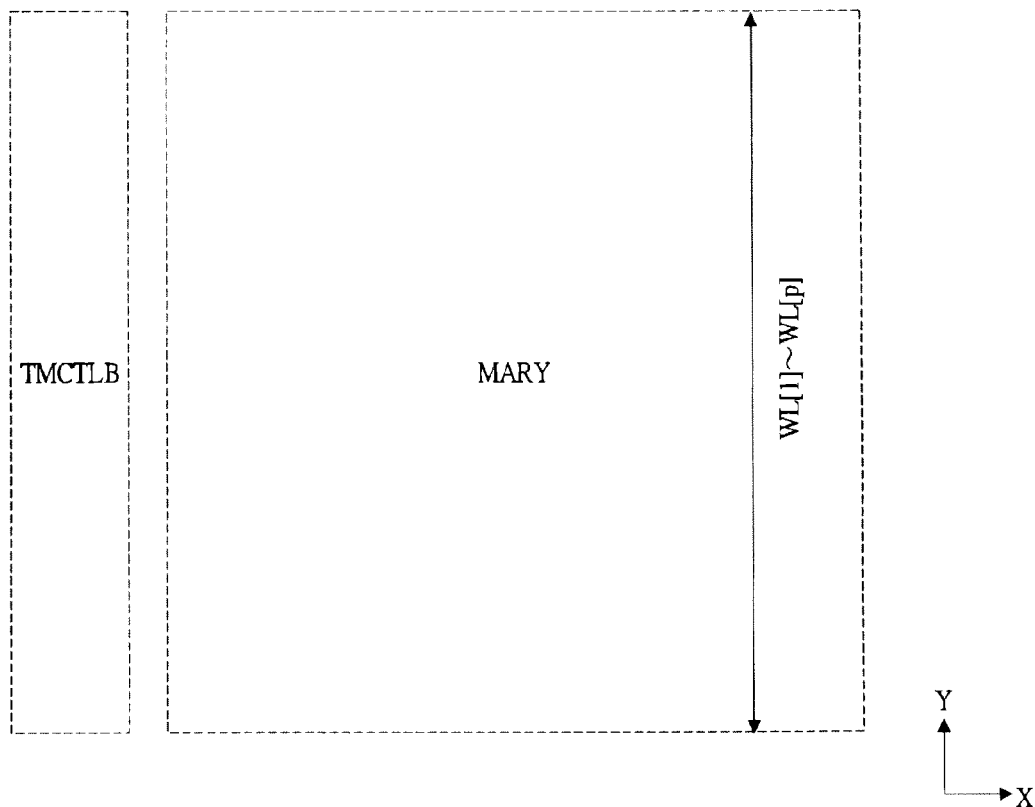
FIGS. 10(a) and 10(b) are plan views illustrating schematically relation of the size of the timing adjusting circuit and the memory array in the configuration example of FIGS. 5 and 6, respectively.
Figure 10B:
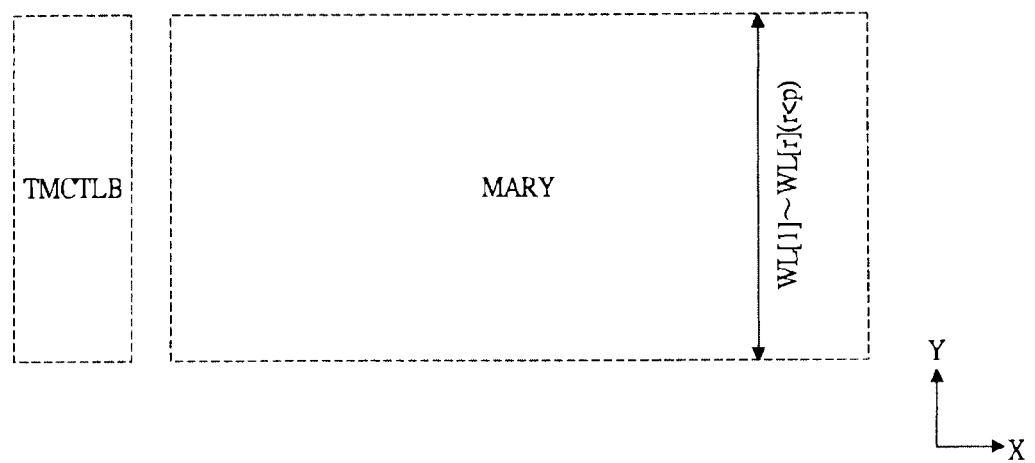

FIGS. 10(a) and 10(b) are plan views illustrating schematically relation of the size of the timing adjusting circuit and the memory array in the configuration example of FIGS. 5 and 6, respectively. As described above, the length of each dummy bit line in the timing adjusting circuit TMCTLB is designed to be substantially equal to the length of the bit line included in the memory array MARY. Accordingly, as illustrated in FIGS. 10(a) and 10(b), the size of the timing adjusting circuit TMCTLB in the Y direction will also change, following the number of word lines WL included in the memory array MARY (p lines in the case of FIG. 10(a), and r (r<p) lines in the case of FIG. 10(b)).

Figure 11A:
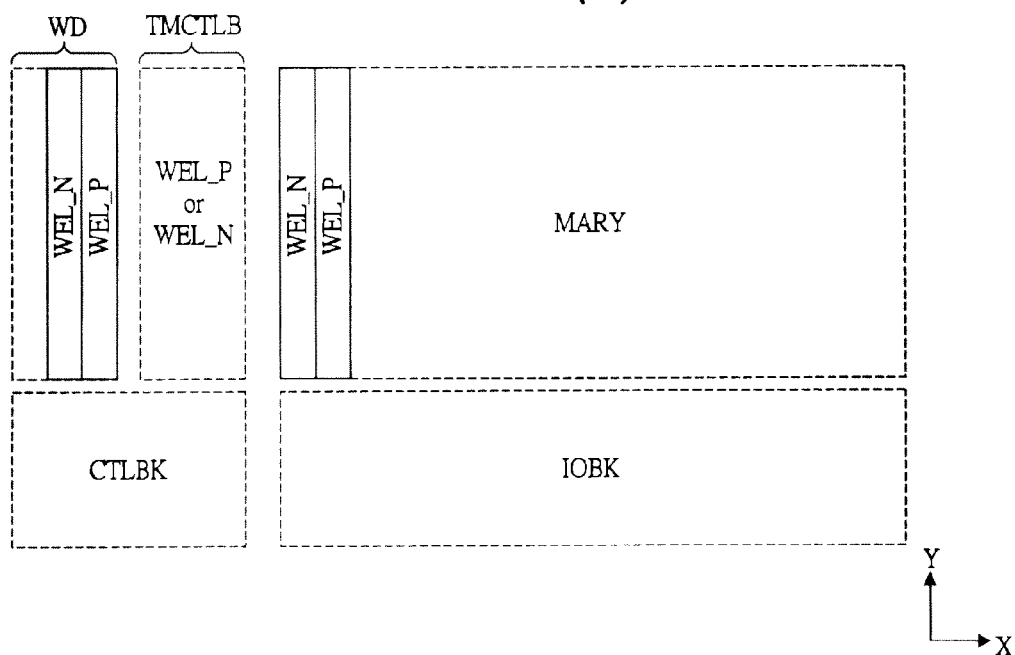
FIGS. 11(a) and 11(b) are explanatory diagrams illustrating an example of significant difference of the timing adjusting circuit illustrated in FIG. 5 and the timing adjusting circuit illustrated in FIG. 6.
Figure 11B:
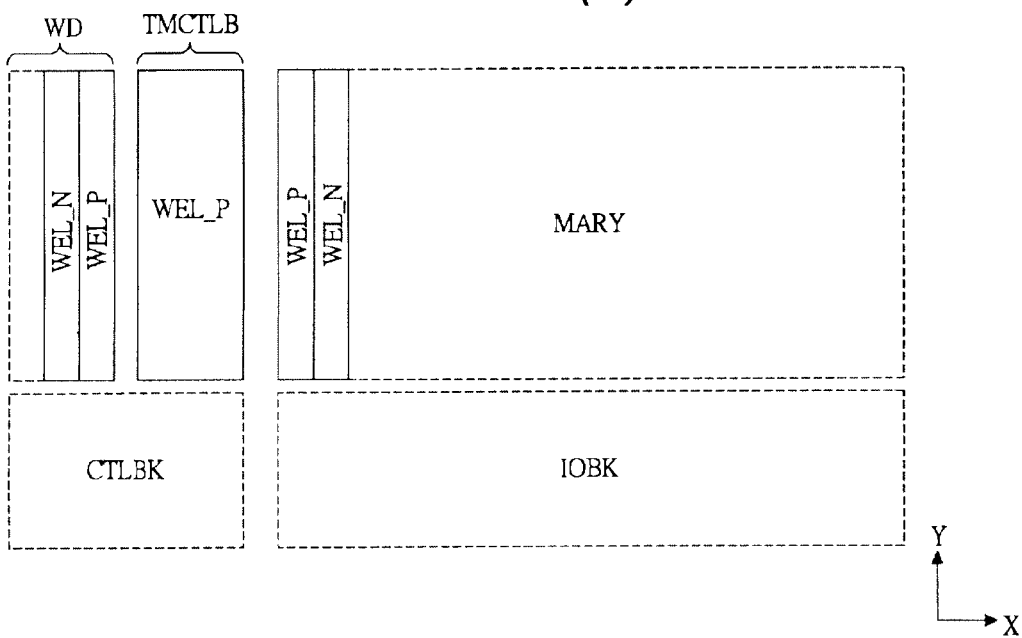

FIGS. 11(a) and 11(b) are explanatory diagrams illustrating an example of significant difference of the timing adjusting circuit illustrated in FIG. 5 and the timing adjusting circuit illustrated in FIG. 6. Schematic layout configuration examples of the periphery of the memory array MARY are illustrated in FIGS. 11(a) and 11(b). In the examples, next to the memory array MARY as a reference, the timing adjusting circuit TMCTLB and the word line driving circuit WD are arranged in order in the X direction, and an input/output circuit block IOBK is arranged contiguously in the Y direction. A control circuit block CTLBK is arranged in a region which adjoins the timing adjusting circuit TMCTLB and the word line driving circuit WD in the Y direction, and which adjoins the input/output circuit block IOBK in the X direction. For example, the input/output circuit block IOBK corresponds to the column selection circuit YSW, the write driver circuit WTD, the sense amplifier circuit SA, the input/output buffer circuit IOB, etc., illustrated in FIG. 1, and the control circuit block CTLBK corresponds to the address control circuit ADRCTL, the read/write control circuit RWCTL, etc. illustrated in FIG. 1.

In the word line driving circuit WD illustrated in FIG. 11(a), a p-type well WEL_P is formed adjoining the timing adjusting circuit TMCTLB, and an n-type well WEL_N is formed apart from the timing adjusting circuit TMCTLB, sandwiching the p-type well WEL_P concerned. In the memory array MARY, an n-type well WEL_N is formed adjoining the timing adjusting circuit TMCTLB, and a p-type well WEL_P is formed apart from the timing adjusting circuit TMCTLB, sandwiching the n-type well WEL_N concerned. In such a case, if either of the n-type well WEL_N or the p-type well WEL_P is employed as a well of the timing adjusting circuit TMCTLB, there is almost no difference in the area efficiency. Accordingly, in this viewpoint, no significant difference is produced by the configuration example illustrated in FIG. 5 and the configuration example illustrated in FIG. 6.

On the other hand, in the word line driving circuit WD illustrated in FIG. 11(b), a p-type well WEL_P is formed adjoining the timing adjusting circuit TMCTLB, and an n-type well WEL_N is formed apart from the timing adjusting circuit TMCTLB, sandwiching the p-type well WEL_P concerned. In the memory array MARY, a p-type well WEL_P is formed adjoining the timing adjusting circuit TMCTLB, and an n-type well WEL_N is formed apart from the timing adjusting circuit TMCTLB, sandwiching the p-type well WEL_P concerned. In such a case, when the p-type well WEL_P is employed as a well of the timing adjusting circuit TMCTLB, the p-type well concerned can be formed integrally with the p-type well WEL_P of the word line driving circuit WD and the p-type well WEL_P of the memory array MARY. Therefore, it is possible to realize a small area, compared with the case where the n-type well WEL_N is employed. In this viewpoint, it becomes more useful to employ the configuration example illustrated in FIG. 5 (an NMOS transistor type) than to employ the configuration example illustrated in FIG. 6 (a PMOS transistor type).

Main Effects of Embodiment 1

Up to this point, the following effects (1)-(8) are mainly obtained with each of the configurations, by employing the semiconductor device according to the present embodiment 1. It is possible to comprehend each of the configurations independently; accordingly, it is preferable to employ each of the configurations which produce the effects (1)-(8) independently, or to employ a combination of some of them.

(1) On the voltage clamp of a gate of a transistor included in the timing adjusting circuit of the semiconductor device according to the present embodiment 1: By employing the timing adjusting circuit described above, it becomes possible to reduce the variations in operation timing (typically start-up timing of the sense amplifier). One of the reasons lies in the fact that the delaying amount is set up by the method which employs the column direction load circuit, not by the dummy memory cell method which employs a dummy memory cell possessing the electrical property similar to that of a memory cell. In the dummy memory cell method, for example, plural dummy memory cells configured so as to store previously fixed information are coupled to a dummy bit line, and at least one dummy memory cell drive the dummy bit line, in response to activation of a word line (or a dummy word line). The start-up timing of a sense amplifier is provided mainly by the driving timing of the dummy bit line by the dummy memory cell. However, in a memory cell, as the finer geometries or the capacity increase advance more, the process variations (a voltage variation and a temperature variation, depending on the case) become easier to occur. Accordingly, the process variations occur easily also in each dummy memory cell which is formed reflecting the configuration of the memory cell concerned. When the process variations occur among dummy memory cells, the driving timing of the dummy bit line differs for every dummy memory cell, therefore, there may arise variations in the start-up timing of the sense amplifier.

On the other hand, in the method which employs the column direction load circuit described above, the gate of an MOS transistor is not driven dynamically as in the dummy memory cell method, but the gate of the MOS transistor is maintained at a fixed value of an off level. Accordingly, a fixed load capacitance is added to the dummy bit line in advance, and the start-up timing of the sense amplifier is determined mainly by the magnitude of the load capacitance. The amount of variations of the load capacitance depends mainly on the variations of the total area of the diffusion layer DF illustrated in FIG. 7, and is easily made smaller than the amount of variations of the driving timing of the dummy bit line by the dummy memory cell described above (in other words, the amount of variations of the current driving capacity of a dummy memory cell). Consequently, it becomes possible to reduce the variations in the start-up timing of the sense amplifier.

(2) On the gate length of a transistor included in the timing adjusting circuit of the semiconductor device according to the present embodiment 1: By employing the timing adjusting circuit described above, it becomes possible to reduce the variations in operation timing (typically start-up timing of the sense amplifier). Another one of the reasons lies in the fact that, as illustrated in FIG. 9, the gate length of each MOS transistor which composes the column direction load circuit is designed longer than the gate length of each MOS transistor in the memory cell. When the gate length is designed longer, the area of the source and the drain is designed correspondingly larger. In a semiconductor manufacturing process, ordinarily, as the processing size becomes smaller, process variations occur easily. When the gate length becomes shorter, the size variation tends to occur easily. Accordingly, the variations in the value of load capacitance by the column direction load circuit can be reduced by designing the gate length to be longer. Also as for each of the inverter circuits (IV1-IV6 illustrated in FIG. 5, etc.) which compose the timing adjusting circuit, it is desirable to make the gate length of each of the MOS transistors longer than the gate length of each of the MOS transistors in the memory cell, from a viewpoint of reducing the variations in a logic threshold value.

(3) On distributed arrangement of the column direction load circuit to the outward wiring and the homeward wiring in the semiconductor device according to the present embodiment 1: By employing the timing adjusting circuit described above, it becomes possible to reduce the variations in operation timing (typically start-up timing of the sense amplifier). Further another one of the reasons lies in the fact that the column direction load circuit is distributed in arrangement to the outward wiring and the homeward wiring. For example, as illustrated in FIG. 5, the dummy bit line is distributed to the outward wiring (DBL1) and the homeward wiring (DBL2), and plural column direction load circuits are arranged in each of the dummy bit lines DBL1 and DBL2.

If the column direction load circuit is arranged concentrating on one side of the outward wiring and the homeward wiring, when variations occur in the structure of transistors, etc. on the concentrated side of wiring, the variation property on the side of wiring will affect the delay greatly. As compared with this, influence of the variations on one side of wiring can be lessened by distributing the column direction load circuit to the outward wiring and the homeward wiring.

(4) On distributed arrangement of the column direction load circuit in a wiring in the semiconductor device according to the present embodiment 1: By employing the timing adjusting circuit described above, it becomes possible to reduce the variations in operation timing (typically start-up timing of the sense amplifier). Yet another one of the reasons lies in the fact that the column direction load circuit is distributed in arrangement in the Y direction. For example, in FIG. 5, when the Y-direction length of the column direction load circuit becomes long, especially as a result of the increase in capacity of the memory array MARY, the process variations, etc. may occur depending on the position in the Y direction. Accordingly, in FIG. 5, in each of the dummy bit line DBL1 and the dummy bit line DBL2, plural column direction load circuits are distributed in arrangement in the Y direction. Specifically, the column direction load circuits are configured with plural MOS transistors distributed in the Y direction. The process variations, etc. can be averaged as a whole by employing such distributed arrangement.

(5) On arrangement of the inverter circuit of the semiconductor device according to the present embodiment 1: Through the distributed arrangement of the inverter circuits to the input terminal of the dummy bit line DBL1, the output terminal of the dummy bit line DBL1 (the input terminal of the dummy bit line DBL2), and the output terminal of the dummy bit line DBL2, respectively, the variations in the logic threshold value, etc. of each inverter circuit can be averaged, as is the case with the effect (4) described above.

(6) On adoption of the dummy bit line corresponding to the bit line length of the semiconductor device according to the present embodiment 1: By employing the timing adjusting circuit described above, it is possible to set up the start-up timing of the sense amplifier optimally, corresponding to the number of word lines (bit line length). For example, when the number of word lines (bit line length) changes depending on the value of capacity of the memory unit, the parasitic capacitance, etc. of a bit line will change correspondingly. Therefore, the optimal start-up timing of the sense amplifier also differs. Accordingly, as described with reference to FIG. 10, the influence of the parasitic capacitance of the bit line is reflected, by following the number of word lines (bit line length) and changing the length of the dummy bit line. Accordingly, it is possible to set up the optimal start-up timing of the sense amplifier to the memory unit with various number of word lines (bit line length).

(7) On the configuration of a transistor included in the timing adjusting circuit of the semiconductor device according to the present embodiment 1: By employing the timing adjusting circuit described above, it is possible to execute easily the timing adjusting in setting the start-up timing of the sense amplifier, irrespective of the kind of the memory cell. For example, in the dummy memory cell method described above, since the configuration of a dummy memory cell will also change when the kind of a memory cell changes, it is necessary to newly develop a timing adjusting circuit for each kind of the memory cell. On the other hand, the timing adjusting circuit as illustrated in FIG. 5 and others can be employed in common irrespective of the kind of the memory cell. Specifically, when the kind of the memory cell changes, it is only necessary to consider the worst condition (typically, access time of the memory cell located in the end of the word line and in the end of the bit line), and just to adjust suitably the value of load capacitance of the column direction load circuit. In this case, without changing the basic configuration of the layout itself illustrated in FIG. 7 for example, it is only necessary to select suitably whether or not to provide the via layer V1 (a coupling part between the dummy bit line and the drain and source of each MOS transistor which composes the column direction load circuit). Accordingly, the adjustment is easy.

(8) On application of the layout rule for logics to the timing adjusting circuit of the semiconductor device according to the present embodiment 1: By employing the timing adjusting circuit described above, it becomes possible to remove the arrangement restriction on a layout. For example, in the dummy memory cell method described above, the timing adjusting circuit is designed by the layout rule for memory cells; accordingly, it is necessary to arrange the timing adjusting circuit inside the memory array (or adjoining the memory array). On the other hand, the timing adjusting circuit illustrated in FIG. 5 or others is designed by the layout rule for logics. Therefore, it is not necessary to arrange the timing adjusting circuit inside the memory array (or adjoining the memory array). Accordingly, it becomes possible to utilize the area effectively depending on the case, leading to realization of a small area of the semiconductor device.

Various Modified Examples of Embodiment 1

The various examples of the configuration described in Embodiment 1 is not restricted to them and can be variously changed naturally in the range which does not deviate from the gist. For example, if it is permissible to increase the circuit area from a viewpoint of averaging the variations described above, it is also possible to provide the dummy bit line not only as onefold both ways as illustrated in FIG. 5, but as multifold both ways. In FIG. 5 and others, the column direction load circuit is provided in each of two dummy bit lines DBL1 and DBL2. However, depending on the case, it is also possible to provide the column direction load circuit only in one dummy bit line. However, from a viewpoint of averaging the variations described above, it is desirable to provide the column direction load circuit in both dummy bit lines, and it is more desirable to provide them equally in both dummy bit lines. Furthermore, in FIG. 5 and others, the inverter circuits IV3 and IV4 are provided at the turning point of the dummy bit line, from a viewpoint of averaging the variations described above, etc. However, it is also possible to omit the inverter circuits concerned depending on the case. In FIG. 5 and others, the inverter circuit of each part is provided as two-stage configuration (for example, IV1 and IV2). However, it is also possible to change the number of stages suitably. In this case, from a viewpoint of making the delay time of the dummy bit line DBL1 and the delay time of the dummy bit line DBL2 as equal as possible, it is desirable to make equal the signal polarity of the dummy bit line DBL1 and the signal polarity of the dummy bit line DBL2. However, it is also possible to set them as different polarities, depending on the case.

Embodiment 2

<<A Detailed Circuit (2) of a Timing Adjusting Circuit (in the Column Direction)>>

Figure 12:
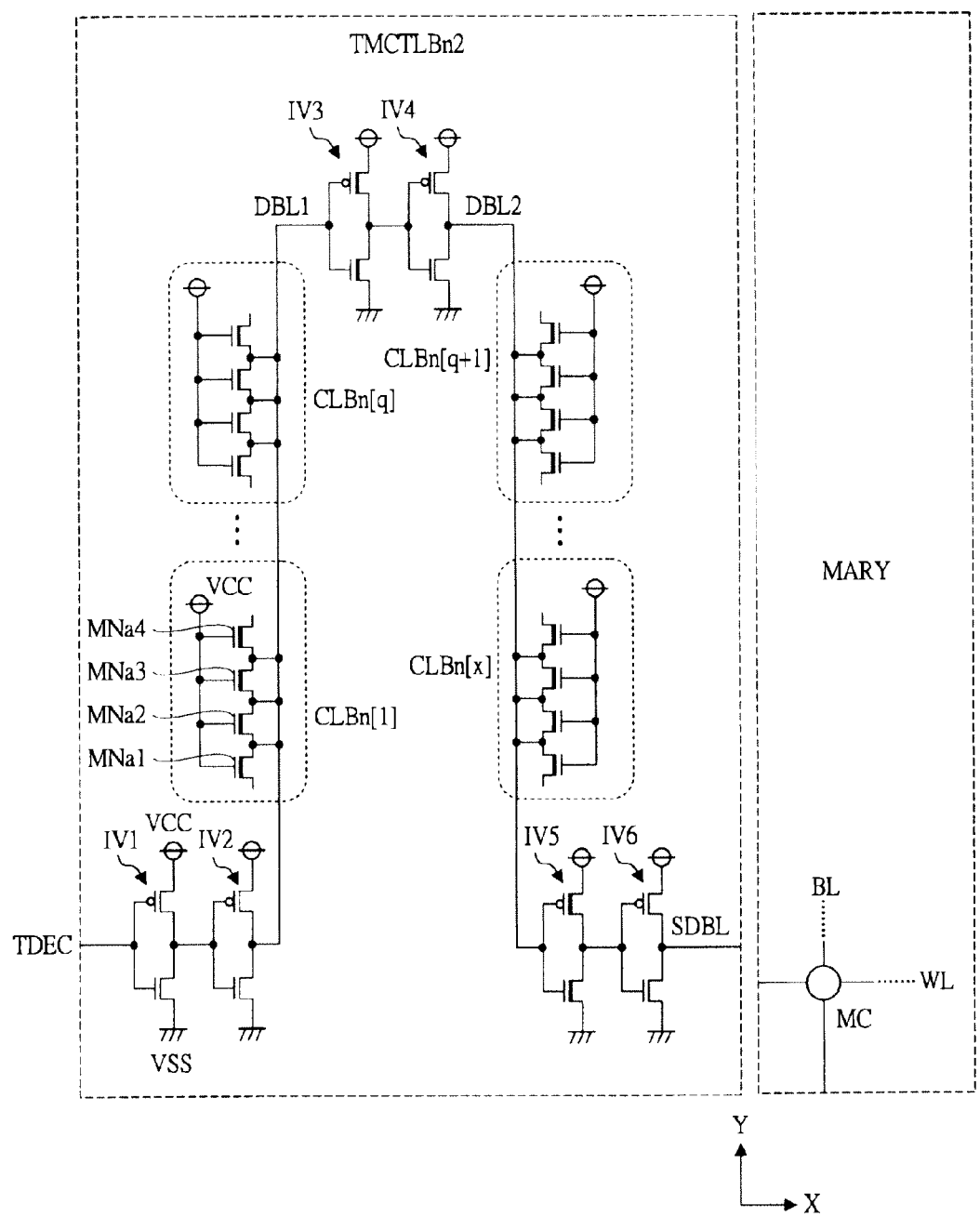
FIG. 12 is a circuit diagram illustrating a configuration example of a timing adjusting circuit (in the column direction) included in a semiconductor device according to Embodiment 2 of the present invention.

FIG. 12 is a circuit diagram illustrating a configuration example of a timing adjusting circuit (in the column direction) included in a semiconductor device according to Embodiment 2 of the present invention. The timing adjusting circuit TMCTLBn2 illustrated in FIG. 12 is a modified example of the timing adjusting circuit TMCTLBn1 illustrated in FIG. 5. The configuration example illustrated in FIG. 12 is different from the configuration example illustrated in FIG. 5 in that the gates of the NMOS transistors MNa1-MNa4 included in each of the column direction load circuits CLBn[1]-CLBn[x] are coupled in common to the power supply voltage VCC.

Figure 13:
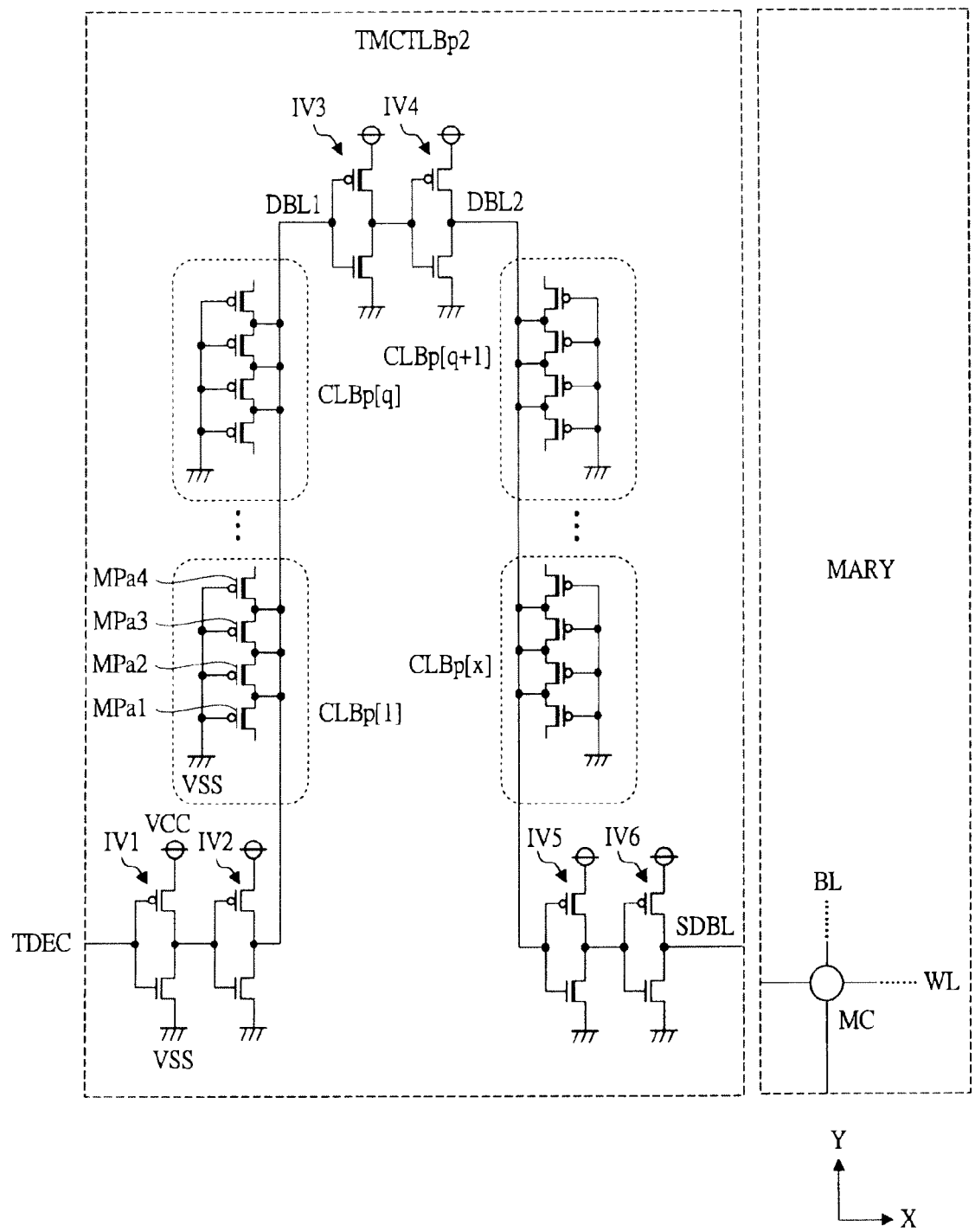
FIG. 13 is a circuit diagram illustrating another configuration example of a timing adjusting circuit (in the column direction) included in a semiconductor device according to Embodiment 2 of the present invention.

FIG. 13 is a circuit diagram illustrating another configuration example of a timing adjusting circuit (in the column direction) included in a semiconductor device according to Embodiment 2 of the present invention. The timing adjusting circuit TMCTLBp2 illustrated in FIG. 13 is a modified example of the timing adjusting circuit TMCTLBp1 illustrated in FIG. 6. The configuration example illustrated in FIG. 13 is different from the configuration example illustrated in FIG. 6 in that the gates of the PMOS transistors MPa1-MPa4 included in each of the column direction load circuits CLBp[1]-CLBp[x] are coupled in common to the ground power supply voltage VSS.

When the column direction load circuits CLBn[1]-CLBn[x], and CLBp[1]-CLBp[x] illustrated in FIGS. 12 and 13 are employed, unlike the case of FIGS. 5 and 6 described above, gate insulating film capacitance will be added as the load capacitance to the dummy bit lines DBL1 and DBL2. That is, since the MOS transistors MNa1-MNa4 (MPa1-MPa4) are driven to an on state, the column direction load circuit adds, to the dummy bit lines DBL1 and DBL2, the gate insulating film capacitance of the MOS transistors MNa1-MNa4 (MPa1-MPa4) and the capacitance of the diffusion layer which composes the source and the drain of the MOS transistors MNa2 and MNa3 (MPa2 and MPa3). Usually, since the gate insulating film capacitance is larger in capacity value than the diffusion layer capacitance, for example, when a comparatively large load capacitance is required, or when the number of the column direction load circuits is desired to be reduced to some extent, it becomes useful to employ the configuration example concerned.

When the configuration examples illustrated in FIGS. 12 and 13 are employed, the layout configuration example illustrated in FIG. 7 can be applied. In the case of FIG. 12, the power supply voltage VCC is applied to the gate bias wiring VGL, and in the case of FIG. 13, the ground power supply voltage VSS is applied to the gate bias wiring VGL. When adjusting the value of load capacitance to be added to the dummy bit line by the gate insulating film capacitance, it is only necessary to select suitably whether or not the contact layer CT is provided for coupling the gate bias wiring VGL and the gate wiring (polysilicon layer PO) in FIG. 7. The control here can be performed easily. It is also possible to employ a suitable combination of the configuration example of FIG. 12 (FIG. 13) and the configuration example of FIG. 5 (FIG. 6). That is, it is possible to apply the power supply voltage VCC to each of the MOS transistors of the column direction load circuit CLBn[1] in FIGS. 12 and 5, and to apply the ground power supply voltage VSS to each of the MOS transistors of the column direction load circuit CLBn[q], for example. In this case, in the layout configuration example illustrated in FIG. 7, it is only necessary to provide two gate bias wirings VGL (one for VCC, and one for VSS), and to couple one of these to the gate wiring via the contact layer CT.

Figure 14A:
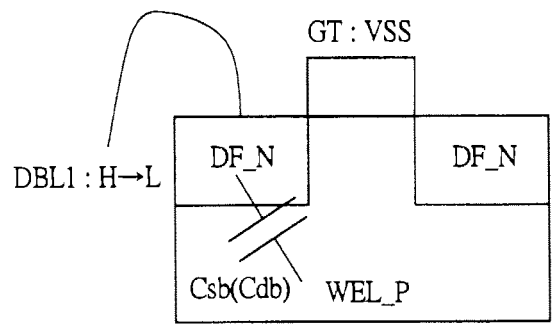
Figure 14B:
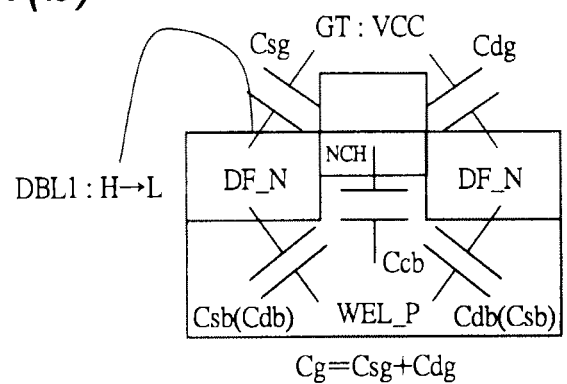
Figure 14C:
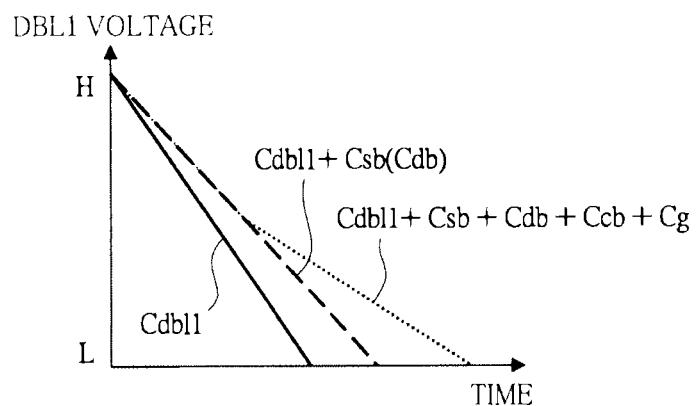

FIGS. 14(a), 14(b), and 14(c) are supplementary drawings illustrating load capacitance in the column direction load circuit illustrated in FIG. 12. FIGS. 14(a) and 14(b) are schematic diagrams illustrating the position of the load capacitance, and FIG. 14(c) is a diagram roughly showing an example of voltage waveforms corresponding to the load capacitance of FIGS. 14(a) and 14(b). FIGS. 14(a) and 14(b) illustrate examples of cross-section structure of the NMOS transistors MNa1-MNa4 in the column direction load circuit. In FIGS. 14(a) and 14(b), a gate wiring GT is formed over a p-type well WEL_P, sandwiching a gate insulating film, and an n-type diffusion layer DF_N used as a source and a drain is formed on both sides of the gate wiring GT in the p-type well WEL_P.

FIG. 14(a) illustrates the case where the ground power supply voltage VSS is applied to the gate wiring GT, and the present case corresponds to the case illustrated in FIG. 5. In the present case, a channel is not formed beneath the gate of the NMOS transistor, and the dummy bit line (here DBL1) coupled to the diffusion layer DF_N used as the source or the drain can see diffusion layer capacitance (pn junction capacitance) Csb (or Cdb) between the diffusion layer DF_N concerned and the p-type well WEL_P. FIG. 14(b) illustrates the case where the power supply voltage VCC is applied to the gate wiring GT, and the present case corresponds to the case illustrated in FIG. 12. In the present case, a channel NCH is formed beneath the gate of the NMOS transistor.

Accordingly, the dummy bit line DBL1 coupled to the diffusion layer DF_N used as the source, for example, can see diffusion layer capacitance Csb between the diffusion layer DF_N (source) and the p-type well WEL_P, and in addition, gate insulating film capacitance Cg, pn junction capacitance Ccb between the channel NCH and the p-type well WEL_P, and diffusion layer capacitance Cdb between the diffusion layer DF_N (drain) and the p-type well WEL_P. The gate insulating film capacitance Cg is the sum total of gate-source capacitance Csg and gate-drain capacitance Cdg.

Accordingly, when the dummy bit line DBL1 shifts from an 'H' level to an 'L' level, a delay (a gentle change of a waveform) as illustrated in FIG. 14(c) occurs depending on the kind of the load capacitance. First, in the case of FIG. 14(a), the value of the load capacitance is given by the sum of the parasitic capacitance Cdbl1 of the dummy bit line DBL1 and the diffusion layer capacitance Csb (or Cdb), totaling to "Cdbl1+Csb (Cdb)." Therefore, as illustrated in FIG. 14(c), the voltage waveform of the dummy bit line DBL1 exhibits a more gentle change, as compared with the case where the value of the load capacitance is given by only the parasitic capacitance Cdbl1. Next, in the case of FIG. 14(b), the value of load capacitance is given by the sum total "Cdbl1+Csb+Cdb+Ccb+Cg." Therefore, as illustrated in FIG. 14(c), the voltage waveform of the dummy bit line DBL1 exhibits a furthermore gentle change, as compared with the case of FIG. 14(a). However, the voltage waveform of the dummy bit line DBL1 exhibits a furthermore gentle change than in the case of FIG. 14(a) bordering on a certain voltage level, because, in the transition period of the voltage of the dummy bit line DBL1, the channel NCH (that is, Cdb+Ccb+Cg) is not generated in the period where the voltage level of the dummy bit line DBL1 is near an 'H' level to some extent.

Figure 15A:
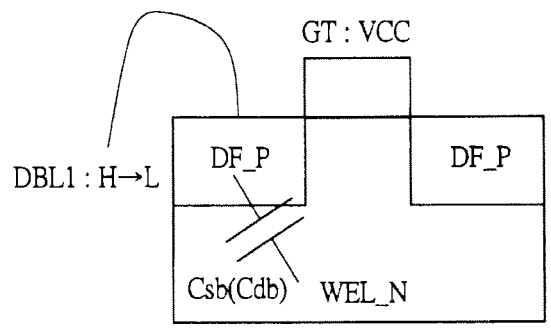
Figure 15B:
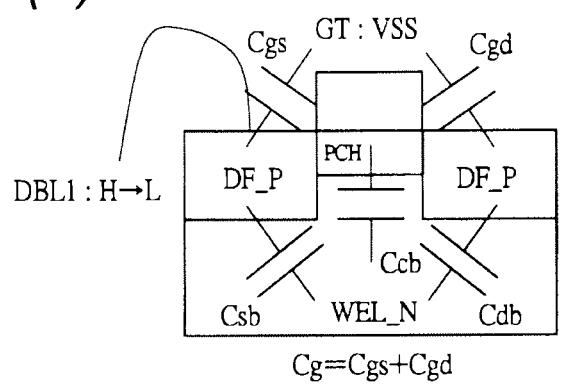
Figure 15C:
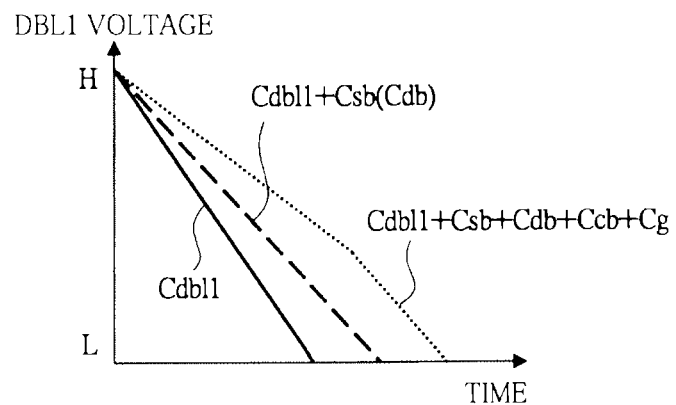

FIGS. 15(a), 15(b), and 15(c) are supplementary drawings illustrating load capacitance in the column direction load circuit illustrated in FIG. 13, in which FIGS. 15(a) and 15(b) are schematic diagrams illustrating the position of the load capacitance, and FIG. 15(c) is a diagram roughly showing an example of voltage waveforms corresponding to the load capacitance of FIGS. 15(a) and 15(b). FIGS. 15(a) and 15(b) illustrate examples of cross-section structure of the PMOS transistors MPa1-MPa4 in the column direction load circuit. In FIGS. 15(a) and 15(b), a gate wiring GT is formed over an n-type well WEL_N, sandwiching a gate insulating film, and a p-type diffusion layer DF_P used as a source and a drain is formed on both sides of the gate wiring GT in the n-type well WEL_N.

FIG. 15(a) illustrates the case where the power supply voltage VCC is applied to the gate wiring GT, and the present case corresponds to the case illustrated in FIG. 6. In the present case, a channel is not formed beneath the gate of the PMOS transistor, and the dummy bit line (here DBL1) coupled to the diffusion layer DF_P used as the source or the drain can see diffusion layer capacitance (pn junction capacitance) Csb (or Cdb) between the diffusion layer DF_P concerned and the n-type well WEL_N. FIG. 15(b) illustrates the case where the ground power supply voltage VSS is applied to the gate wiring GT, and the present case corresponds to the case illustrated in FIG. 13. In the present case, a channel PCH is formed beneath the gate of the PMOS transistor. Accordingly, the dummy bit line DBL1 coupled to the diffusion layer DF_P used as the source, for example, can see diffusion layer capacitance Csb between the diffusion layer DF_P (source) and the n-type well WEL_N, and in addition, gate insulating film capacitance Cg, pn junction capacitance Ccb between the channel PCH and the n-type well WEL_N, and diffusion layer capacitance Cdb between the diffusion layer DF_P (drain) and the n-type well WEL_N. The gate insulating film capacitance Cg is the sum total of gate-source capacitance Cgs and gate-drain capacitance Cgd.

Accordingly, when the dummy bit line DBL1 shifts from an 'H' level to an 'L' level, a delay (a gentle change of a waveform) as illustrated in FIG. 15(c) occurs depending on the kind of the load capacitance. First, in the case of FIG. 15(a), the value of the load capacitance is given by the sum of the parasitic capacitance Cdbl1 of the dummy bit line DBL1 and the diffusion layer capacitance Csb (or Cdb), totaling to "Cdbl1+Csb (Cdb)." Therefore, as illustrated in FIG. 15(c), the voltage waveform of the dummy bit line DBL1 exhibits a more gentle change, as compared with the case where the value of the load capacitance is given by only the parasitic capacitance Cdbl1. Next, in the case of FIG. 15(b), the value of load capacitance is given by the sum total "Cdbl1+Csb+Cdb+Ccb+Cg." Therefore, as illustrated in FIG. 15(c), the voltage waveform of the dummy bit line DBL1 exhibits a furthermore gentle change, as compared with the case of FIG. 15(a). However, the voltage waveform of the dummy bit line DBL1 exhibits a change from a greatly gentle change to a less gentle change observed in the case of FIG. 15(a), bordering on a certain voltage level, because, in the transition period of the voltage of the dummy bit line DBL1, the channel PCH (that is, Cdb+Ccb+Cg) disappears in the period where the voltage level of the dummy bit line DBL1 approaches an 'L' level to some extent.

In this way, when the column direction load circuit which utilizes the gate insulating film capacitance as the load capacitance is employed, how the load capacitance is seen is different, depending on the combination of the transition direction of the voltage level of the dummy bit line DBL1 and the conductive type of the MOS transistor of the column direction load circuit. For example, when an NMOS transistor is employed, in the transition of the voltage level of the dummy bit line DBL1 from an 'H' level to an 'L' level, the gate insulating film capacitance cannot be seen in the early stage, however, in the transition from an 'L' level to an 'H' level, the gate insulating film capacitance can be seen in the early stage. On the contrary, when a PMOS transistor is employed, in the transition of the voltage level of the dummy bit line DBL1 from an 'H' level to an 'L' level, the gate insulating film capacitance can be seen in the early stage, however, in the transition from an 'L' level to an 'H' level, the gate insulating film capacitance cannot be seen in the early stage. Usually, it is more desirable to employ the combination in which the gate insulating film capacitance can be seen in the early stage of the transition.

As described above, it is possible to easily support even a case where a large value of load capacitance is required for example, by employing the semiconductor device of the present embodiment 2. In the present embodiment 2, either one of the PMOS transistor or the NMOS transistor is employed as the column direction load circuit. However, it is also possible to realize a configuration so that both may be employed, depending on the case. That is, a p-type well and an n-type well are both formed in the timing adjusting circuit, and a part of the column direction load circuit is configured with the NMOS transistors, and the other part is configured with the PMOS transistors. In this case, although the circuit area may increase, it becomes possible to average the degree of how the gate insulating film capacitance can be seen, during the transition period of the voltage level of the dummy bit line.

Embodiment 3

<<A Detailed Circuit (3) of a Timing Adjusting Circuit (in the Column Direction)>>

Figures 16A, 16B:
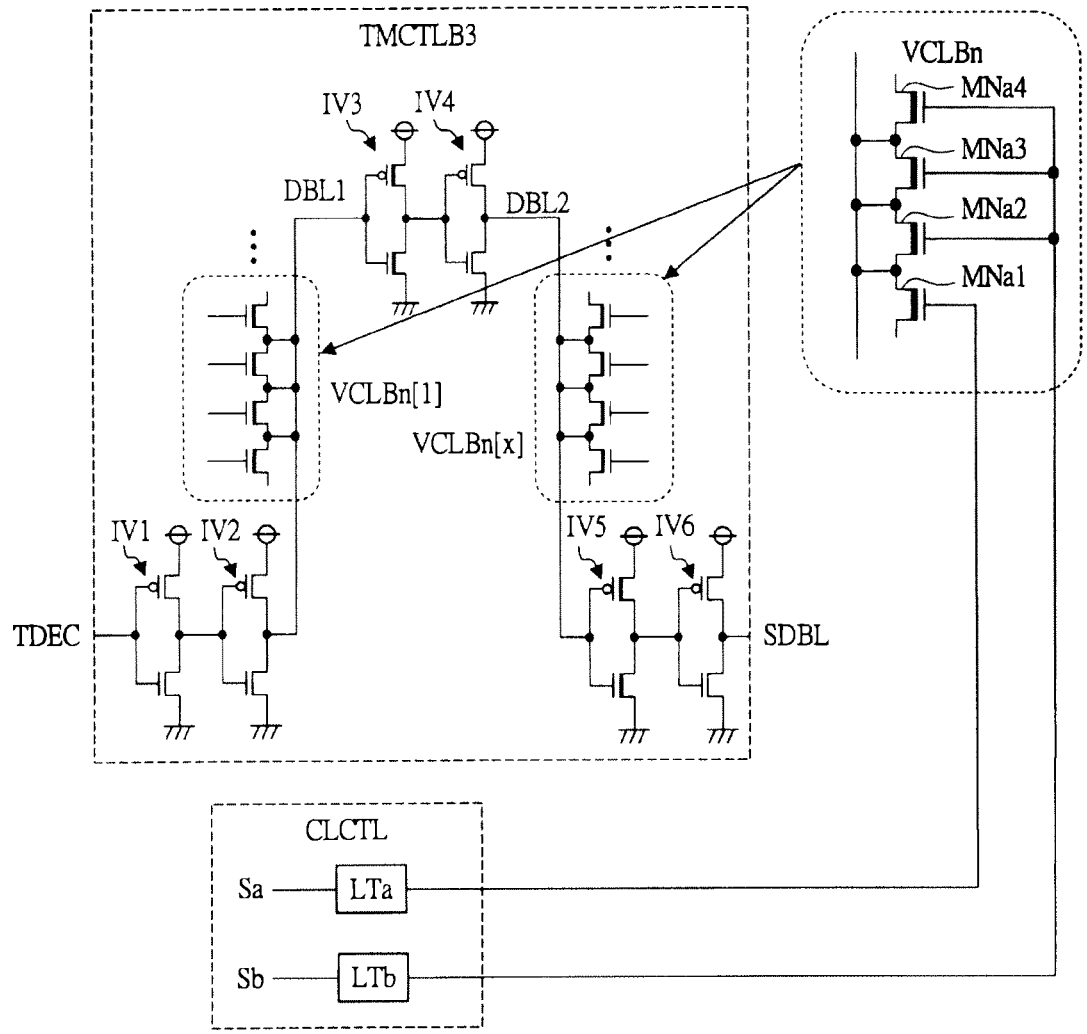
FIG. 16(a) is a circuit diagram illustrating a configuration example of a timing adjusting circuit (in the column direction) included in a semiconductor device according to Embodiment 3 of the present invention.
FIG. 16(b) is a supplementary drawing of FIG. 16(a)

FIG. 16(a) is a circuit diagram illustrating a configuration example of a timing adjusting circuit (in the column direction) included in a semiconductor device according to Embodiment 3 of the present invention, and FIG. 16(b) is a supplementary drawing of FIG. 16(a). The timing adjusting circuit TMCTLB3 illustrated in FIG. 16(a) is a modified example of the timing adjusting circuit TMCTLBn1 illustrated in FIG. 5. The timing adjusting circuit TMCTLB3 illustrated in FIG. 16(a) differs from the timing adjusting circuit TMCTLBn1 illustrated in FIG. 5 in that the column direction load circuits are changed into variable column direction load circuits VCLBn[1]-VCLBn[x].

The variable column direction load circuit VCLBn[1]-VCLBn[x] are provided with NMOS transistors MNa1-MNa4 as is the case with FIG. 5; however, unlike the case with FIG. 5, each gate voltage of the NMOS transistors MNa1-MNa4 can be set up suitably. For this reason, in FIG. 16(a), a load capacitance setting circuit CLCTL including latch circuits LTa and LTb is provided further. In the present configuration, the latch circuit LTa latches a load capacitance setting signal Sa inputted separately, and controls the gate voltage of the NMOS transistor MNa1, and the latch circuit LTb latches a load capacitance setting signal Sb inputted separately, and controls the gate voltage of the NMOS transistors MNa2-MNa4 in common.

In the present configuration example, as illustrated in FIG. 16(b), first, when the load capacitance setting signals (Sa, Sb) are set at ('1', '0') ('1': a VCC level, '0': a VSS level), the NMOS transistor MNa1 is set to an on state, and the NMOS transistors MNa2-MNa4 are set to an off state, respectively. Consequently, the load capacitance of the dummy bit lines DBL1 and DBL2 by the column direction load circuit is given mainly by the sum total of the gate insulating film capacitance of the NMOS transistor MNa1 and the diffusion layer capacitance of the source and the drain of the NMOS transistors MNa1-MNa3. Next, when the load capacitance setting signals (Sa, Sb) are set at ('0', '0'), the NMOS transistors MNa1-MNa4 are set to an off state. Consequently, the load capacitance of the dummy bit lines DBL1 and DBL2 by the column direction load circuit is given by the sum total of the diffusion layer capacitance of the source and the drain of the NMOS transistors MNa2 and MNa3. In the present case, since the value of load capacitance becomes smaller as compared with the case of the load capacitance setting signals (Sa, Sb)=('1', '0') (defined as a case of standard setup), the start-up timing of a sense amplifier is set up a little early.

Next, when the load capacitance setting signals (Sa, Sb) are set at ('0', '1'), the NMOS transistor MNa1 is set to an off state, and the NMOS transistors MNa2-MNa4 are set to an on state, respectively. Consequently, the load capacitance of the dummy bit line DBL1 and DBL2 by the column direction load circuit is given mainly by the sum total of the gate insulating film capacitance of the NMOS transistors MNa2-MNa4 and the diffusion layer capacitance of the source and the drain of the NMOS transistors MNa2-MNa4. In the present case, since the value of load capacitance becomes larger as compared with the above described case of the standard setup, the start-up timing of the sense amplifier is set up later. Finally, when the load capacitance setting signals (Sa, Sb) are set at ('1', '1'), the NMOS transistors MNa1-MNa4 are set to an on state. Consequently, the load capacitance of the dummy bit line DBL1 and DBL2 by the column direction load circuit is given mainly by the sum total of the gate insulating film capacitance of the NMOS transistors MNa1-MNa4 and the diffusion layer capacitance of the source and the drain of the NMOS transistors MNa1-MNa4. In the present case, since the value of load capacitance becomes still larger as compared with the case of the load capacitance setting signals (Sa, Sb)=('0', '1') described above, the start-up timing of the sense amplifier are set up still later.

The information on the load capacitance setting signals Sa and Sb may be stored in advance on a non-volatile memory, when the semiconductor device is provided with the non-volatile memory, or the information may be set permanently by means of a fuse, etc., or, when the semiconductor device is provided with a setup mode, the information may be dynamically changed via various circuit units in the semiconductor device or via an external terminal in the setup mode concerned. For example, when testing memory units, such as an SRAM, there is a case where one wishes to delay the start-up timing of a sense amplifier temporarily. In such a case, the configuration which can be changed dynamically is desirable. In FIG. 16(a), the variable setup is realized by the combination of one MOS transistor (MNa1) and three MOS transistors (MNa2-MNa4). However, it should be understood that the combination is not restricted to the case but can be changed suitably. However, by assigning different numbers of MOS transistors to each of the load capacitance setting signals, as shown in FIG. 16(a), it becomes possible to realize the variable setup of several steps (four steps in the present example) with which the value of load capacitance can be varied with sufficient balance.

Figures 17A, 17B:
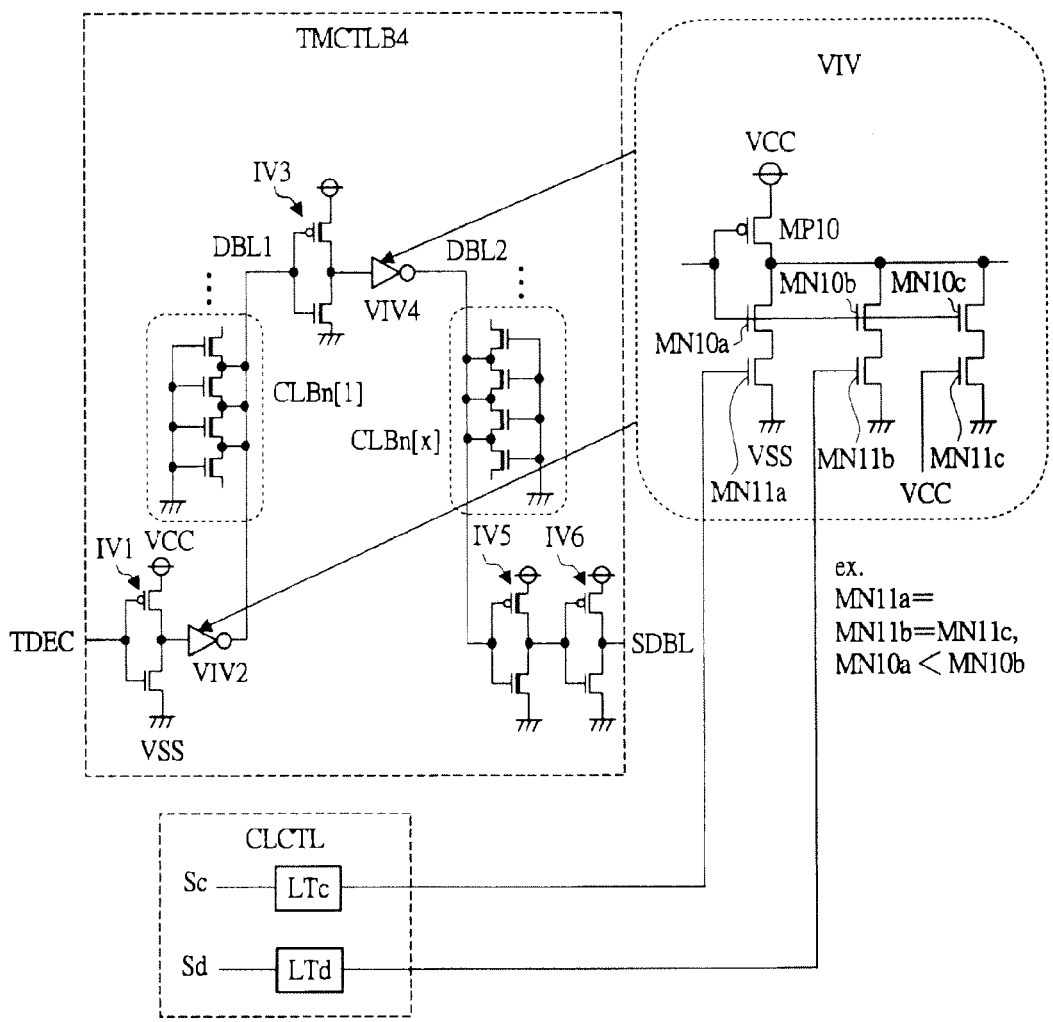
FIG. 17(a) is a circuit diagram illustrating another configuration example of a timing adjusting circuit (in the column direction) included in a semiconductor device according to Embodiment 3 of the present invention.
FIG. 17(b) is a supplementary drawing of FIG. 17(a)

FIG. 17(a) is a circuit diagram illustrating another configuration example of a timing adjusting circuit (in the column direction) included in a semiconductor device according to Embodiment 3 of the present invention, and FIG. 17(b) is a supplementary drawing of FIG. 17(a). The timing adjusting circuit TMCTLB4 illustrated in FIG. 17(a) is a modified example of the timing adjusting circuit TMCTLBn1 illustrated in FIG. 5. The timing adjusting circuit TMCTLB4 illustrated in FIG. 17(a) is different from the timing adjusting circuit TMCTLBn1 illustrated in FIG. 5 in that the inverter circuits IV2 and IV4 illustrated in FIG. 5 are changed into variable inverter circuits VIV2 and VIV4.

In the configuration of each of the variable inverter circuits VIV2 and VIV4, a pull-up PMOS transistor MP10 is coupled between the power supply voltage VCC and an output node, and pulldown NMOS transistors MN10a, MN10b, and MN10c are inserted in parallel between the output node and the ground power supply voltages VSS. The PMOS transistor MP10 and the NMOS transistors MN10a, MN10b, and MN10c are coupled to an input node in common at respective gates. Here, the NMOS transistors MN10a, MN10b, and MN10c are coupled to the ground power supply voltage VSS respectively via NMOS transistors MN11a, MN11b, and MN11c, each of which serves as a switch. Accordingly, the driving ability of the variable inverter circuit VIV can be setup suitably by turning on and off the switch concerned.

Therefore, in FIG. 17(a), a load capacitance setting circuit CLCTL including latch circuits LTc and LTd is further provided. In the present configuration, the latch circuit LTc latches a load capacitance setting signal Sc inputted separately, and controls on/off of the NMOS transistor MN11a, and the latch circuit LTd latches a load capacitance setting signal Sd inputted separately, and controls on/off of the NMOS transistor MN11b. The NMOS transistor MN11c is fixed to an on state by the power supply voltage VCC applied to the gate thereof. Here, the current driving capacity of the NMOS transistors MN11a, MN11b, and MN11c, each of which serves as a switch, is set up identically. The current driving capacity of the pulldown NMOS transistor MN10b is set to be greater than the current driving capacity of the NMOS transistor MN10a.

In this case, as illustrated in FIG. 17(b), first, when the load capacitance setting signals (Sc, Sd) are set at ('1', '0') ('1': a VCC level, '0': a VSS level), the NMOS transistor MN10a is added to the NMOS transistor MN10c as an effectual pulldown transistor. Next, when the load capacitance setting signals (Sc, Sd) are set at ('0', '0'), the effectual pulldown transistor is only the NMOS transistor MN10c. Consequently, the current driving capacity of the variable inverter circuit VIV becomes smaller than the case of the load capacitance setting signals (Sc, Sd)=('1', '0') described above (defined as the standard setup). Therefore, the start-up timing of the sense amplifier will be set up later.

Next, when the load capacitance setting signals (Sc, Sd) are set at ('0', '1'), the NMOS transistor MN10b is added to the NMOS transistor MN10c, as the effectual pulldown NMOS transistors. Consequently, the current driving capacity of the variable inverter circuit VIV becomes larger than the case of the standard setup described above. Therefore, the start-up timing of the sense amplifier will be set up a little earlier. Finally, when the load capacitance setting signal (Sc, Sd) is set at ('1', '1'), the NMOS transistors MN10a and MN10b are added to the NMOS transistor MN10c, as the effectual pulldown transistors. Consequently, the current driving capacity of the variable inverter circuit VIV becomes still larger than the case of the load capacitance setting signal (Sc, Sd)=('0', '1') described above. Therefore, The start-up timing of the sense amplifier will be set up still earlier. In the present example, the configuration of the pulldown side is made variable, assuming the case where the start-up timing of the sense amplifier is set by the shift from an 'H' level to an 'L' level of the dummy bit lines DBL1 and DBL2. However, when the shift from an 'L' level to an 'H' level is employed, it is sufficient that the configuration of the pull-up side is made variable. Naturally, the variable method of the current driving capacity is not limited to the configuration example illustrated in FIG. 17(a), but can be changed suitably.

As described above, by employing the semiconductor device according to the present embodiment 3, it is possible to realize the configuration in which the start-up timing of the sense amplifier can be adjusted by means of various kinds of variable setup. For example, it is possible to facilitate a test and to realize the trimming responding to manufacturing variations, etc., as described above. As illustrated in FIG. 12 and others, depending on the case, it becomes possible to adjust the value of load capacitance after manufacture, without adjustment of the existence or nonexistence of the contact layer CT illustrated in FIG. 7, which would be performed in the design and the manufacturing stage according to the kind of a memory unit, etc.

Embodiment 4

<<A Detailed Circuit (4) of a Timing Adjusting Circuit (in the Column Direction)>>

Figure 18:
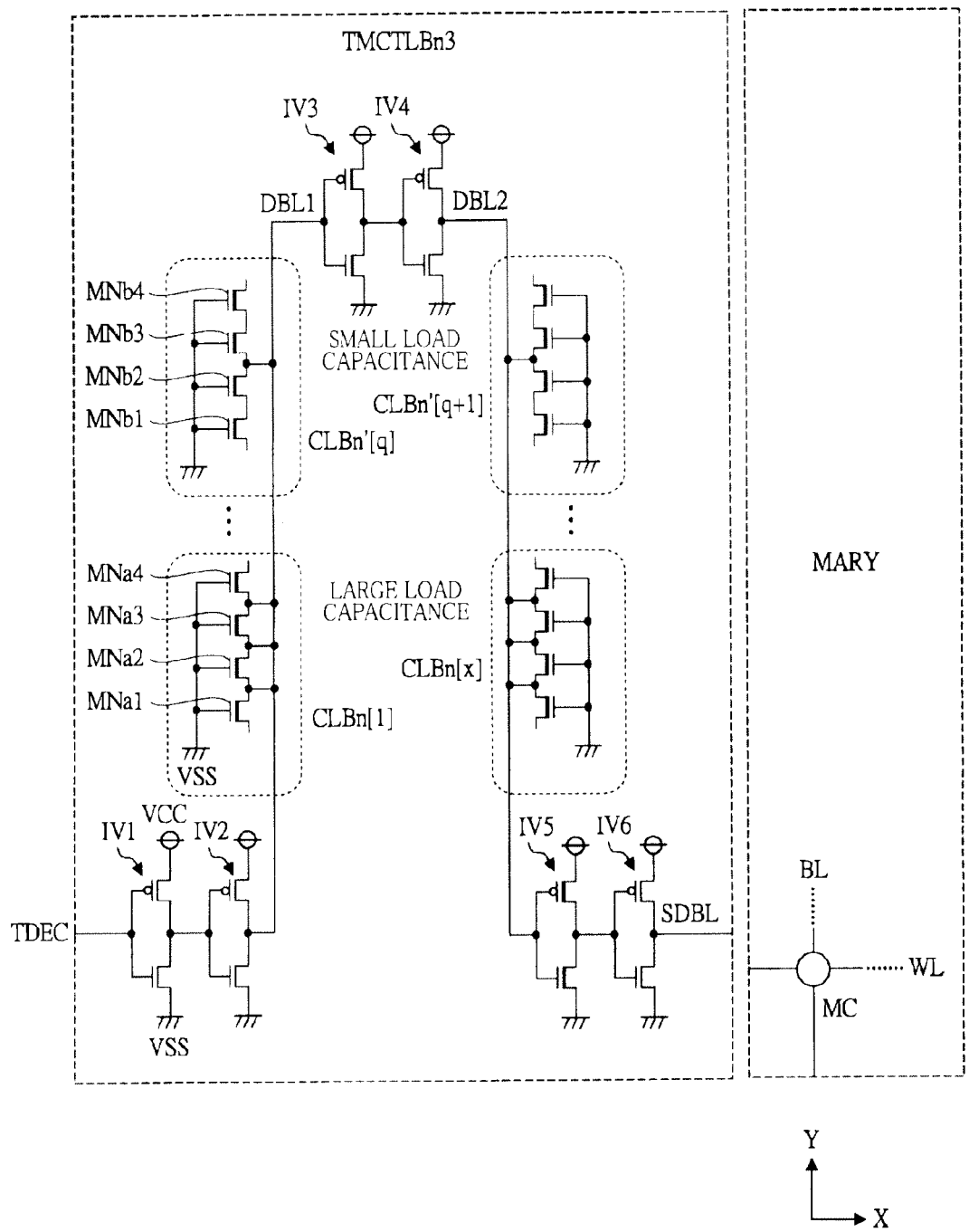
FIG. 18 is a circuit diagram illustrating a configuration example of a timing adjusting circuit (in the column direction) included in a semiconductor device according to Embodiment 4 of the present invention.

FIG. 18 is a circuit diagram illustrating a configuration example of a timing adjusting circuit (in the column direction) included in a semiconductor device according to Embodiment 4 of the present invention. The timing adjusting circuit TMCTLBn3 illustrated in FIG. 18 is a modified example of the timing adjusting circuit TMCTLBn1 illustrated in FIG. 5. FIG. 5 illustrates the circuit diagram of the timing adjusting circuit TMCTLBn1 in which the values of load capacitance by the column direction load circuits CLBn[1]-CLBn[x] are the same. However, the values of load capacitance may not be necessarily the same. For example, as illustrated in FIG. 18, it is possible to make small the value of load capacitance of the column direction load circuits CLBn' [q] and CLBn' [q+1] located in the output terminal of the dummy bit line DBL1 and the input terminal of the dummy bit line DBL2, respectively, as compared with the value of load capacitance of the column direction load circuits CLBn[1] and CLBn[x] located in the input terminal of the dummy bit line DBL1 and the output terminal of the dummy bit line DBL2, respectively.

In FIG. 18, the column direction load circuits CLBn'[q] and CLBn'[q+1] are configured with plural (here, four pieces of) NMOS transistors MNb1-MNb4 coupled in series, as is the case with the column direction load circuits CLBn[1] and CLBn[x]. However, unlike the column direction load circuits CLBn[1] and CLBn[x], only a common connecting node (a source or drain) of the NMOS transistors MNb2 and MNb3 is coupled to the corresponding dummy bit line (DBL1 or DBL2). The same effect as in the case of Embodiment 1 can be obtained by the present configuration as well.

Embodiment 5

<<Details of a Read/Write Control Circuit>>

Figure 19A:
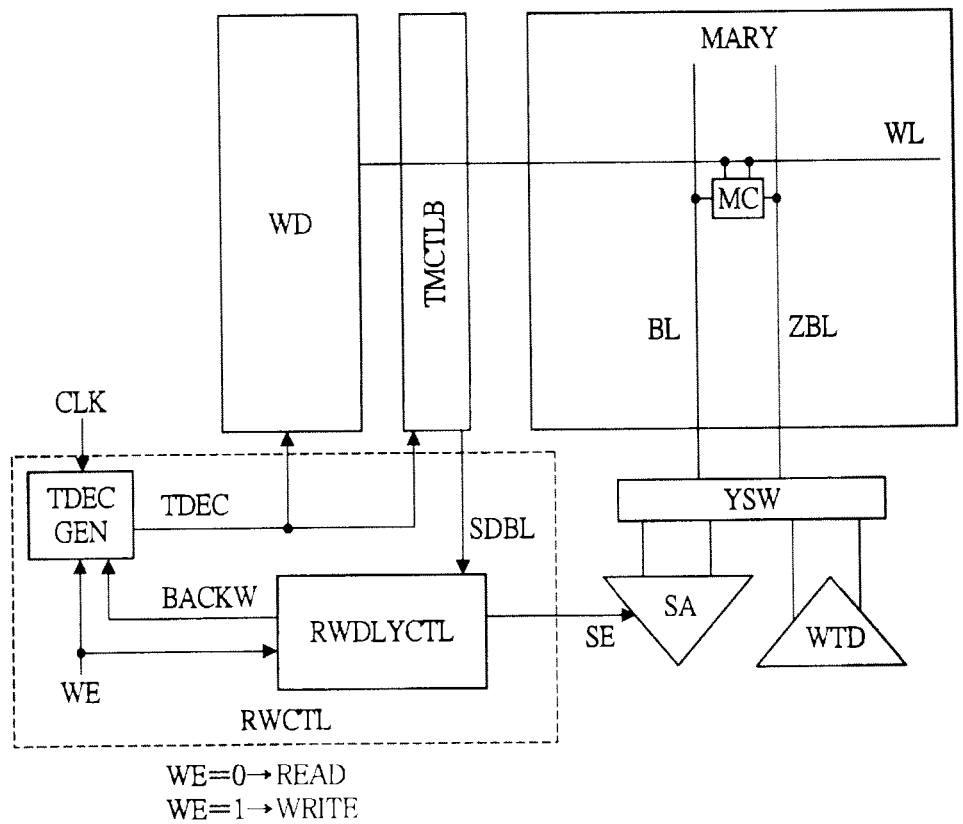
FIG. 19(a) is a block diagram illustrating a configuration example of the periphery of a read/write control circuit in the memory unit illustrated in FIG. 1 in a semiconductor device according to Embodiment 5 of the present invention.
Figure 19B:
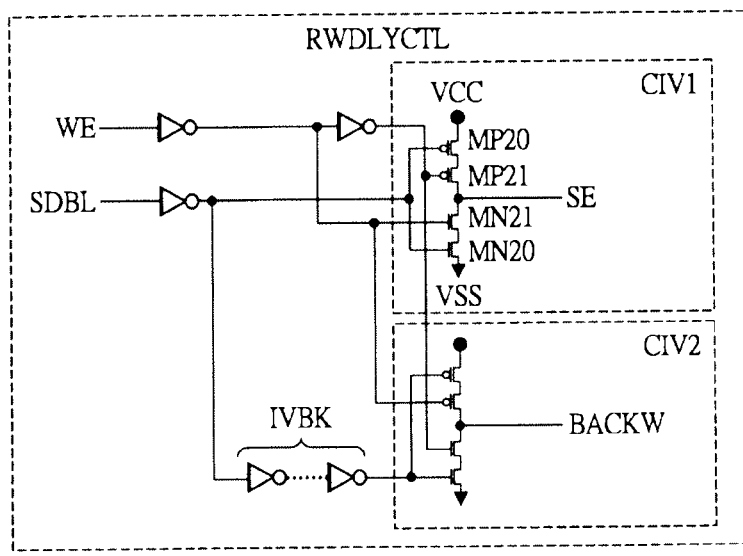
FIG. 19(b) is a circuit diagram illustrating a detailed configuration example of a read/write delay control circuit illustrated in FIG. 19(a)

FIG. 19(a) is a block diagram illustrating a configuration example of the periphery of a read/write control circuit in the memory unit illustrated in FIG. 1 in a semiconductor device according to Embodiment 5 of the present invention, and FIG. 19(b) is a circuit diagram illustrating a detailed configuration example of a read/write delay control circuit illustrated in FIG. 19(a). FIG. 20(a) is a waveform chart illustrating an example of operation at the time of read in FIG. 19, and FIG. 20(b) is a waveform chart illustrating an example of operation at the time of write in FIG. 19.

A read/write control circuit RWCTL illustrated in FIG. 19(a) is provided with a decode activation signal generating circuit TDECGEN and a read/write delay control circuit RWDLYCTL. As illustrated in FIGS. 20(a) and 20(b), the decode activation signal generating circuit TDECGEN activates a decode activation signal TDEC in response to the clock signal CLK, etc. The word line driving circuit WD activates a predetermined word line WL in response to the rising of the decode activation signal TDEC. The timing adjusting circuit TMCTLB outputs a dummy bit line signal SDBL by imparting a predetermined delay time (Tdly1) to the decode activation signal TDEC, as described above.

When a read operation (here WE='0') is specified by the internal write enable signal WE, the read/write delay control circuit RWDLYCTL activates the sense amplifier enable signal SE in response to the dummy bit line signal SDBL, as illustrated in FIG. 20(a). The sense amplifier circuit SA performs an amplifying operation in response to the sense amplifier enable signal SE activated. In this case, the transition speed (the drawing-out speed of a charge from the state precharged at an 'H' level in advance) of the proper bit-line pair (BL, ZBL) changes depending on the number of the word lines WL (the bit line length). Therefore, it becomes useful to employ the timing adjusting circuit TMCTLB described above.

When a write operation is specified by the internal write enable signal WE (here WE='1'), the read/write delay control circuit RWDLYCTL activates a write-mode word line pull-down signal BACKW in response to the dummy bit line signal SDBL after the predetermined delay time (Tdly2), as illustrated in FIG. 20(b). The decode activation signal generating circuit TDECGEN deactivates the decode activation signal TDEC, after the predetermined period set in advance, when the read operation is specified by the internal write enable signal WE, as illustrated in FIG. 20(a). The decode activation signal generating circuit TDECGEN deactivates the decode activation signal TDEC in response to the write-mode word line pull-down signal BACKW activated, when the write operation is specified by the internal write enable signal WE, as illustrated in FIG. 20(b). As illustrated in FIGS. 20(a) and 20(b), the word line driving circuit WD deactivates the predetermined word line WL in response to the falling of the decode activation signal TDEC.

As illustrated in FIG. 20(b), when writing storage information which is opposite to the present storage information in the memory cell MC, the inverting speed at the memory nodes (MEMT, MEML) in the memory cell MC changes depending on the number of the word lines WL (the bit line length). Accordingly, at the time of write, it is desirable to adjust the timing of deactivating the word line WL, corresponding to the number of the word lines WL (the bit line length). Accordingly, in the present embodiment 5, not only the start-up timing of the sense amplifier but the timing of deactivating the word line WL at the time of write is adjusted by means of the timing adjusting circuit TMCTLB described above.

The read/write delay control circuit RWDLYCTL can be realized with two control-switch-equipped inverter circuits CIV1 and CIV2 and a delay circuit block IVBK configured with plural stages of inverter circuits, for example, as illustrated in FIG. 19(b). Each of the control-switch-equipped inverter circuits CIV1 and CIV2 comprises PMOS transistors MP20 and MP21 coupled in series between the power supply voltage VCC and an output node (that is, the pull-up side), and NMOS transistors MN20 and MN21 coupled in series between the ground power supply voltage VSS and the output node (that is, the pulldown side). The PMOS transistor MP20 and the NMOS transistor MN20 form a CMOS inverter circuit, and the PMOS transistor MP21 and the NMOS transistor MN21 function as a control switch for controlling activation and deactivation of the CMOS inverter circuit concerned.

In the control-switch-equipped inverter circuit CIV1, when a read operation is specified by the internal write enable signal WE (WE='0'), the control switch is set to on, the CMOS inverter circuit inputs and inverts a dummy bit line signal SDBL (here the inverted signal thereof) and outputs a sense amplifier enable signal SE to the output node. In the inverter circuit CIV1, when a write operation is specified by the internal write enable signal WE (WE='1'), the control switch is set to off and the output node of the CMOS inverter circuit is brought to a high-impedance state. In this case, although not shown, the output node concerned is driven to the level of the ground power supply voltage VSS by a pulldown switch, etc.

On the other hand, in the control-switch-equipped inverter circuit CIV2, when a write operation is specified by the internal write enable signal WE (WE='1'), the control switch is set to on. In this case, the dummy bit line signal SDBL (here the inverted signal thereof) is inputted into the CMOS inverter circuit after the delay (Tdly2 in FIG. 20(b)) by the delay circuit block IVBK. The CMOS inverter circuit inverts the input signal concerned, and outputs a write-mode word line pull-down signal BACKW to the output node. In the control-switch-equipped inverter circuit CIV2, when a read operation is specified by the internal write enable signal WE (WE='0'), the control switch is set to off and the output node of the CMOS inverter circuit is brought to a high-impedance state. In this case, although not shown, the output node concerned is driven to the level of the ground power supply voltage VSS by a pulldown switch, etc.

As described above, by employing the semiconductor device according to the present embodiment 5, it becomes possible to optimize the operation timing at the time of write (the pull-down timing of the word line) corresponding to the number of the word lines (the bit line length).

Embodiment 6

<<A Detailed Circuit (5) of a Timing Adjusting Circuit (in the Column Direction)>>

Figure 21:
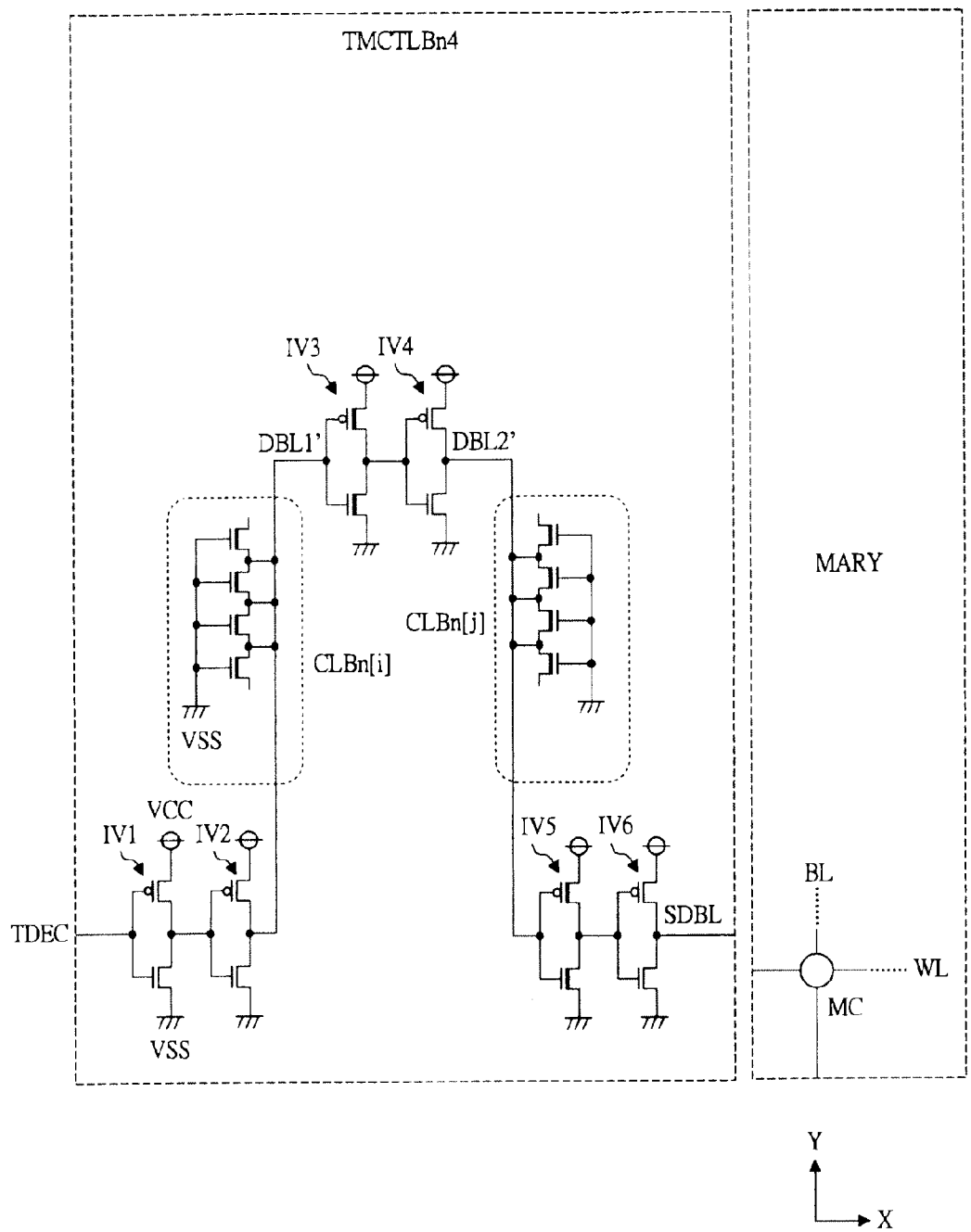
FIG. 21 is a circuit diagram illustrating a configuration example of a timing adjusting circuit (in the column direction) included in a semiconductor device according to Embodiment 6 of the present invention.

FIG. 21 is a circuit diagram illustrating a configuration example of a timing adjusting circuit (in the column direction) included in a semiconductor device according to Embodiment 6 of the present invention. The timing adjusting circuit TMCTLBn4 illustrated in FIG. 21 is a modified example of the timing adjusting circuit TMCTLBn1 illustrated in FIG. 5 described above. The timing adjusting circuit TMCTLBn4 illustrated in FIG. 21 is different from the timing adjusting circuit TMCTLBn1 illustrated in FIG. 5 in that the length of the dummy bit lines DBL1' and DBL2' is about half, and the arrangement of the inverter circuits IV3 and IV4 is also different correspondingly.

Since the timing adjusting circuit can be formed independently of the memory array MARY as described above, there arises no inconvenience on a layout even if the length of the dummy bit lines DBL1' and DBL2' is not necessarily the same as the length of the proper bit line BL of the memory array MARY. However, in order to reflect the fluctuation components of the parasitic capacitance in the proper bit line which depends on the number of the word lines (the proper bit line length) as described above, it is desirable to maintain the ratio of the length of the proper bit line to the length of the dummy bit line (2:1 in the present case). The configuration example described above is useful when applied, for example, to a dual-port SRAM, etc. That is, in the dual-port SRAM, sense amplifier circuits, etc. are ordinarily arranged in the Y direction on both sides of the sandwiched memory array MARY. In this case, for example in the timing adjusting circuit TMCTLBn4 illustrated in FIG. 21, it is sufficient that the same circuit as the circuit which is arranged in the lower half region is arranged in the upper half blank region symmetrically with respect to the X axis, and that, by using the present two systems of the circuits, a dummy bit line signal is supplied to each sense amplifier circuit, etc. of both sides.

Embodiment 7

<<A Detailed Circuit (6) of a Timing Adjusting Circuit (in the Column Direction)>>

Figure 22:
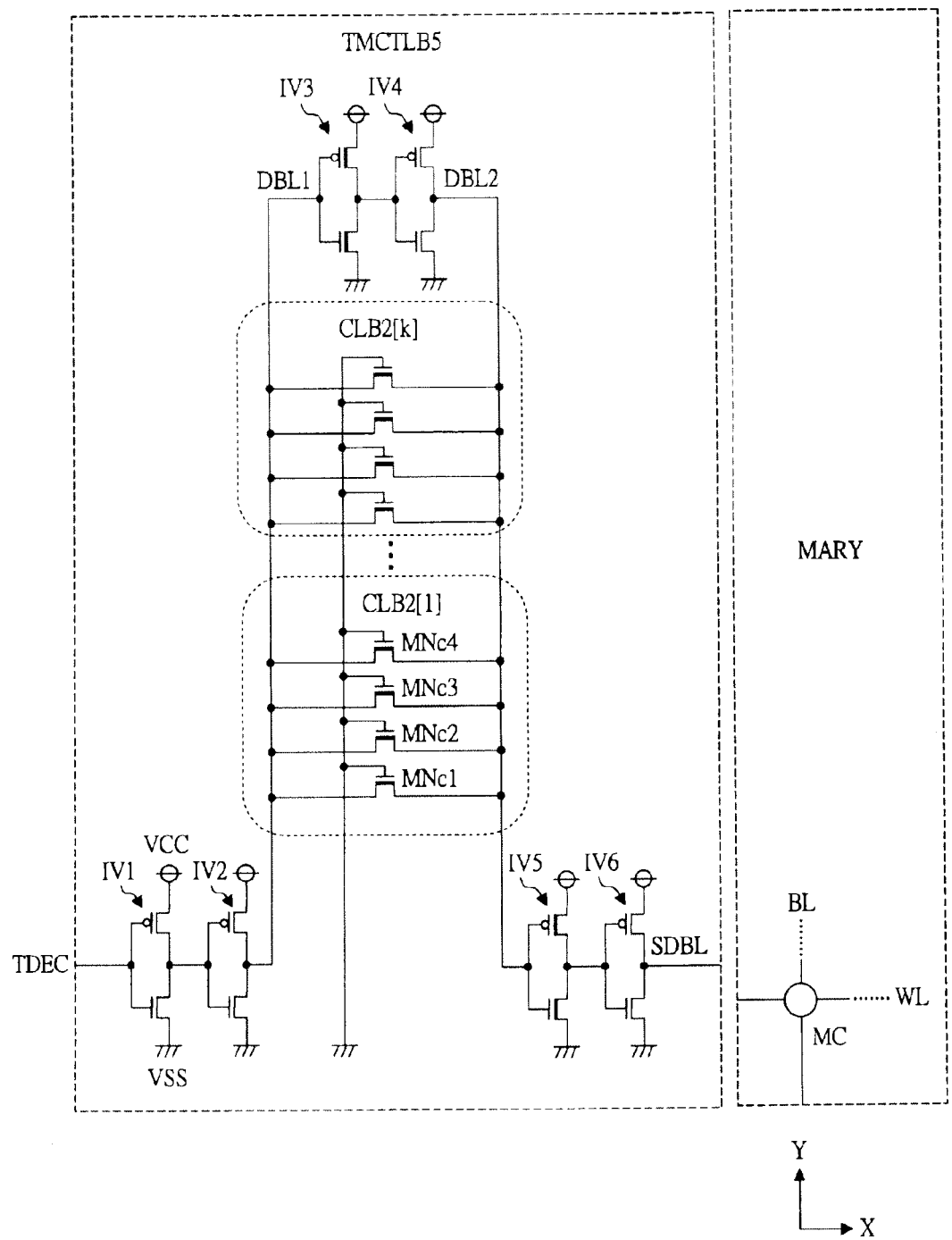
FIG. 22 is a circuit diagram illustrating a configuration example of a timing adjusting circuit (in the column direction) included in a semiconductor device according to Embodiment 7 of the present invention.

FIG. 22 is a circuit diagram illustrating a configuration example of a timing adjusting circuit (in the column direction) included in a semiconductor device according to Embodiment 7 of the present invention. The timing adjusting circuit TMCTLB5 illustrated in FIG. 22 is a modified example of the timing adjusting circuit TMCTLBn1 illustrated in FIG. 5 described above, and different from the timing adjusting circuit TMCTLBn1 illustrated in FIG. 5 in the configuration of the column direction load circuits CLB2[1]-CLB2[k]. The column direction load circuits CLB2[1]-CLB2 [k] are arranged in order in the Y direction and provided with plural (here, four pieces of) NMOS transistors MNc1-MNc4, respectively.

One end of the source/drain of the NMOS transistors MNc1-MNc4 is coupled in common to the dummy bit line DBL1, the other end of the source/drain is coupled in common to the dummy bit line DBL2, and the ground power supply voltage VSS is applied to the gate. When the present configuration example is employed, the load capacitance of the dummy bit line DBL1 by the column direction load circuit is given by the diffusion layer capacitance of one end of the source/drain in the NMOS transistors MNc1-MNc4 of the column direction load circuits CLB2 [1]-CLB2[k], and the load capacitance of the dummy bit line DBL2 by the column direction load circuit is given by the diffusion layer capacitance of the other end of the source/drain in the NMOS transistors MNc1-MNc4 of the column direction load circuits CLB2[1]-CLB2[k].

<<A Detailed Circuit (7) of a Timing Adjusting Circuit (in the Column Direction)>>

Figure 23:
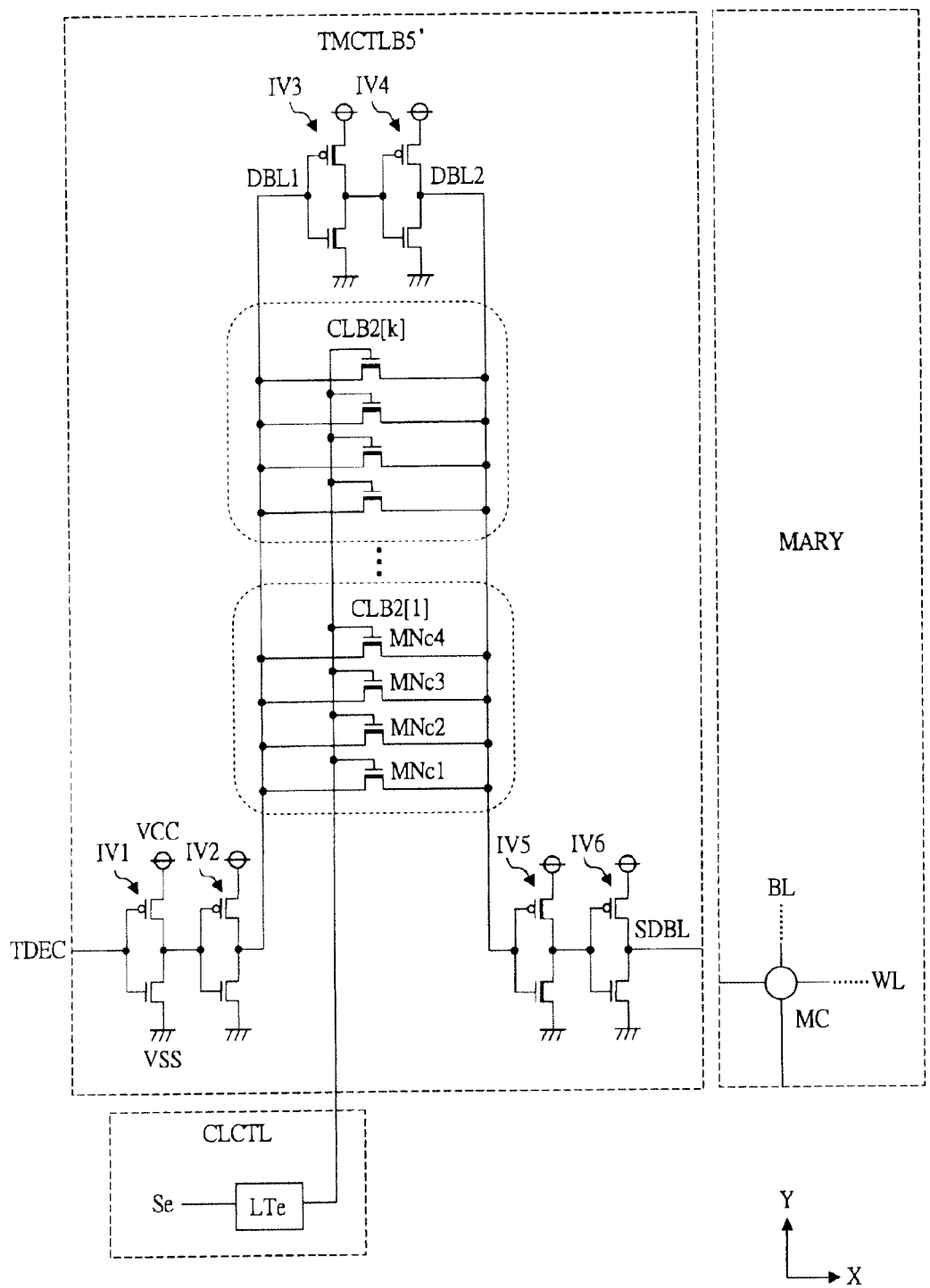
FIG. 23 is a circuit diagram illustrating a modified example of the circuit diagram illustrated in FIG. 22.

FIG. 23 is a circuit diagram illustrating a modified example of FIG. 22. The timing adjusting circuit TMCTLB5' illustrated in FIG. 23 is a configuration example which enables variable setup of the gate voltage of the NMOS transistors MNc1-MNc4 in the column direction load circuits CLB2[1]-CLB2[k] illustrated in FIG. 22. For this reason, in FIG. 23, a load capacitance setting circuit CLCTL including a latch circuit LTe is provided. As is the case with Embodiment 3 and others, the latch circuit LTe inputs a load capacitance setting signal Se and controls in common the on/off of the NMOS transistors MNc1-MNc4 in the column direction load circuits CLB2[1]-CLB2[k]. For example, when the NMOS transistors MNc1-MNc4 are set to an off state by the load capacitance setting circuit CLCTL, the same state as in FIG. 22 is obtained. On the contrary, when the NMOS transistors MNc1-MNc4 are set to an on state, a short-circuit path is formed between the dummy bit lines DBL1 and DBL2 by the NMOS transistors MNc1-MNc4 serving as switches. In this case, the start-up timing of the sense amplifier, etc. can be temporarily set earlier.

<<A Detailed Layout Configuration (2) of a Timing Adjusting Circuit (in the Column Direction)>>

Figure 24:
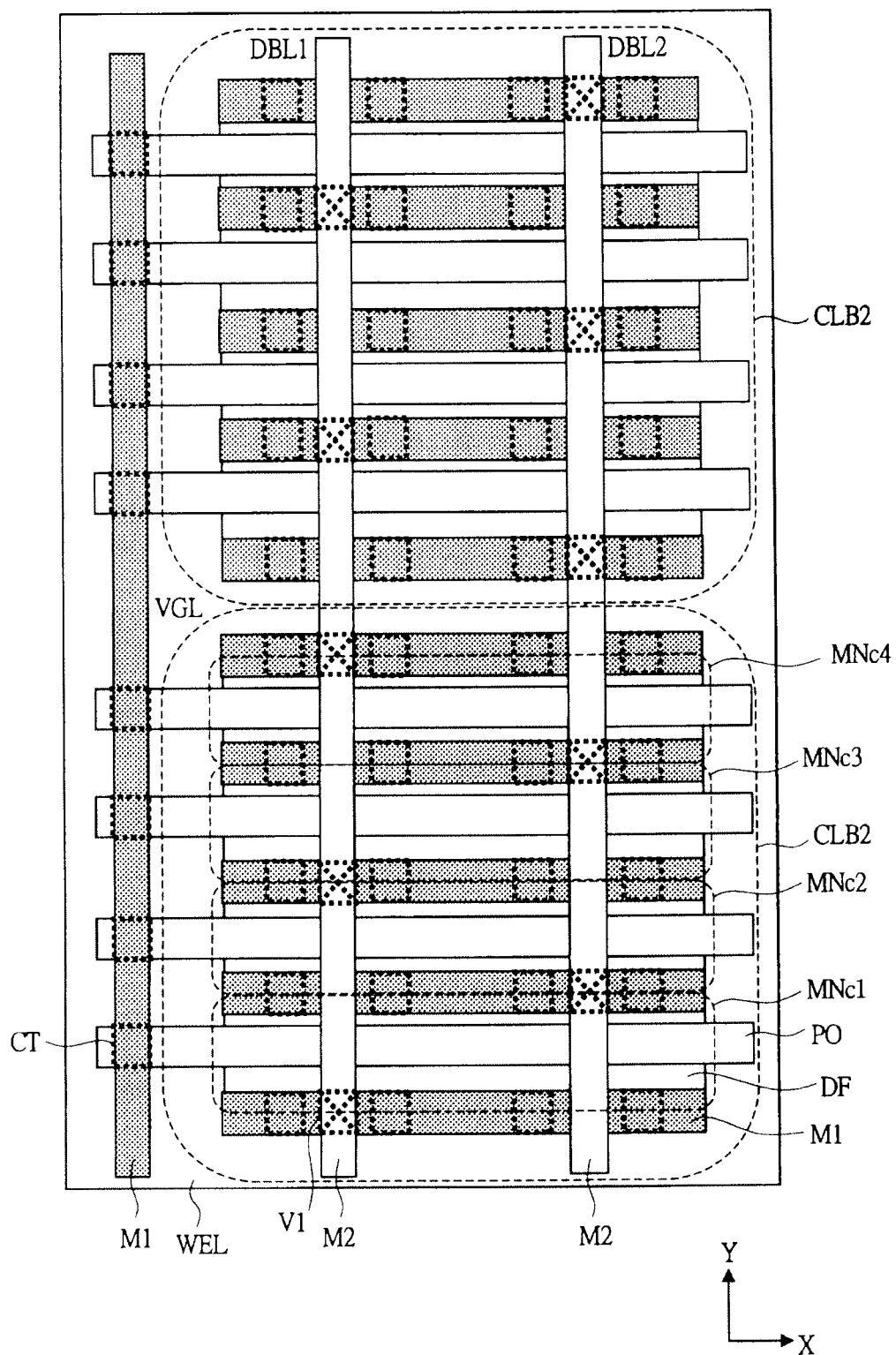
FIG. 24 is a plan view illustrating a detailed layout configuration example of a column direction load circuit of the timing adjusting circuit illustrated in FIGS. 22 and 23.

FIG. 24 is a plan view illustrating a detailed layout configuration example of a column direction load circuit of the timing adjusting circuit illustrated in FIGS. 22 and 23. As illustrated in FIG. 24, the timing adjusting circuit TMCTLB5 (or the timing adjusting circuit TMCTLB5') comprises a well WEL, a diffusion layer DF formed in the well WEL, a polysilicon layer PO formed over the well WEL via a gate insulating film, a first metal wiring layer M1 and a second metal wiring layer M2 which are sequentially formed in the upper layer, a contact layer CT, and a via layer V1. The contact layer CT establishes coupling between the first metal wiring layer M1 and the polysilicon layer PO and coupling between the first metal wiring layer M1 and the diffusion layer DF. The via layer V1 establishes coupling between the first metal wiring layer M1 and the second metal wiring layer M2.

In FIG. 24, two dummy bit lines DBL1 and DBL2 formed by the second metal wiring layer M2 extend collaterally toward the Y direction (the extension direction of the bit line). Eight gate wirings formed by the polysilicon layer PO extend collaterally toward the X direction (the extension direction of the word line). A column direction load circuit CLB2 is formed in the intersection portion of four gate wirings from the edge, out of the eight gate wirings, and the dummy bit lines DBL1 and DBL2. Another column direction load circuit CLB2 is formed also in the intersection portion of the remaining four gate wirings and the dummy bit lines DBL1 and DBL2. In each column direction load circuit, the diffusion layer DF which becomes a source or a drain is arranged on both sides of each of the four gate wirings described above. Using this, the NMOS transistors MNc1-MNc4 described above are formed in order in the Y direction. A space between a diffusion layer DF included in a certain column direction load circuit and a diffusion layer DF included in another column direction load circuit is separated by an insulating layer as is the case with FIG. 7. Unlike the configuration example illustrated in FIG. 7, in the configuration example illustrated in FIG. 24, two dummy bit lines are arranged over one MOS transistor, and two element active regions are provided corresponding to two column direction load circuits.

In each column direction load circuit, each diffusion layer DF used as the source and the drain of the NMOS transistors MNc1-MNc4 are once coupled to a wiring of the first metal wiring layer M1 arranged respectively in the upper layer of each diffusion layer DF, via the contact layer CT. In one of two column direction load circuits, the dummy bit line DBL1 is coupled to one of the source/drain of the NMOS transistor MNc1 (the side which is not shared by the NMOS transistor MNc2), the source or the drain shared by the NMOS transistors MNc2 and MNc3, and one of the source/drain of the NMOS transistor MNc4 (the side which is not shared by the NMOS transistor MNc3), via the via layer V1 and the wiring of the first metal wiring layer M1 over each diffusion layer DF described above. The dummy bit line DBL2 is coupled to the source or the drain shared by the NMOS transistors MNc1 and MNc2, and the source or the drain shared by the NMOS transistors MNc3 and MNc4, via the via layer V1 and the wiring of the first metal wiring layer M1 over each diffusion layer DF described above. Taking the column direction load circuit CLB2 [1] illustrated in FIG. 22 as an example, the present layout configuration example is equivalent to that the common connecting node of the NMOS transistors MNc2 and MNc3 is coupled to the dummy bit line DBL1, and that the common connecting node of the NMOS transistors MNc1 and MNc2 and the common connecting node of the NMOS transistors MNc3 and MNc4 are coupled to the dummy bit line DBL2, respectively.

The other of two column direction load circuits is configured such that the relation of the dummy bit lines DBL1 and DBL2 in the one of two column direction load circuits described above is interchanged. That is, the dummy bit line DBL2 is coupled to one of the source/drain of the NMOS transistor MNc1 (the side which is not shared by the NMOS transistor MNc2), the source or the drain shared by the NMOS transistors MNc2 and MNc3, and one of the source/drain of the NMOS transistor MNc4 (the side which is not shared by the NMOS transistor MNc3), via the via layer V1 and the wiring of the first metal wiring layer M1 over each diffusion layer DF described above. The dummy bit line DBL1 is coupled to the source or the drain shared by the NMOS transistors MNc1 and MNc2, and the source or the drain shared by the NMOS transistors MNc3 and MNc4, via the via layer V1 and the wiring of the first metal wiring layer M1 over each diffusion layer DF described above. The eight gate wirings formed by the polysilicon layer PO are coupled in common to a gate bias wiring VGL which is formed by the first metal wiring layer M1 and extends toward the Y direction, via the contact layer CT. Adjustment of the magnitude of load capacitance can be performed by the existence or nonexistence of the via layer V1 as is the case with FIG. 7.

When the layout configuration example illustrated in FIG. 24 is compared with the layout configuration example illustrated in FIG. 7, the layout configuration example illustrated in FIG. 24 can realize smaller area, on the premise that the diffusion layer arranged to both ends of each element active region is employed. In FIG. 7, if the diffusion layer of both ends of each element active region is employed, ten pieces of diffusion layer capacitance will be coupled to each of the dummy bit lines DBL1 and DBL2. On the other hand, in FIG. 24, five pieces of diffusion layer capacitance are coupled to each of the dummy bit lines DBL1 and DBL2, and when the area of each diffusion layer is assumed to be about two times the case of FIG. 7, the magnitude of the diffusion layer capacitance to the dummy bit lines DBL1 and DBL2 becomes similar in the case of FIG. 24 and in the case of FIG. 7. In view of the above consideration, in the case of FIG. 7, the space for separation (specifically, an insulating layer for element isolation) is necessary between the column direction load circuit formed in the lower layer of the dummy bit line DBL1 and the column direction load circuit formed in the lower layer of the dummy bit line DBL2, however, the space concerned becomes unnecessary in the case of FIG. 24, leading to realization of smaller area. On the other hand, in the case where the diffusion layer of both ends of each element active region is not employed, or in the case where the gate insulating film capacitance is not employed as the load capacitance, it is more desirable to employ the layout configuration example illustrated in FIG. 7.

As described above, by employing the semiconductor device according to the present embodiment 7, it is possible to obtain the same effect as in Embodiment 1 described above, and furthermore, it is possible to realize a small area, depending on the case. Although the NMOS transistor is employed to configure the column direction load circuit in the present example, it is also possible to employ a PMOS transistor, as a matter of course.

Embodiment 8

<<A Detailed Circuit (8) of a Timing Adjusting Circuit (in the Column Direction)>>

Figure 25:
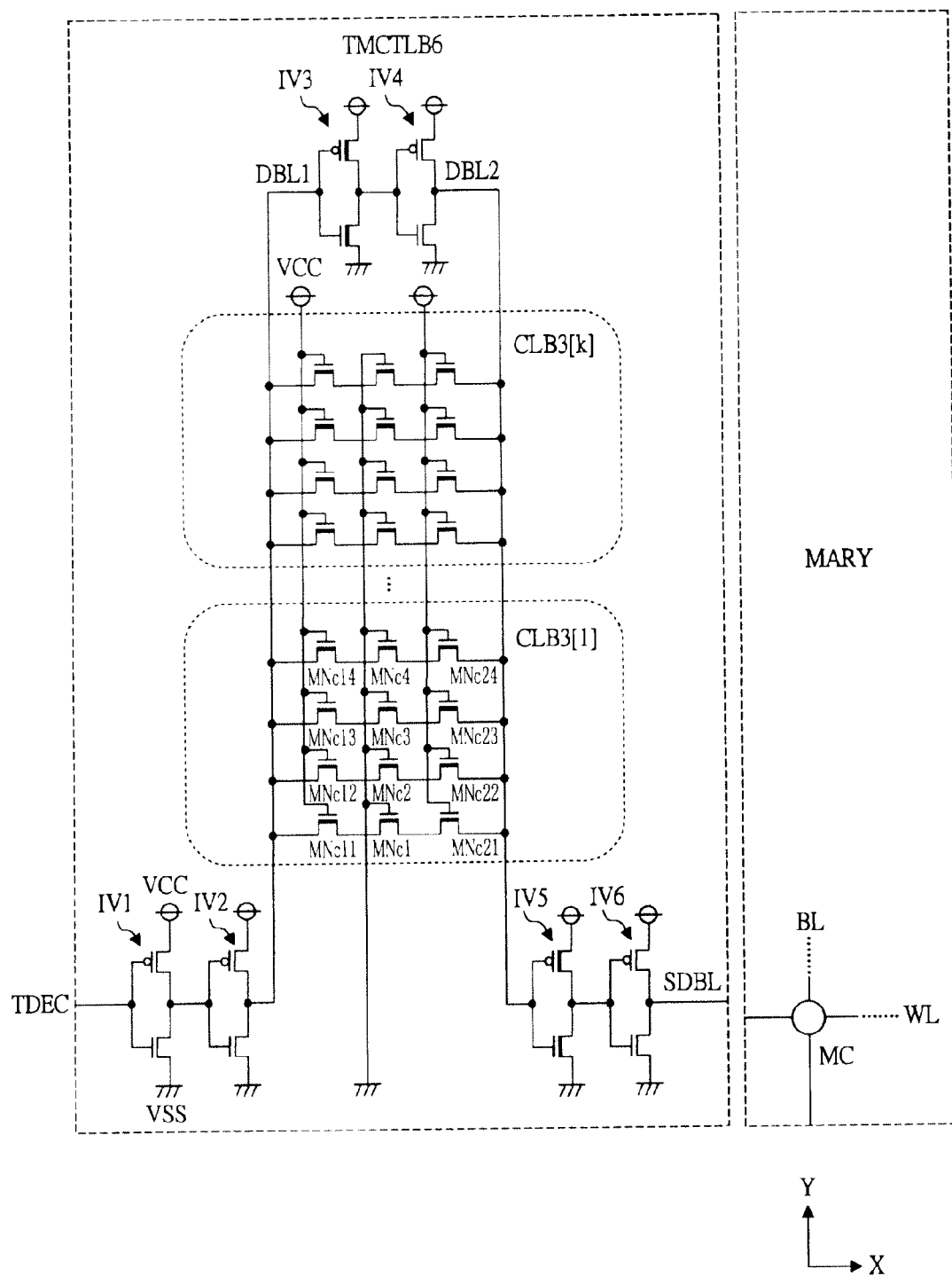
FIG. 25 is a circuit diagram illustrating a configuration example of a timing adjusting circuit (in the column direction) included in a semiconductor device according to Embodiment 8 of the present invention.

FIG. 25 is a circuit diagram illustrating a configuration example of a timing adjusting circuit (in the column direction) included in a semiconductor device according to Embodiment 8 of the present invention. The timing adjusting circuit TMCTLB6 illustrated in FIG. 25 is a modified example of the timing adjusting circuit TMCTLBn2 illustrated in FIG. 12, or the timing adjusting circuit TMCTLB5 illustrated in FIG. 22 described above, and the configuration of the column direction load circuits CLB3[1]-CLB3[k] is different, as compared with FIG. 22. The column direction load circuits CLB3[1]-CLB3[k] are arranged in order in the Y direction and each provided with plural (here, 12 pieces of) NMOS transistors MNc1-MNc4, MNc11-MNc14, and MNc21-MNc24.

In the NMOS transistors MNc11-MNc14, one of the source/drain is coupled in common to the dummy bit line DBL1, and the other of the source/drain is coupled to one of the source/drain of the NMOS transistors MNc1-MNc4, respectively. In the NMOS transistors MNc21-MNc24, one of the source/drain is coupled in common to the dummy bit line DBL2, and the other of the source/drain is coupled to the other of the source/drain of the NMOS transistors MNc1-MNc4, respectively. The power supply voltage VCC is applied in common to the gates of the NMOS transistors MNc11-MNc14 and MNc21-MNc24, and the ground power supply voltage VSS is applied in common to the gates of the NMOS transistors MNc1-MNc4.

When the present configuration example is employed, the load capacitance of the dummy bit line DBL1 by the column direction load circuit is given mainly by the combined capacitance of the gate insulating film capacitance and each diffusion layer capacitance of the source/drain of the NMOS transistors MNc11-MNc14, and the diffusion layer capacitance of one of the source/drain in the NMOS transistors MNc1-MNc4. Similarly, the load capacitance of the dummy bit line DBL2 by the column direction load circuit is given mainly by the combined capacitance of the gate insulating film capacitance and each diffusion layer capacitance of the source/drain of the NMOS transistors MNc21-MNc24, and the diffusion layer capacitance of the other of the source/drain in the NMOS transistors MNc1-MNc4.

In this way, by the configuration which can utilize the gate insulating film capacitance as the load capacitance, it is possible to provide satisfactorily for the case where a comparatively large value of load capacitance is necessary. It is also possible to suitably perform variable setup of the gate voltage of each NMOS transistor, as is the case with FIG. 23 and others. For example, when the gate voltage of the NMOS transistors MNc1-MNc4 is set at the power supply voltage VCC, a short-circuit path can be formed between the dummy bit lines DBL1 and DBL2 as is the case with FIG. 23. In another case, when the gate voltage of the NMOS transistors MNc11-MNc14, MNc21-MNc24 is set at the ground power supply voltage VSS, the load capacitance of the dummy bit lines DBL1 and DBL2 by the column direction load circuit can be given by the diffusion layer capacitance of one of the source/drain of the NMOS transistors MNc11 MNc14 and MNc21-MNc24, respectively. When the short-circuit path between the dummy bit lines DBL1 and DBL2 described above is not needed, it is possible to eliminate the NMOS transistors MNc1-MNc4 (that is, the other of the source/drain of the NMOS transistors MNc11-MNc14, MNc21-MNc24 is set to be open).

<<A Detailed Layout Configuration (3) of a Timing Adjusting Circuit (in the Column Direction)>>

Figure 26:
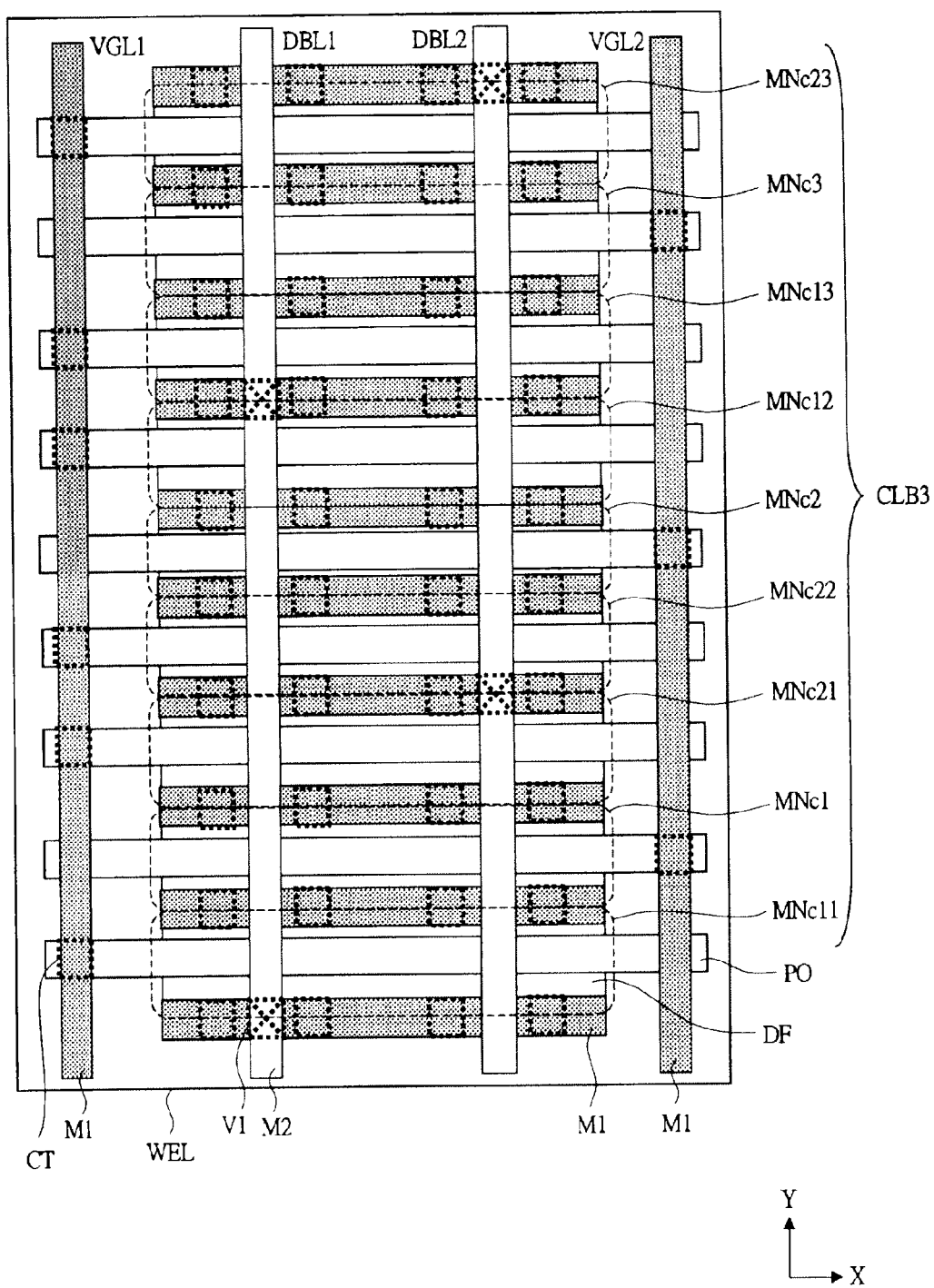
FIG. 26 is a plan view illustrating a detailed layout configuration example of a column direction load circuit of the timing adjusting circuit illustrated in FIG. 25.

FIG. 26 is a plan view illustrating a detailed layout configuration example of a column direction load circuit of the timing adjusting circuit illustrated in FIG. 25. In FIG. 26, nine NMOS transistors out of 12 NMOS transistors in the column direction load circuit illustrated in FIG. 25 are illustrated typically. As illustrated in FIG. 26, the timing adjusting circuit TMCTLB6 comprises a well WEL, a diffusion layer DF formed in the well WEL, a polysilicon layer PO formed over the well WEL via a gate insulating film, a first metal wiring layer M1 and a second metal wiring layer M2 formed sequentially in the upper layer, a contact layer CT, and a via layer V1. The contact layer CT establishes coupling between the first metal wiring layer M1 and the polysilicon layer PO and coupling between the first metal wiring layer M1 and the diffusion layer DF. The via layer V1 establishes coupling between the first metal wiring layer M1 and the second metal wiring layer M2.

In FIG. 26, two dummy bit lines DBL1 and DBL2 formed by the second metal wiring layer M2 extend collaterally toward the Y direction (the extension direction of the bit line). Nine gate wirings formed by the polysilicon layer PO extend collaterally toward the X direction (the extension direction of the word line). In intersection portions of these nine gate wirings and the dummy bit lines DBL1 and DBL2, nine NMOS transistors (MNc11, MNc1, MNc21, MNc22, MNc2, MNc12, MNc13, MNc3, and MNc23 in order in the Y direction) included in the column direction load circuit CLB3, respectively, are formed. A diffusion layer DF used as a source or a drain is arranged at both sides of each of the nine gate wirings described above. The diffusion layer DF is shared by the adjoining NMOS transistors, except one arranged at an edge (that is, except for one of the source/drain in the NMOS transistor MNc11 (and the NMOS transistor MNc14 (not shown)). A diffusion layer DF at one end of the NMOS transistor MNc23 (one end not shared by the NMOS transistor MNc3) is shared by the NMOS transistor MNc24 illustrated in FIG. 25 (the present sharing is not shown).

Each diffusion layer DF used as a source and a drain of nine NMOS transistors described above is once coupled to a wiring of the first metal wiring layer M1 arranged in the upper layer of the each diffusion layer DF, respectively via the contact layer CT. The dummy bit line DBL1 is coupled to one of the source/drain of the NMOS transistor MNc11 (the side which is not shared by the NMOS transistor MNc1) and one of the source/drain of the NMOS transistor MNc12 (the side which is shared by the NMOS transistor MNc13), via the via layer V1 and the wiring of the first metal wiring layer M1 over each diffusion layer DF described above. The dummy bit line DBL2 is coupled to one of the source/drain of the NMOS transistor MNc21 (the side which is shared by the NMOS transistor MNc22) and one of the source/drain of the NMOS transistor MNc23 (the side which is shared by the NMOS transistor MNc24 (not shown)), via the via layer V1 and the wiring of the first metal wiring layer M1 over each diffusion layer DF described above. Taking the column direction load circuit CLB3 [1] illustrated in FIG. 25 as an example, the present layout configuration example is equivalent to that the dummy bit line DBL1 is coupled to the NMOS transistor MNc11, the common connecting node of the NMOS transistors MNc12 and MNc13, and the NMOS transistor MNc14, respectively, and that the dummy bit line DBL2 is coupled to the common connecting node of the NMOS transistors MNc21 and MNc22 and the common connecting node of the NMOS transistors MNc23 and MNc24, respectively.

The nine gate wirings formed by the polysilicon layer PO are suitably coupled to two gate bias wirings VGL1 and VGL2 which are formed by the first metal wiring layer M1 and extends toward the Y direction, via the contact layer CT. The gate bias wiring VGL1 is coupled to each of the gate wirings of the NMOS transistors MNc11-MNc13 and MNc21-MNc23, via the contact layer CT. The gate bias wiring VGL2 is coupled to each of the gate wirings of the NMOS transistors MNc1-MNc3, via the contact layer CT. Adjustment of the magnitude of load capacitance can be performed by the existence or nonexistence of the via layer V1 as is the case with FIG. 7.

As described above, by employing the semiconductor device according to the present embodiment 8, it is possible to obtain the same effect as in Embodiment 2 described above. Although the NMOS transistor is employed to configure the column direction load circuit in the present example, it is also possible to employ a PMOS transistor, as a matter of course.

Embodiment 9

<<A Detailed Circuit (9) of a Timing Adjusting Circuit (in the Column Direction)>>

Figure 27:
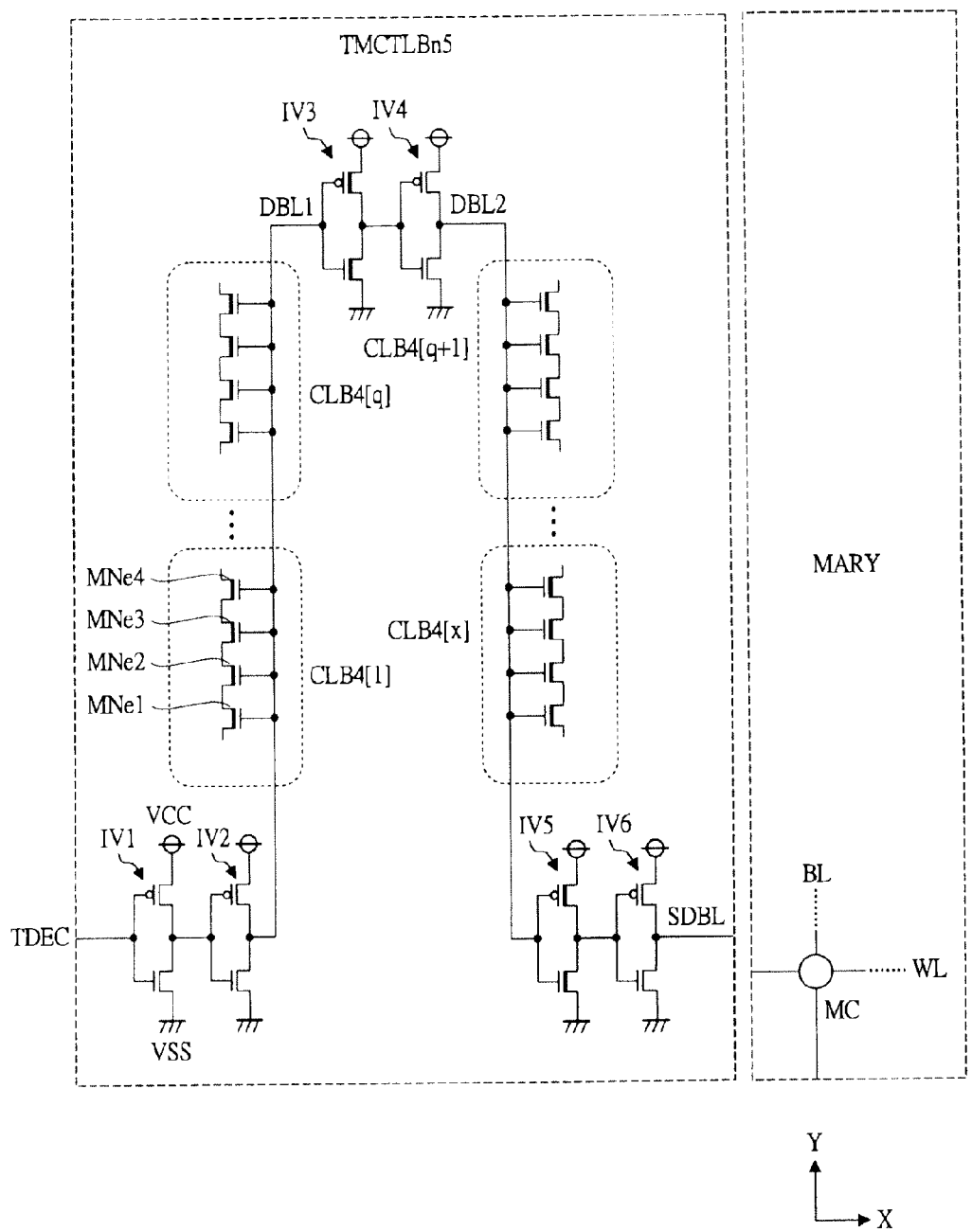
FIG. 27 is a circuit diagram illustrating a configuration example of a timing adjusting circuit (in the column direction) included in a semiconductor device according to Embodiment 9 of the present invention.

FIG. 27 is a circuit diagram illustrating a configuration example of a timing adjusting circuit (in the column direction) included in a semiconductor device according to Embodiment 9 of the present invention. The timing adjusting circuit TMCTLBn5 illustrated in FIG. 27 is a modified example of the timing adjusting circuit TMCTLBn1 illustrated in FIG. 5. The configuration example illustrated in FIG. 27 is different from the configuration example illustrated in FIG. 5 in that the column direction load circuits CLEn[1]-CLBn[x] illustrated in FIG. 5 are replaced by column direction load circuits CLB4[1]-CLB4[x] illustrated in FIG. 27.

Each of the column direction load circuits CLB4 [1]-CLB4 [x] is provided with plural (here, four pieces of) NMOS transistors MNe1-MNe4 of which the source and the drain are coupled in series. The source or the drain of the NMOS transistors MNe1 and MNe4 located at both ends of the NMOS transistors MNe1-MNe4 is open. Unlike the case of FIG. 5, the gates of the NMOS transistors MNe1-MNe4 in the column direction load circuits CLB4 [1]-CLB4 [x] are coupled in common to the corresponding dummy bit lines DBL1 and DBL2. Accordingly, the gate insulating film capacitance of the NMOS transistors MNe1-MNe4 is added to the dummy bit lines DBL1 and DBL2 as stray capacitance by each column direction load circuit.

The configuration example illustrated in FIG. 27 can be realized, for example in the layout configuration example illustrated in FIG. 7, by coupling the dummy bit lines DBL1 and DBL2 not only to the diffusion layer DF but also to each gate wiring (a polysilicon layer PO) via the via layer V1. In this case, it is possible to perform the timing adjusting by the existence or nonexistence of the via layer V1 concerned. In the configuration example of FIG. 27, both ends of the NMOS transistors MNe1-MNe4 are kept open. However, it is also possible to apply the ground power supply voltage VSS to one end, and to keep the other end open, for example.

Embodiment 10

<<A Detailed Circuit of a Timing Adjusting Circuit (in the Row Direction)>>

Figure 28:
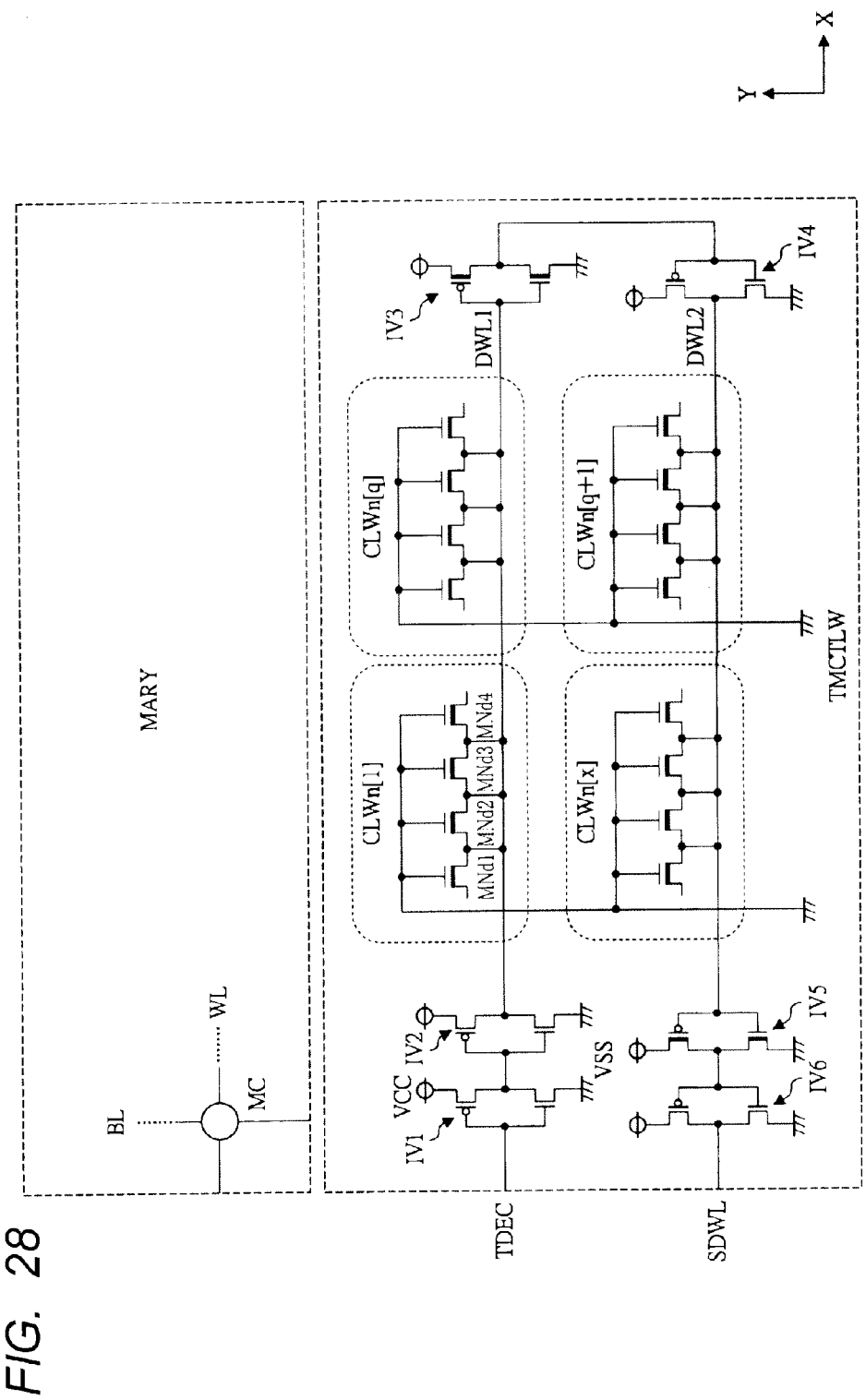
FIG. 28 is a circuit diagram illustrating a configuration example of a timing adjusting circuit (in the row direction) included in a semiconductor device according to Embodiment 10 of the present invention.

FIG. 28 is a circuit diagram illustrating a configuration example of a timing adjusting circuit (in the row direction) included in a semiconductor device according to Embodiment 10 of the present invention. In each embodiment described above, the timing adjusting circuit (in the column direction) which reflects the dependence on the column direction (the length direction of a bit line) has been explained. However, in a similar manner, it is also possible to realize a timing adjusting circuit (in the row direction) which reflects the dependence on the row direction (the length direction of a word line). The timing adjusting circuit TMCTLW illustrated in FIG. 28 is a configuration example which corresponds to the timing adjusting circuit TMCTLBn1 illustrated in FIG. 5, rotated by 90 degrees.

The timing adjusting circuit (in the row direction) TMCTLW illustrated in FIG. 28 comprises plural (here, six pieces of) inverter circuits IV1-IV6, two dummy word lines DWL1 and DWL2, and x row direction load circuits CLWn [1]-CLWn[x]. Here, the dummy word lines DWL1 and DWL2 have length substantially equal to the length of the word line WL in the memory array MARY, respectively, and they are arranged collaterally, extending in the same direction as the extension direction of the word line WL (the X direction) in the memory array MARY. The inverter circuits IV1-IV6 are CMOS inverter circuits, each configured with a PMOS transistor and an NMOS transistor, coupled between the power supply voltage VCC and the ground power supply voltage VSS.

The inverter circuits IV1 and IV2 are arranged at the input terminal of the dummy word line DWL1, respectively. The inverter circuit IV1 inputs the decode activation signal TDEC described above, and the inverter circuit IV2 inputs an output of the inverter circuit IV1 and outputs the inverted signal to the input terminal of the dummy word line DWL1. The inverter circuits IV3 and IV4 are arranged at the output terminal of the dummy word line DWL1 and the input terminal of the dummy word line DWL2, respectively. The inverter circuit IV3 inputs a signal from the output terminal of the dummy word line DWL1, and the inverter circuit IV4 inputs an output of the inverter circuit IV3 and outputs the inverted signal to the input terminal of the dummy word line DWL2. The inverter circuits IV5 and IV6 are arranged at the output terminal of the dummy word line DWL2, respectively. The inverter circuit IV5 inputs a signal from the output terminal of the dummy word line DWL2, and the inverter circuit IV6 inputs an output of the inverter circuit IV5 and outputs the dummy word line signal SDWL. In this way, the dummy word lines DWL1 and DWL2 form a both-way wiring in the region of the timing adjusting circuit (in the row direction) TMCTLW arranged close to the memory array MARY.

Each of the row direction load circuit CLWn[1]-CLWn[x] comprises plural (here, four pieces of) NMOS transistors MNd1-MNd4 of which sources and drains are coupled in series sequentially and gates are coupled in common to the ground power supply voltage VSS. In each of the row direction load circuits CLWn[1]-CLWn[q] as a part (for example, a half) of the x-piece row direction load circuits, the source and the drain of the NMOS transistors MNd2 and MNd3 are coupled to the dummy word line DWL1, and one of the source/drain of the NMOS transistors MNd1 and MNd4 (the side which is not shared by the NMOS transistors MNd2 and MNd3) is open. In each of the row direction load circuits CLWn[q+1]-CLWn[x] as the other part (for example, the other half) of the x-piece row direction load circuits, the source and the drain of the NMOS transistors MNd2 and MNd3 are coupled to the dummy bit line DBL2, and one of the source/drain of the NMOS transistors MNd1 and MNd4 (the side which is not shared by the NMOS transistors MNd2 and MNd3) is open.

In the configuration example illustrated in FIG. 28, as is the case with FIG. 5, it is possible to add the diffusion layer capacitance of the source and the drain of the NMOS transistors MNd2 and MNd3 to the dummy word lines DWL1 and DWL2 by the row direction load circuit. Accordingly, it is possible to set up suitably a delay time after the decode activation signal TDEC changes until the dummy word line signal SDWL changes. In this case, the number of bit lines BL (the length of the word line WL) in the memory array MARY may change corresponding to the kind of the memory unit, etc. Accordingly, the rise time of the word line WL will change with the parasitic capacitance, etc. of the word line WL. Therefore, the time to be spent for read and write may also change correspondingly. Accordingly, when the configuration example illustrated in FIG. 28 is employed, as is the case with FIG. 5, the length of the dummy word line changes following the length of the word line WL, and hence, it becomes possible to generate the operation timing (the dummy word line signal SDWL) which reflects the influence of the parasitic capacitance of the word line, etc. The configuration example illustrated in FIG. 28 is employed in conjunction with the configuration example illustrated in FIG. 5 and others for example, and it is implemented such that the dummy word line signal SDWL is inputted instead of the decode activation signal TDEC to the timing adjusting circuit TMCTLBn1 illustrated in FIG. 5.

<<A Detailed Layout Configuration of a Timing Adjusting Circuit (in the Row Direction)>>

Figure 29:
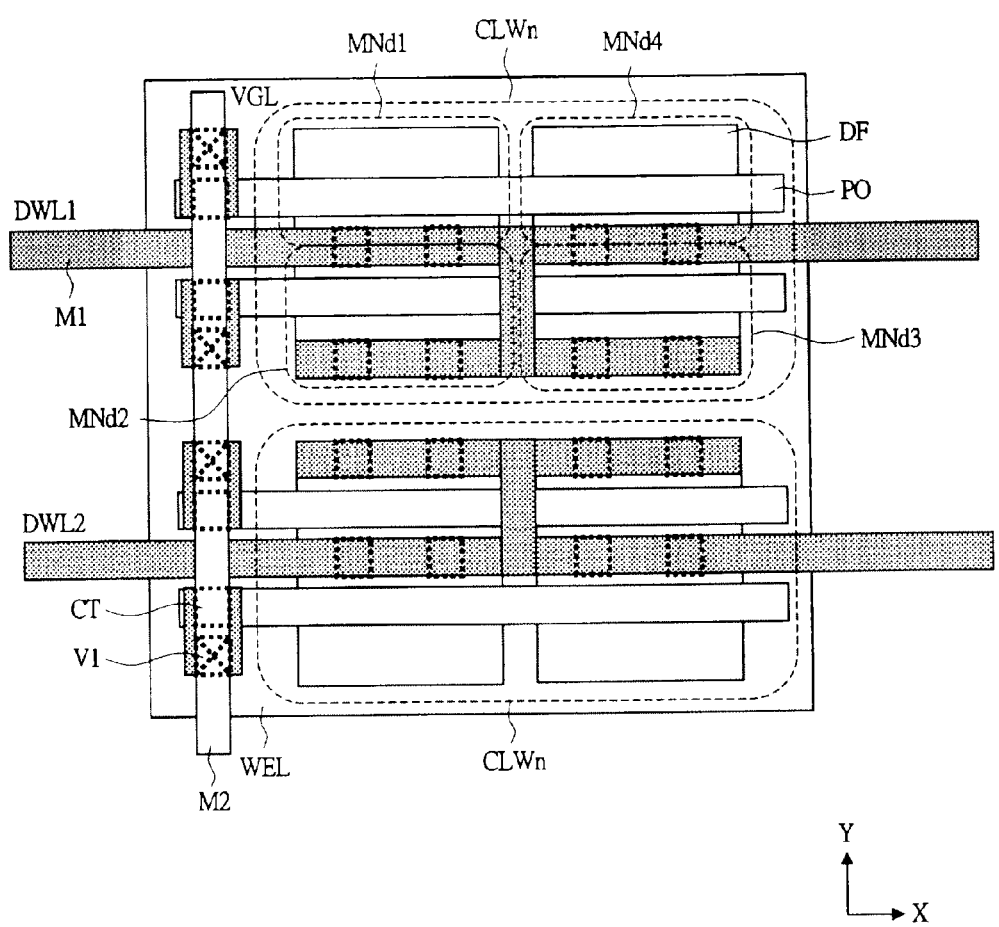
FIG. 29 is a plan view illustrating a detailed layout configuration example of a row direction load circuit of the timing adjusting circuit illustrated in FIG. 28.

FIG. 29 is a plan view illustrating a detailed layout configuration example of a row direction load circuit of the timing adjusting circuit illustrated in FIG. 28. As illustrated in FIG. 29, the timing adjusting circuit (in the row direction) TMCTLW comprises a well WEL, a diffusion layer DF formed in the well WEL, a polysilicon layer PO formed over the well WEL with an intervening gate insulating film, a first metal wiring layer M1 and a second metal wiring layer M2 formed sequentially in the upper layer, a contact layer CT, and a via layer V1. The contact layer CT establishes coupling between the first metal wiring layer M1 and the polysilicon layer PO and coupling between the first metal wiring layer M1 and the diffusion layer DF. The via layer V1 establishes coupling between the first metal wiring layer M1 and the second metal wiring layer M2.

In FIG. 29, two dummy word lines DWL1 and DWL2 formed by the first metal wiring layer M1 extend collaterally toward the X direction (the extension direction of the word line). On both sides of the dummy word line DWL1, two gate wirings formed by the polysilicon layer PO extend collaterally toward the X direction, and on both sides of the dummy word line DWL2, two gate wirings formed by the polysilicon layer PO extend also collaterally toward the X direction. An element active region which forms the NMOS transistors MNd1 and MNd2 is arranged in the lower layer of the dummy word line DWL1, and adjoining this in the X direction, an element active region which forms the NMOS transistors MNd3 and MNd4 is arranged. The gate of the NMOS transistors MNd1 and MNd4 is configured with one of two gate wirings located on both sides of the dummy word line DWL1. The gate of the NMOS transistors MNd2 and MNd3 in configured with the other of the two gate wirings concerned.

In the element active region which forms the NMOS transistors MNd1 and MNd2, diffusion layers DF used as a source or a drain are arranged on both sides of two gate wirings corresponding to the gate of the NMOS transistors MNd1 and MNd2. Among these diffusion layers, a diffusion layer DF arranged between two gate wirings is shared by the NMOS transistors MNd1 and MNd2. Similarly, in the element active region which forms the NMOS transistors MNd3 and MNd4, diffusion layers DF used as a source or a drain are arranged on both sides of two gate wirings corresponding to the gate of NMOS transistors MNd3 and MNd4. Among these diffusion layers, a diffusion layer DF arranged between two gate wirings is shared by the NMOS transistors MNd3 and MNd4. The dummy word line DWL1 is coupled to the shared diffusion layer of the NMOS transistors MNd1 and MNd2 and to the shared diffusion layer of the NMOS transistors MNd3 and MNd4, via the contact layer CT, respectively. Over each diffusion layer DF on a different side from the shared diffusion layer in the NMOS transistors MNd2 and MNd3, a wiring of the first metal wiring layer M1 extended in the X direction is formed, and each of the diffusion layers is coupled to the wiring of the first metal wiring layer M1 via the contact layer CT, respectively. The wiring of the first metal wiring layer M1 is further coupled to the dummy word line DWL1 via a wiring of the first metal wiring layer M1 which extends in the Y direction.

The lower layer portion of the dummy word line DWL2 has the same configuration as the lower layer portion of the dummy word line DWL1 described above. The element active region, etc. described above are formed suitably, and the NMOS transistors MNd1-MNd4 are formed and coupled suitably to the dummy word line DWL2. A total of four gate wirings (the polysilicon layer PO) arranged at both sides of the dummy word lines DWL1 and DWL2 described above are once coupled to the wiring of the first metal wiring layer M1 provided corresponding to the respective gate wiring via the contact layer CT. From there, the four gate wirings are coupled in common further to the gate bias wiring VGL extending in the Y direction via the via layer V1. The gate bias wiring VGL is formed of the second metal wiring layer M2. In the layout concerned, it is possible to perform the control of the magnitude of the load capacitance by the existence or nonexistence of the contact layer CT in each diffusion layer DF of the NMOS transistors MNd1-MNd4. Taking the row direction load circuit CLWn[1] illustrated in FIG. 28 as an example, the present layout configuration example is equivalent to that one of the source/drain of the NMOS transistor MNd2 and one of the source/drain of the NMOS transistor MNd3 are formed by different diffusion layers, and they are coupled to the wiring of the first metal wiring layer branching from the dummy word line DWL1 individually.

As described above, by employing the semiconductor device according to the present embodiment 10, it becomes possible to generate the optimal operation timing depending on the number of the bit lines (the length of the word line). Of course, it is possible to realize the configuration example illustrated in FIG. 28 by the same layout configuration example as illustrated in FIG. 7. However, in FIG. 29, the layout configuration example is employed in which the dummy word line and the gate wiring extend both in the X direction from a viewpoint of reflecting the dependence on the X direction. The configuration example of FIG. 28 can be modified suitably as in the various embodiments on the column direction load circuit described above, and as described in Embodiment 5, it can also be utilized when setting the timing for deactivating the word line in write.

Embodiment 11

<<Arrangement (1) of a Timing Adjusting Circuit (in the Column Direction)>>

Figure 30A:
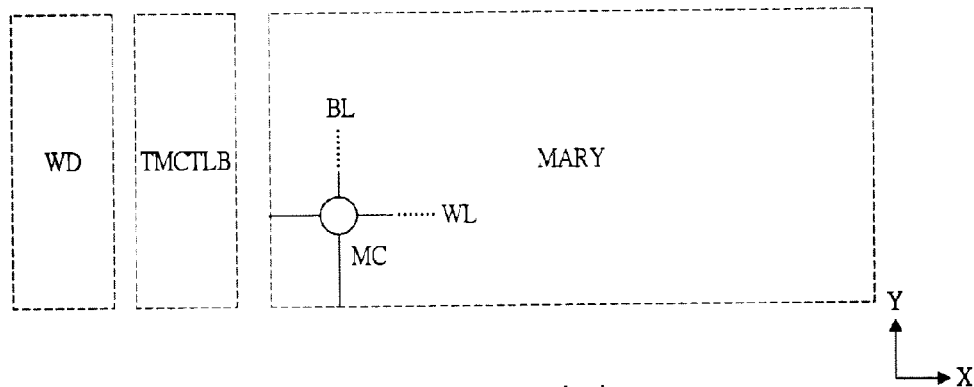
FIGS. 30(a), 30(b), and 30(c) are schematic diagrams illustrating examples of respectively different arrangement of a timing adjusting circuit (in the column direction) of a memory unit, in a semiconductor device according to Embodiment 11 of the present invention.
Figure 30B:
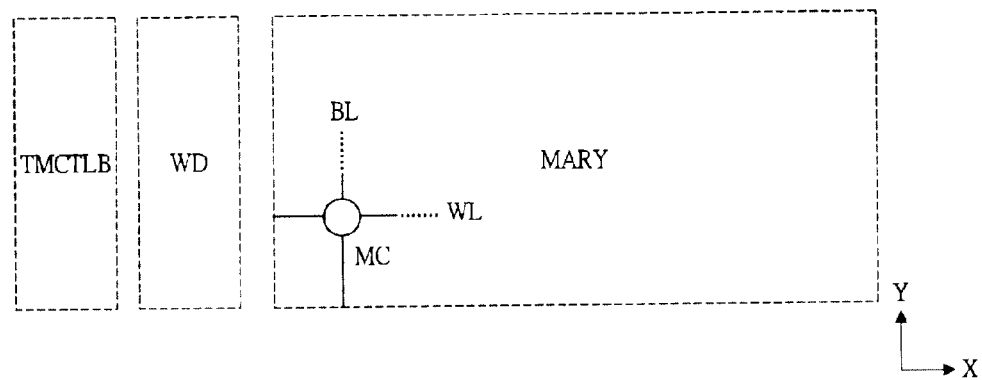
Figure 30C:
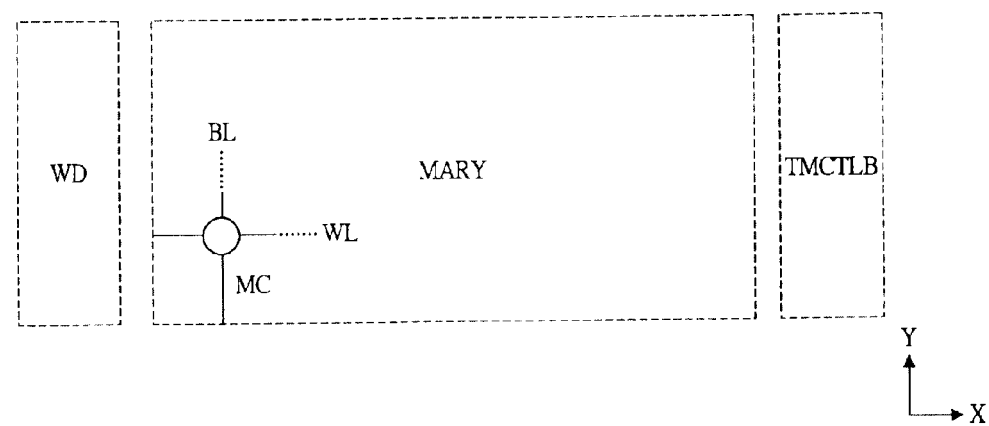

FIGS. 30(a), 30(b), and 30(c) are schematic diagrams illustrating examples of respectively different arrangement of a timing adjusting circuit (in the column direction) of a memory unit in a semiconductor device according to Embodiment 11 of the present invention. In FIG. 30(a), the word line driving circuit WD, the timing adjusting circuit TMCTLB, and the memory array MARY are arranged in order in the X direction (the extension direction of the word line WL). In FIG. 30(b), the timing adjusting circuit TMCTLB, the word line driving circuit WD, and the memory array MARY are arranged in order in the X direction. In FIG. 30(c), the word line driving circuit WD, the memory array MARY, and the timing adjusting circuit TMCTLB are arranged in order in the X direction.

Figure 31A:
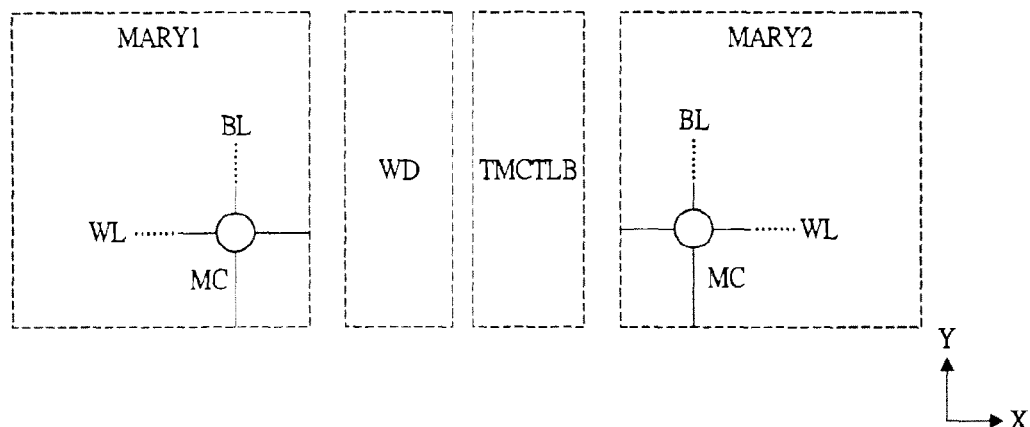
FIGS. 31(a), 31(b), and 31(c) are schematic diagrams illustrating examples of respectively different arrangement of a timing adjusting circuit (in the column direction) of a memory unit which is different from one illustrated in FIGS. 30(a), 30(b), and 30(c)
Figure 31B:
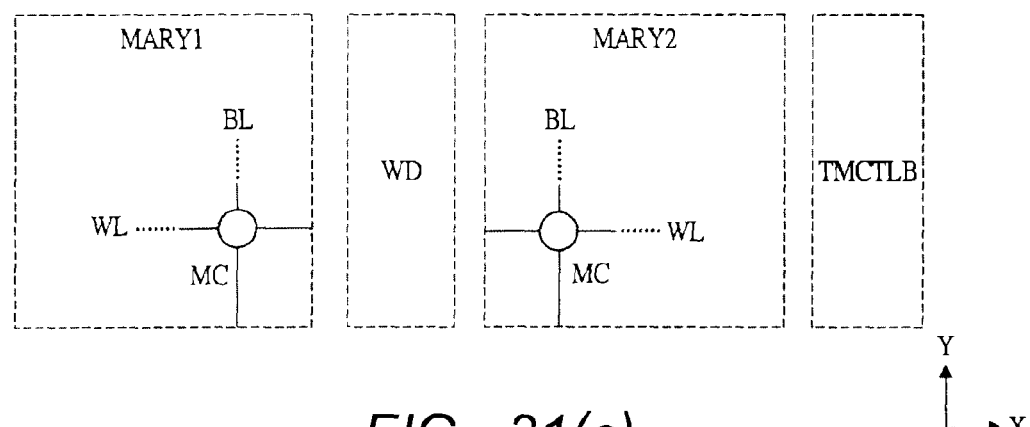
Figure 31C:
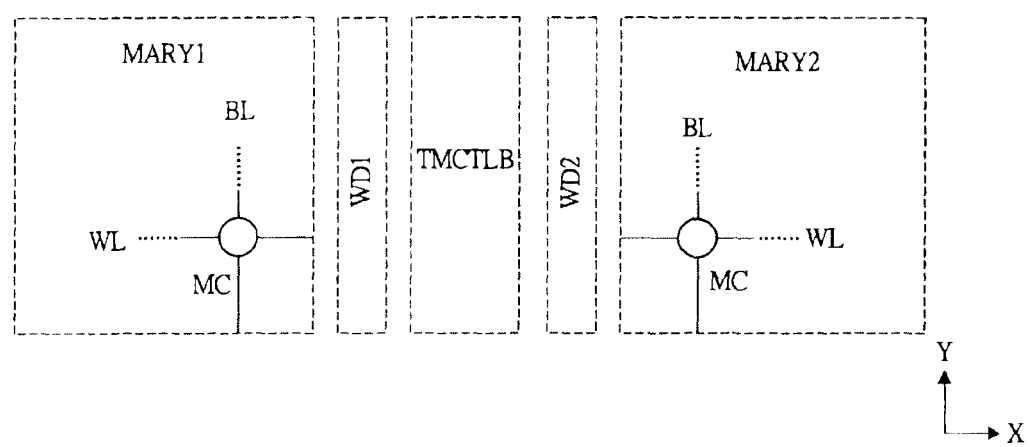

FIGS. 31(a), 31(b), and 31(c) are schematic diagrams illustrating examples of respectively different arrangement of a timing adjusting circuit (in the column direction) of a memory unit which is different from one illustrated in FIGS. 30(a), 30(b), and 30(c). Unlike in FIGS. 30(a)-30(c), in FIGS. 31(a)-31(c), plural (here, two pieces of) memory arrays MARY1 and MARY2 are provided. In FIG. 31(a), a first memory array MARY1, the word line driving circuit WD, the timing adjusting circuit TMCTLB, and a second memory array MARY2 are arranged in order in the X direction (the extension direction of the word line WL). The word lines WL of the memory array MARY1 and the memory array MARY2 are driven by the word line driving circuit WD arranged in-between. In FIG. 31(b), the first memory array MARY1, the word line driving circuit WD, the second memory array MARY2, and the timing adjusting circuit TMCTLB are arranged in order in the X direction. In FIG. 31(c), the first memory array MARY1, a first word line driving circuit WD1, the timing adjusting circuit TMCTLB, a second word line driving circuit WD2, and the second memory array MARY2 are arranged in order in the X direction. The word line WL of the first memory array MARY1 is driven by the first word line driving circuit WD1, and the word line WL of the second memory array MARY2 is driven by the second word line driving circuit WD2.

Figure 32A:
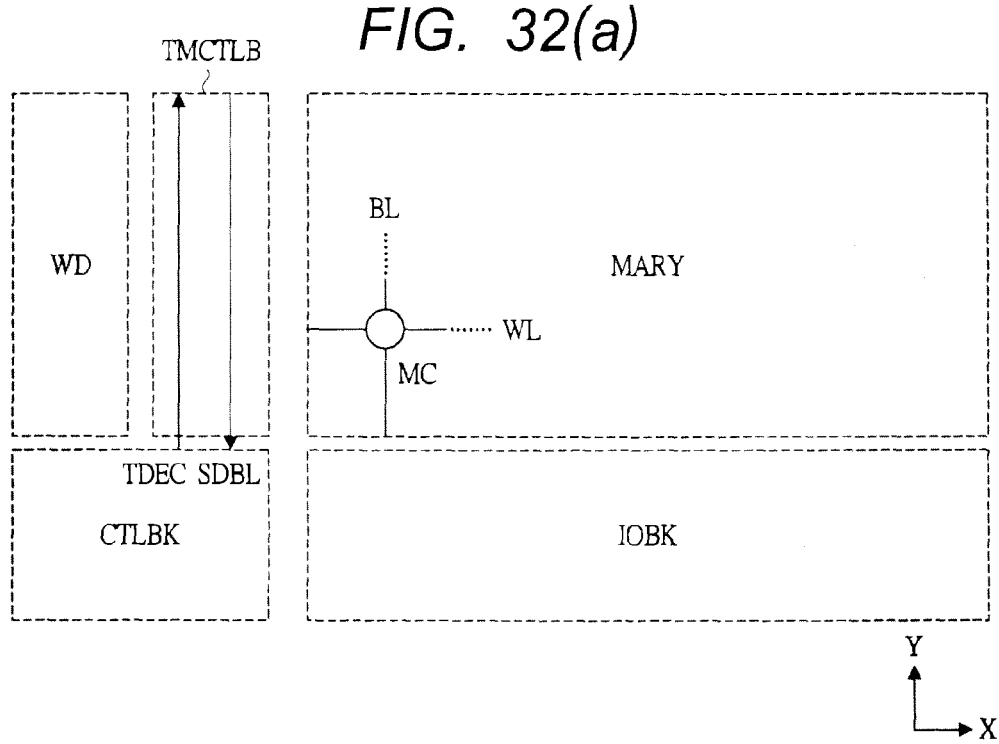
FIGS. 32(a) and 32(b) are explanatory diagrams illustrating the flow of a signal, respectively, in a case where the word line driving circuit and the timing adjusting circuit are arranged on one side of the memory array, and in a case where they are separately arranged on both sides of the memory array, in the timing adjusting circuit (in the column direction) illustrated in FIGS. 30 and 31.
Figure 32B:
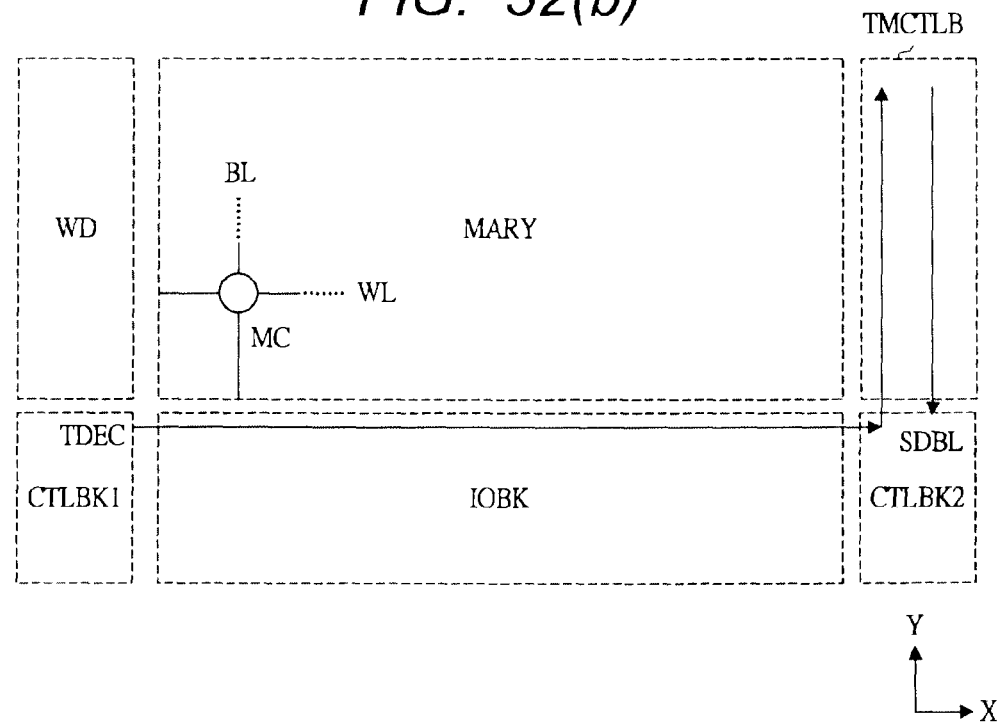

The timing adjusting circuit TMCTLB according to the present embodiment is formed using the layout rule of a logic instead of a memory cell, as described above. Therefore, as illustrated in FIGS. 30(b) and 31(c), for example, it is not necessary for the timing adjusting circuit TMCTLB to be arranged adjoining the memory array. In FIG. 31(c), the symmetry of circuit arrangement is obtained by dividing the word line driving circuit WD into two pieces. However, it is likely that the circuit area may increase by the division of the word line driving circuit WD. The difference in an effect as illustrated in FIGS. 32(a) and 32(b), for example, is produced in a case where the word line driving circuit WD and the timing adjusting circuit TMCTLB are arranged closely to the one side of the memory array, as illustrated in FIGS. 30(a), 30(b), and 31(a), and in a case where the word line driving circuit WD and the timing adjusting circuit TMCTLB are arranged separately on both sides of the memory array, as illustrated in FIGS. 30(c) and 31(b). FIGS. 32(a) and 32(b) are explanatory diagrams illustrating the flow of a signal, respectively, in a case where the word line driving circuit and the timing adjusting circuit are arranged on one side of the memory array, and in a case where they are separately arranged on both sides of the memory array, in the arrangement of the timing adjusting circuit (in the column direction) illustrated in FIGS. 30(a)-30(c) and FIGS. 31(a)-31(c).

First, FIG. 32(a) illustrates the example of an arrangement configuration of the entire memory unit in a case where the word line driving circuit WD and the timing adjusting circuit TMCTLB are arranged on one side of the memory array MARY. In this case, the input/output circuit block IOBK including a sense amplifier circuit, etc. for example, is arranged adjoining the memory array MARY in the Y direction, and the control circuit block CTLBK is arranged in the position which adjoins the word line driving circuit WD and the timing adjusting circuit TMCTLB in the Y direction, and which adjoins the input/output circuit block IOBK in the X direction. The control circuit block CTLBK outputs the decode activation signal TDEC to the timing adjusting circuit TMCTLB, and receives the dummy bit line signal SDBL from the timing adjusting circuit TMCTLB. The control circuit block CTLBK generates a sense amplifier enable signal based on the dummy bit line signal SDBL, and outputs it to the input/output circuit block IOBK. In this way, since the signal flow is simple in the case of FIG. 32(a), it becomes possible to reduce timing variations accompanying the signal path.

Next, FIG. 32(b) illustrates the example of an arrangement configuration of the entire memory unit in a case where the word line driving circuit WD and the timing adjusting circuit TMCTLB are arranged separately on both sides of the memory array MARY. In this case, the input/output circuit block IOBK is arranged adjoining the memory array MARY in the Y direction, for example, and the first control circuit block CTLBK1 is arranged in the position which adjoins the input/output circuit block IOBK in the X direction and which adjoins the word line driving circuit WD in the Y direction. The second control circuit block CTLBK2 is arranged in the position which adjoins the timing adjusting circuit TMCTLB in the Y direction. The first control circuit block CTLBK1 outputs the decode activation signal TDEC to the second control circuit block CTLBK2. The second control circuit block CTLBK2 outputs the decode activation signal TDEC to the timing adjusting circuit TMCTLB, and receives the dummy bit line signal SDBL from the timing adjusting circuit TMCTLB. The second control circuit block CTLBK2 generates a sense amplifier enable signal based on the dummy bit line signal SDBL, and outputs it to the input/output circuit block IOBK.

In this way, in the case of FIG. 32(b). operation is performed to transmit the decode activation signal TDEC from the first control circuit block CTLBK1 to the second control circuit block CTLBK2. Therefore, the wiring delay in the length direction of the word line WL can be reflected to some extent in the transmission process. Accordingly, it becomes possible to generate the start-up timing of the sense amplifier, reflecting not only the dependence on the length direction of the bit line but the dependence on the length direction of the word line. When a timing adjusting circuit (in the row direction) just like the one described in Embodiment 10 is provided on the transmission path from the first control circuit block CTLBK1 to the second control circuit block CTLBK2, a still more useful effect will be obtained. Ordinarily, comparatively broad free space may be securable on the side where the word line driving circuit WD is not arranged in the memory array MARY, associated with processing of the terminal part of a word line, etc. In the arrangement illustrated in FIG. 32(b), such free space can be used effectively, accordingly, the area efficiency may be improved.

Embodiment 12

<<Arrangement (2) of a Timing Adjusting Circuit (in the Column Direction)>>

Figure 33A:
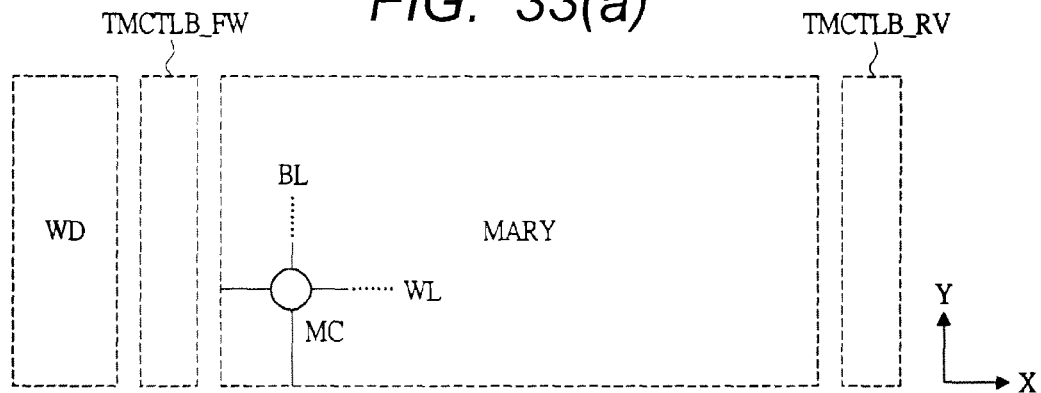
FIGS. 33(a), 33(b), and 33(c) are schematic diagrams illustrating examples of respectively different arrangement of a timing adjusting circuit (in the column direction) of a memory unit in a semiconductor device according to Embodiment 12 of the present invention.
Figure 33B:
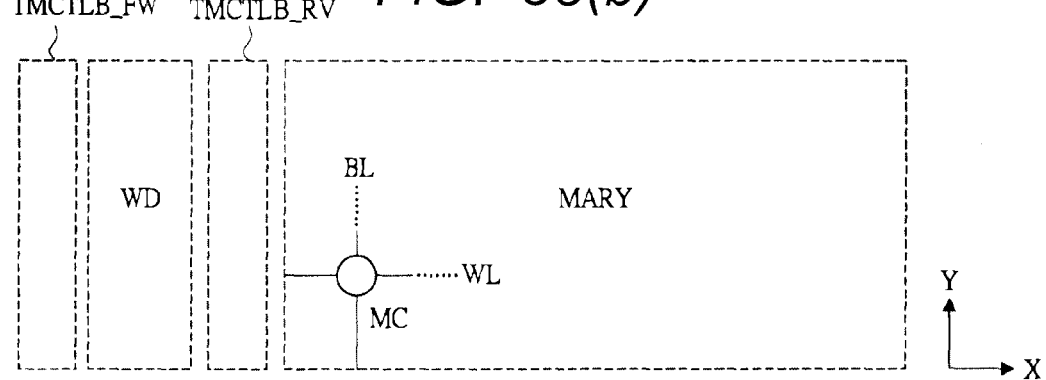
Figure 33C:
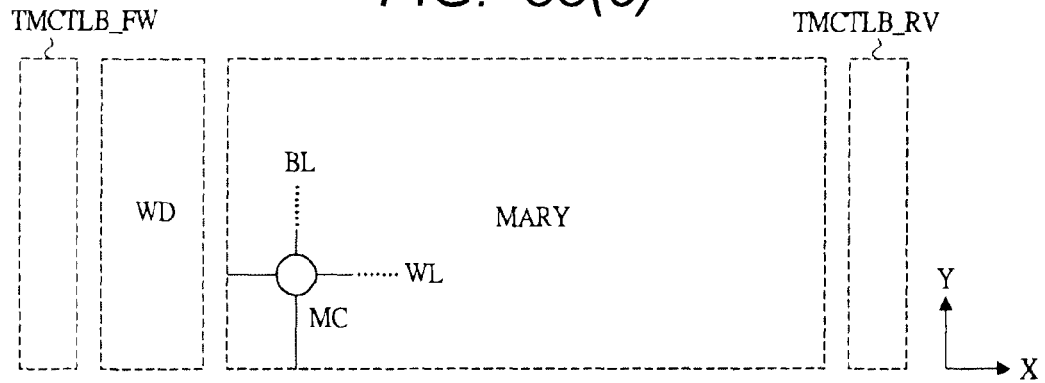

FIGS. 33(a), 33(b), and 33(c) are schematic diagrams illustrating examples of respectively different arrangement of a timing adjusting circuit (in the column direction) of a memory unit in a semiconductor device according to Embodiment 12 of the present invention. In FIG. 33(a), the word line driving circuit WD, the timing adjusting circuit (for the outward path) TMCTLB_FW, the memory array MARY, and the timing adjusting circuit (for the homeward path) TMCTLB_RV are arranged in order in the X direction (the extension direction of the word line WL). In FIG. 33(b), the timing adjusting circuit (for the outward path) TMCTLB_FW, the word line driving circuit WD, the timing adjusting circuit (for the homeward path) TMCTLB_RV, and the memory array MARY are arranged in order in the X direction. In FIG. 33(c), the timing adjusting circuit (for the outward path) TMCTLB_FW, the word line driving circuit WD, the memory array MARY, and the timing adjusting circuit (for the homeward path) TMCTLB_RV are arranged in order in the X direction.

Figure 34A:
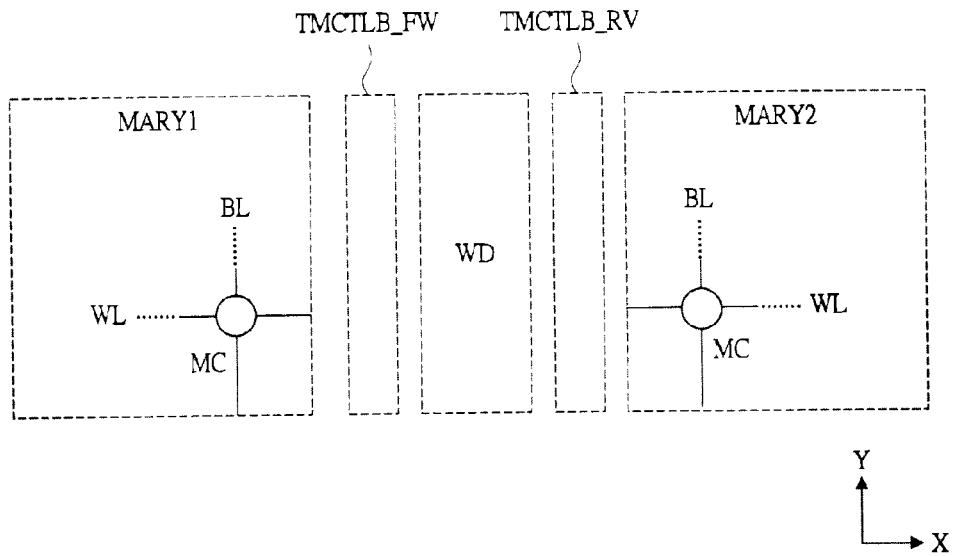
FIGS. 34(a) and 34(b) are schematic diagrams illustrating examples of respectively different arrangement of a timing adjusting circuit (in the column direction) of a memory unit which is different from one illustrated in FIGS. 33(a), 33(b), and 33(c)
Figure 34B:
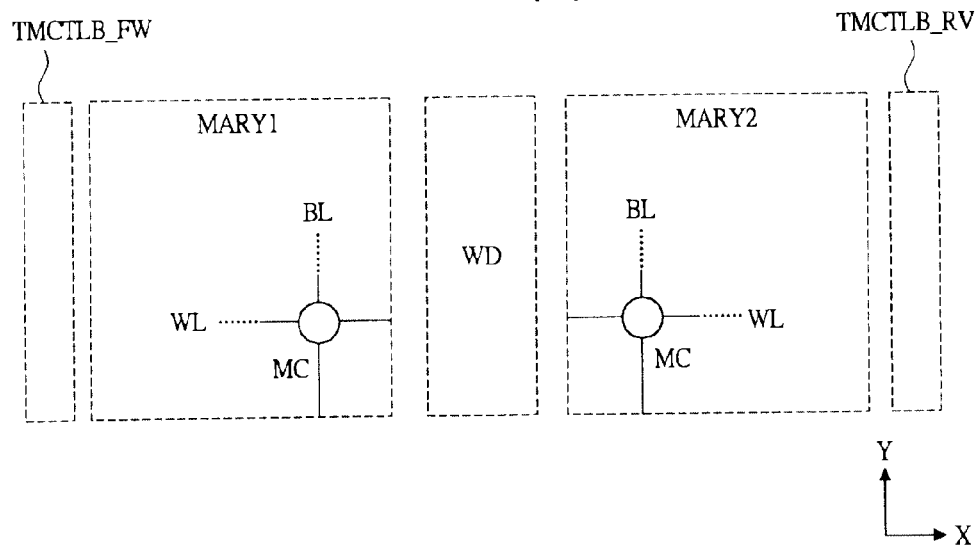

FIGS. 34(a) and 34(b) are schematic diagrams illustrating examples of respectively different arrangement of a timing adjusting circuit (in the column direction) in a memory unit which is different from one illustrated in FIGS. 33(a), 33(b), and 33(c). Unlike in FIGS. 33(a)-33(c), in FIGS. 34(a) and 34(b), plural (here, two pieces of) memory arrays MARY1 and MARY2 are provided. In FIG. 34(a) the first memory array MARY1, the timing adjusting circuit (for the outward path) TMCTLB_FW, the word line driving circuit WD, the timing adjusting circuit (for the homeward path) TMCTLB_RV, and the second memory array MARY2 are arranged in order in the X direction (the extension direction of the word line WL). The word lines WL of the memory array MARY1 and the memory array MARY2 are driven by the word line driving circuit WD arranged in-between. In FIG. 34(b), the timing adjusting circuit (for the outward path) TMCTLB_FW, the first memory array MARY1, the word line driving circuit WD, the second memory array MARY2, and the timing adjusting circuit (for the homeward path) TMCTLB_RV are arranged in order in the X direction.

In this way, FIGS. 33(a)-33(c), and FIGS. 34(a) and 34(b) represent the configuration example in which the timing adjusting circuit is divided into two pieces. Taking FIG. 5 as an example, the timing adjusting circuit (for the outward path) TMCTLB_FW corresponds to the inverter circuits IV1 and IV2 and the dummy bit line DBL1, and the timing adjusting circuit (for the homeward path) TMCTLB_RV corresponds to the inverter circuits IV5 and IV6 and the dummy bit line DBL2. The inverter circuits IV3 and IV4 are arranged suitably in the timing adjusting circuit (for the outward path) TMCTLB_FW and/or the timing adjusting circuit (for the homeward path) TMCTLB_RV. Although not restricted in particular, the inverter circuit IV3 is arranged in the timing adjusting circuit (for the outward path) TMCTLB_FW, and the inverter circuit IV4 is arranged in the timing adjusting circuit (for the homeward path) TMCTLB_RV.

When the present example of the configuration is employed, since the occupied space of the timing adjusting circuit is divided into two pieces, it becomes useful for a case where the word line driving circuit WD and the memory arrays MARY1 and MARY2 are desired to be arranged closely as much as possible in FIG. 34(a), for example. As illustrated in FIG. 34(a), it becomes also possible to obtain the symmetry of the layout easily by dividing the timing adjusting circuit into two pieces. Furthermore, depending on the case, the NMOS transistor as illustrated in FIG. 5 may be employed as the column direction load circuit in the timing adjusting circuit (for the outward path) TMCTLB_FW, and the PMOS transistor as illustrated in FIG. 6 may be employed as the column direction load circuit in the timing adjusting circuit (for the homeward path) TMCTLB_RV. In this case, as explained in FIG. 11, the timing adjusting circuit (for the outward path) TMCTLB_FW and the timing adjusting circuit (for the homeward path) TMCTLB_RV will be suitably arranged, taking into consideration the conductive type of the well of each circuit block.

Embodiment 13

<<Arrangement of a Timing Adjusting Circuit (in the Row Direction)>>

Figure 35A:
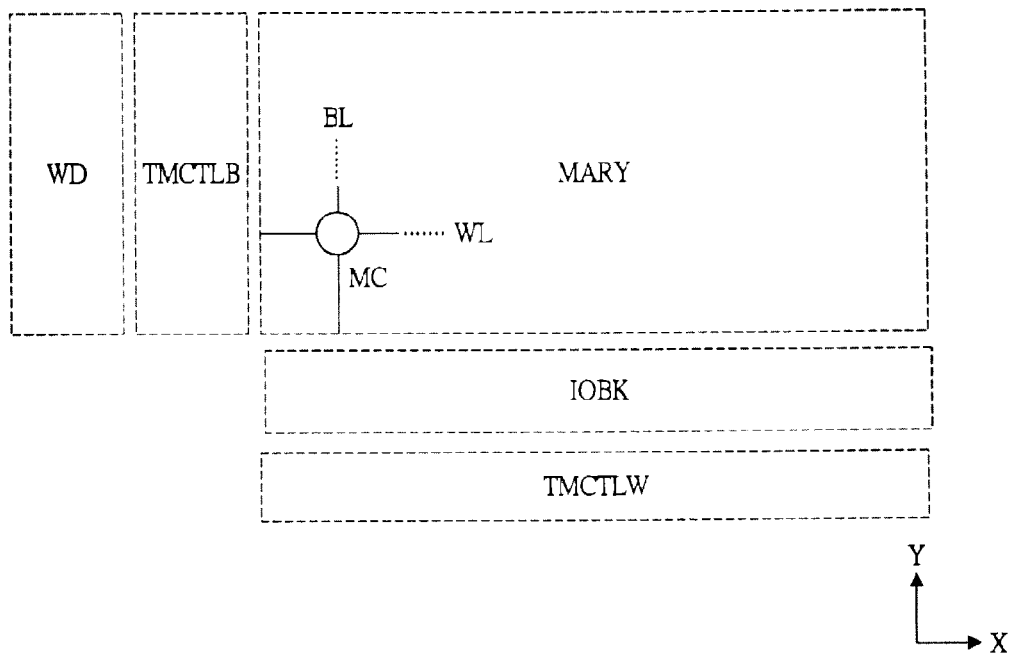
FIGS. 35(a) and 35(b) are schematic diagrams illustrating examples of respectively different arrangement of a timing adjusting circuit (in the row direction) of a memory unit in a semiconductor device according to Embodiment 13 of the present invention.
Figure 35B:
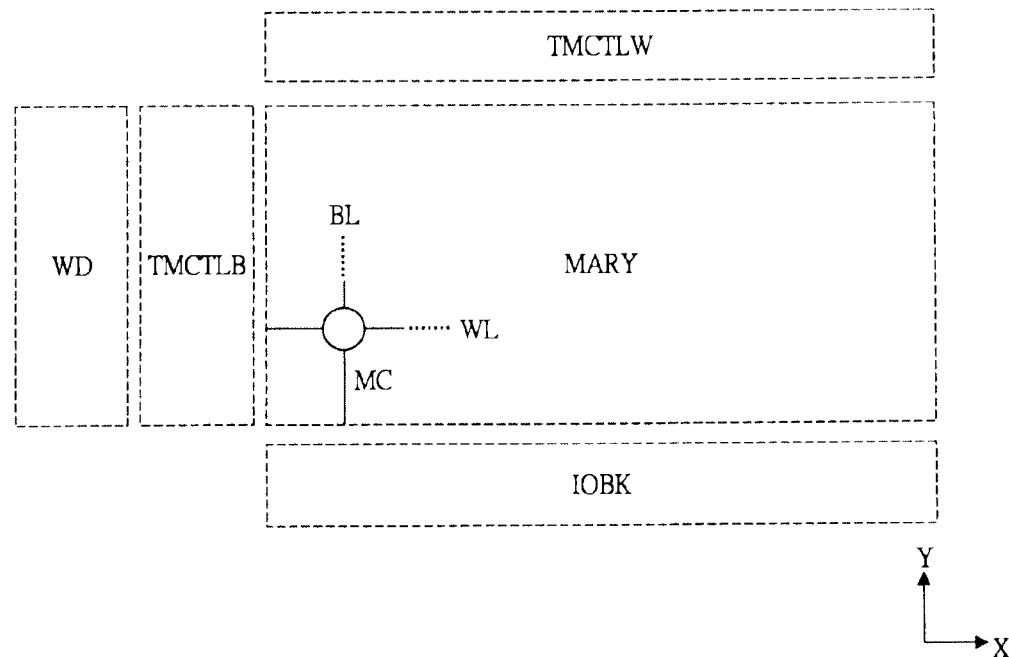

FIGS. 35(a) and 35(b) are schematic diagrams illustrating examples of respectively different arrangement of a timing adjusting circuit (in the row direction) of a memory unit in a semiconductor device according to Embodiment 13 of the present invention. In FIGS. 35(a) and 35(b), the word line driving circuit WD, the timing adjusting circuit (in the column direction) TMCTLB, and the memory array MARY are arranged in order in the X direction (the extension direction of the word line WL). In FIG. 35(a), the input/output circuit block IOBK and the timing adjusting circuit (in the row direction) TMCTLW are arranged in order in the Y direction on one side of the memory array MARY. On the other hand, in FIG. 35(b), the input/output circuit block IOBK and the timing adjusting circuit (in the row direction) TMCTLW are arranged in the Y direction on both sides of the memory array MARY, respectively.

In this way, the timing adjusting circuit (in the row direction) TMCTLW can be arranged on any side of the memory array MARY in the Y direction. However, in the viewpoint of the increase in efficiency of a circuit area, it is desirable to adopt the example of arrangement illustrated in FIG. 35(b) in which the arrangement area is comparatively easily obtained, and in the viewpoint of the simplification of the signal flow, it is desirable to adopt the example of arrangement illustrated in FIG. 35(a). That is, in the case of FIG. 35(a), by arranging the control circuit block in the crossing portion of the timing adjusting circuit (in the column direction) TMCTLB and the input/output circuit block IOBK or the timing adjusting circuit (in the row direction) TMCTLW, for example, as illustrated in FIG. 32, it is possible to perform input/output using a respectively short path between the control circuit block and each of the timing adjusting circuit (in the column direction) TMCTLB, the input/output circuit block IOBK, and the timing adjusting circuit (in the row direction) TMCTLW.

As described above, the invention accomplished by the present inventors has been concretely explained based on the embodiments. However, it cannot be overemphasized that the present invention is not restricted to the embodiments, and it can be changed variously in the range which does not deviate from the gist.

For example, each of the embodiments has been explained exemplifying an SRAM as a memory unit; however, as a matter of course, each of the embodiments can be applied similarly to various volatile memories represented by a DRAM (Dynamic Random Access Memory), and to various nonvolatile memories represented by a flash memory. In the present application, the explanation has been made taking as an example the semiconductor device such as an SOC which mounts the memory unit; however, the present invention can be applied equally to the semiconductor storage device which is composed of the memory unit single body.

The dummy bit line illustrated in FIG. 5 and others is formed by a single both-way wiring; however, the dummy bit line may be formed by plural both-way wirings in order to adjust the amount of delay.

The semiconductor device according to the present embodiment is effectively applied especially to an LSI, such as an SOC provided with the memory units, such as an SRAM. However, the semiconductor device according to the present embodiment is applicable to an LSI at large, provided with various volatile memories and/or various nonvolatile memories.

What is claimed is:
1. A semiconductor device comprising:
a plurality of word lines extending in a first direction;
a plurality of bit line pairs extending in a second direction intersecting the first direction;
a plurality of memory cells arranged at crossing portions of the word lines and the bit line pair, and configured with a circuit including a first MIS transistor;
a dummy bit line pair arranged side by side with the plurality of bit line pairs;
a load circuit including a plurality of second MIS transistors coupled to each of the dummy bit line pair;

a sense amplifier circuit operable to amplify a signal read from one of the memory cells through one of the bit line pair, in response to an enable signal; and a control circuit operable to generate the enable signal by delaying corresponding to a load capacitance of the load circuit and parasitic capacitance of the dummy bit line pair in response to an access instruction to the memory cells.

2. The semiconductor device according to claim 1, wherein a gate length of the second MIS transistor is longer than a gate length of the first MIS transistor.

3. The semiconductor device according to claim 1 further comprising:

a word line driving circuit including a third MIS transistor and operable to drive the word line, wherein a gate length of the second MIS transistor is longer than a gate length of the third MIS transistor.

4. The semiconductor device according to claim 1, wherein both of the source and the drain of a part of the second MIS transistors are coupled to the first dummy bit line, and both of the source and the drain of the other part of the second MIS transistors are coupled to the second dummy bit line.

5. The semiconductor device according to claim 1, wherein one of the source and the drain of a part of the second MIS transistors is coupled to the first dummy bit line, and one of the source and the drain of the other part of the second MIS transistors is coupled to the second dummy bit line.

6. The semiconductor device according to claim 4, wherein a voltage supplied to a gate of the second MIS transistor is a voltage to turn off the second MIS transistors.

7. The semiconductor device according to claim 4, wherein a voltage supplied to a gate of the second MIS transistor is a voltage to turn on the second MIS transistors.

8. The semiconductor device according to claim 1, wherein the first dummy bit line is coupled to an output of a single stage or plural stages of first inverter circuit operable with the first signal inputted, wherein the second dummy bit line is supplied at its input terminal with a signal transmitted from an output terminal of the first dummy bit line, and wherein the semiconductor device further comprises a single stage or plural stages of second inverter circuit operable with a signal from the output terminal of the second dummy bit line inputted and outputting the second signal.

9. The semiconductor device according to claim 8 further comprising:

a single stage or plural stages of third inverter circuit operable to input a signal from the output terminal of the first dummy bit line and operable to output a signal to the input terminal of the second dummy bit line.

10. The semiconductor device according to claim 8, wherein gate lengths of MIS transistors configuring the first inverter circuit and the second inverter circuit are longer than a gate length of the first MIS transistor.

11. The semiconductor device according to claim 9, wherein gate lengths of MIS transistors configuring the first inverter circuit through the third inverter circuit is longer than a gate length of the first MIS transistor.

12. The semiconductor device according to claim 1 further comprising:

a write timing adjusting circuit including a delay circuit, wherein, in the case of write operation to one of the memory cells, the write timing adjusting circuit sets timing for deactivating an activated word line, by imparting a delay produced by the delay circuit to the second signal.

13. The semiconductor device according to claim 1, wherein the load capacitance is diffusion layer capacitances of the plurality of the second MIS transistor.

14. The semiconductor device according to claim 1, wherein the plurality of the second MIS transistor are NMOS transistors.

* * * * *